(12) United States Patent
Yuh et al.

(10) Patent No.: US 12,513,912 B2
(45) Date of Patent: Dec. 30, 2025

(54) METHOD FOR FABRICATING AN INTEGRATED CIRCUIT COMPRISING DEVICES ON OPPOSING SIDES OF A SUBSTRATE

(71) Applicant: TAIWAN SEMICONDUCTOR MANUFACTURING COMPANY, LTD., Hsinchu (TW)

(72) Inventors: Perng-Fei Yuh, Walnut Creek, CA (US); Chansyun David Yang, Hsinchu (TW); Keh-Jeng Chang, Hsinchu (TW); Chan-Lon Yang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 918 days.

(21) Appl. No.: 17/461,344

(22) Filed: Aug. 30, 2021

(65) Prior Publication Data

US 2023/0067715 A1    Mar. 2, 2023

(51) Int. Cl.

| | |
|---|---|
| *H10B 61/00* | (2023.01) |
| *H01L 21/02* | (2006.01) |
| *H01L 21/768* | (2006.01) |
| *H10D 30/01* | (2025.01) |
| *H10D 30/67* | (2025.01) |
| *H10D 62/10* | (2025.01) |
| *H10D 64/01* | (2025.01) |

(Continued)

(52) U.S. Cl.
CPC ......... *H10B 61/22* (2023.02); *H01L 21/0259* (2013.01); *H01L 21/76898* (2013.01); *H10D 30/031* (2025.01); *H10D 30/6729* (2025.01); *H10D 30/6735* (2025.01); *H10D 30/6757* (2025.01); *H10D 62/118* (2025.01); *H10D 64/01* (2025.01); *H10D 64/254* (2025.01); *H10D 64/256* (2025.01); *H10D 88/101* (2025.01); *H10N 50/01* (2023.02); *H10N 50/80* (2023.02)

(58) Field of Classification Search
CPC ........ H10B 61/10–22; H10B 50/01–10; H10B 50/80; H10B 52/01; H10B 52/80; H01L 29/0665; H01L 29/42392; H01L 29/78696; H01L 29/40–401; H01L 29/41733; H01L 29/4175; H01L 29/41766; H01L 21/768; H01L 21/76898; H01L 21/76897; H01L 27/0694; H10D 30/6735; H10D 30/6757; H10D 62/118–121; H10D 64/251–2565; H10D 88/01; H10D 64/254; H10D 88/101
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Christine S. Kim
*Assistant Examiner* — Tyler J Wiegand
(74) *Attorney, Agent, or Firm* — Maschoff Brennan

(57) ABSTRACT

A method for fabricating an integrated circuit device is provided. The method includes forming a transistor device over a front side of the semiconductor substrate; forming a first contact feature in the semiconductor substrate, wherein the first contact feature is connected with a back side of a first source/drain feature of the transistor device; and forming a memory structure over a back side of the first contact feature facing away from the first source/drain feature.

20 Claims, 53 Drawing Sheets

(51) Int. Cl.
*H10D 64/23* (2025.01)
*H10D 88/00* (2025.01)
*H10N 50/01* (2023.01)
*H10N 50/80* (2023.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2010/0181547 A1* | 7/2010 | Kuroda .................. H10B 63/30 257/295 |
| 2013/0292847 A1* | 11/2013 | Choi .................... H01L 23/528 257/774 |
| 2015/0061020 A1* | 3/2015 | Yokoyama .............. H01L 21/84 438/666 |
| 2017/0025601 A1* | 1/2017 | Bhushan ........... H01L 23/49816 |
| 2022/0199468 A1* | 6/2022 | Jun ....................... H01L 29/401 |

* cited by examiner

METHOD FOR FABRICATING AN INTEGRATED CIRCUIT COMPRISING DEVICES ON OPPOSING SIDES OF A SUBSTRATE

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
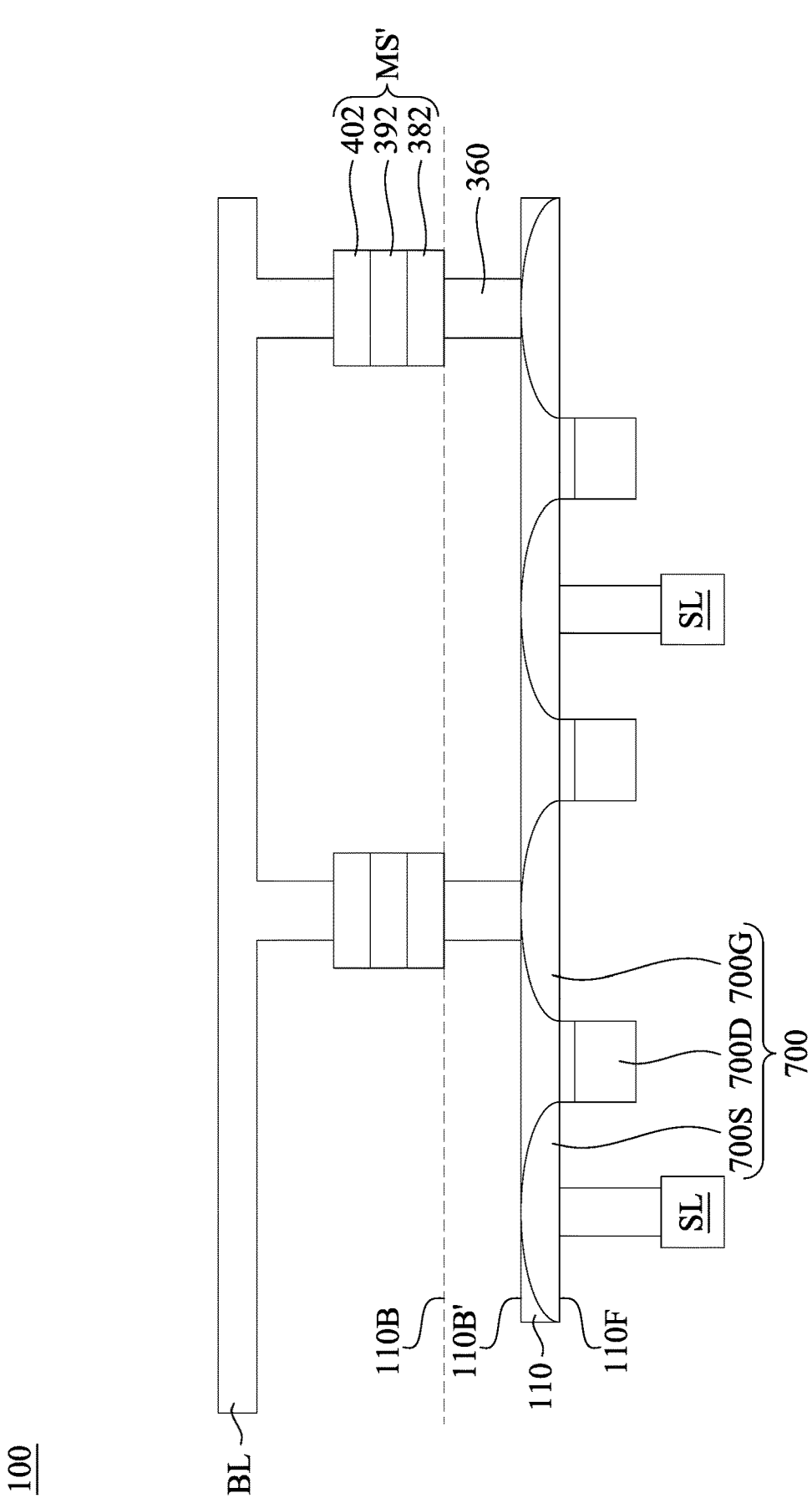
FIG. 1 is a schematic cross-sectional view of an integrated circuit device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Semiconductor fabrication of ICs includes, for example, front-end-of-line (FEOL), middle-end-of-line (MEOL) process, and back-end-of-line (BEOL) processes. FEOL encompasses processes related to fabricating IC devices, such as transistors. For example, FEOL process can include forming isolation features, gate structures, and source/drain features. MEOL process can include processes related to fabricating contacts to conductive features (or conductive regions) of the IC devices, such as contacts to the gate structures and/or the source/drain features. BEOL process includes processes related to fabricating a multilayer interconnect (MLI) feature that interconnects IC features fabricated by FEOL and MEOL process.

In integrated circuit (IC) devices, resistance-based random access memory, such as resistive random access memory (RRAM, ReRAM), magnetoresistive random access memory (MRAM), phase-changed random access memory (PCRAM), and dynamic random access memory (DRAM), are being developed for next generation memory devices. Compared with charge-based random access memory, such as flash memory, a resistance-based random access memory circuit includes an array of memory cells each of which is capable of having at least a high resistance state and a low resistance state. Setting a resistance state of a memory cell of a resistance-based random access memory circuit (i.e., performing a write operation to the memory cell) is usually accomplished by applying a predetermined voltage difference or a predetermined current to the memory cell. When reading a datum from a memory cell, a predetermined reading current (or voltage) is applied to the memory cell, and the output datum is determined according to the resulting voltage (or current) of the memory cell.

An integrated circuit device having the memory cells and the method of fabricating the same are provided in accordance with various exemplary embodiments. The intermediate stages of forming the integrated circuit device are illustrated. The variations of the embodiments are discussed. The memory cell is exemplarily illustrated as a MRAM cell in some embodiments of the present disclosure. In some other embodiments of the present disclosure, the illustrated memory cell can be other resistance-based random access memory cell, such as RRAM cell, PCRAM cell, DRAM cell or the like, not limited to the MRAM cell. Throughout the various views and illustrative embodiments, like reference numbers are used to designate like elements.

FIG. 1 is a schematic cross-sectional view of an integrated circuit device 100 in accordance with some embodiments of the present disclosure. The integrated circuit device 100 includes a substrate 110, selector transistor devices 700, an array of memory structures MS', and backside contact features 360. The substrate 110 may have a front side 110F and a back side 110B'. In some embodiments of the present disclosure, the substrate 110 may be thinned, removed, partially removed, or etched during the formation of the backside contact features 360, the dashed line 110B may indicate a position of a back side of the substrate 110 prior to the thinning or the removal of the substrate 110. The dashed line 110B may be referred to as a wafer backside in the context. In some embodiments, the dashed line 110B may be substantially aligned with a top surface of the backside contact features 360 in some embodiments. The back side 110B' may indicate a position of a back side of the substrate 110 after the thinning or the removal of the substrate 110. In some embodiments, the back side 110B' may indicate a position of back sides of the source and drain features 700S and 700D of the selector transistor devices 700.

In the present embodiments, the selector transistor devices 700 are located on the front side 110F of the substrate 110, and the memory structures MS' are located on the back side of the substrate 110 (e.g., the back side 110B' or the back side indicated by the dashed line 110B). Each of the memory structures MS' may include a bottom electrode 382, a top electrode 402, and a resistance switching element 392 between the bottom electrode 382 and the top electrode 402.

In some embodiments, source lines SL may be disposed on the front side 110F of the substrate 110 and respectively electrically connected to source features 700S of the selector transistor devices 700. In some embodiments, the bottom electrodes 382 of memory structures MS' the respectively electrically connected to drain features 700D of the selector transistor devices 700. For example, the backside contact features 360 may be respectively disposed between the bottom electrodes 382 of the memory structures MS' and the drain features 700D. In some embodiments, top electrodes 402 of the memory structures MS' may be electrically connected to one or more bit lines BL disposed on the back side of the substrate 110 (e.g., the back side 110B' or the back side indicated by the dashed line 110B). In some embodiments, word lines (not shown) may be electrically connected to gate features 700G of the selector transistor devices 700.

In some embodiments, the integrated circuit device 100 may further include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 2-23 illustrate various stages of manufacturing an integrated circuit device 100 according to some embodiments of the present disclosure. The illustration is merely exemplary and is not intended to limit beyond what is specifically recited in the claims that follow. It is understood that additional operations may be provided before, during, and after the operations shown by FIGS. 2-23, and some of the operations described below can be replaced or eliminated for additional embodiments of the method. The order of the operations/processes may be interchangeable.

Figure 2:
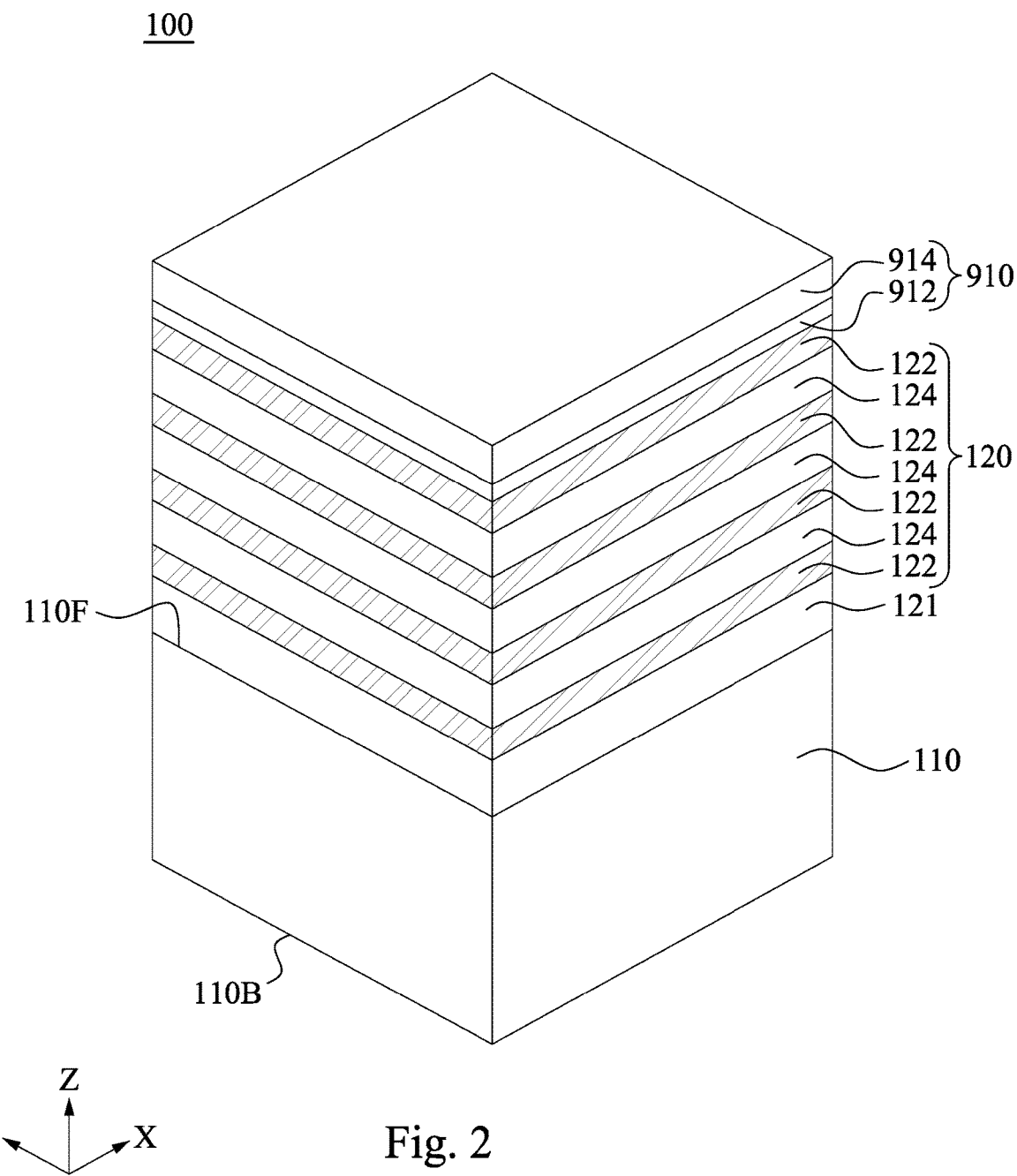
FIGS. 2-23 illustrate various stages of manufacturing an integrated circuit device according to some embodiments of the present disclosure.

Referring to FIG. 2, an epitaxial stack 120 is formed over the substrate 110. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials. The substrate 110 may have a front side 110F and a back side 110B opposite to the front side 110F.

In some embodiments, an epitaxial etch stop layer 121 is formed over the front side 110F of the substrate 110 through epitaxy. The epitaxial etch stop layer 121 may include suitable crystalline material different from that of the substrate 110. For example, the epitaxial etch stop layer 121 may include semiconductor material (e.g., SiGe), semiconductor-containing compound material, metal-containing compound material, dielectric material, or the like. The epitaxial etch stop layer 121 may serve as an etch stop layer when the substrate 110 is etched and removed in a later process.

An epitaxial stack 120 is formed on the epitaxial etch stop layer 121 through epitaxy, such that the epitaxial stack 120 forms crystalline layers. For example, the epitaxial stack 120 includes epitaxial layers 122 of a first composition interposed by epitaxial layers 124 of a second composition. The first and second compositions can be different. In some embodiments, the epitaxial layers 122 are silicon (Si) and the epitaxial layers 124 are SiGe. However, other embodiments are possible including those that provide for a first composition and a second composition having different oxidation rates and/or etch selectivity. In some embodiments where the epitaxial layers 122 include Si and the epitaxial layers 124 include SiGe, the Si oxidation rate of the epitaxial layers 122 is less than the SiGe oxidation rate of the epitaxial layers 124.

In some embodiments, the epitaxial etch stop layer 121 may include a third composition different from that of the first composition of the epitaxial layers 122 and the second composition of the epitaxial layers 124. Embodiments are possible including those that provide for a first composition, a second composition, and a third composition having different oxidation rates and/or etch selectivity. In some embodiments where the epitaxial layers 122 include Si and the epitaxial layers 124 and the epitaxial etch stop layer 121 include SiGe, the Si oxidation rate of the epitaxial layers 122 is less than the SiGe oxidation rate of the epitaxial layers 124, and the SiGe oxidation rate of the epitaxial etch stop layer 121 is less than the SiGe oxidation rate of the epitaxial layers 124.

The epitaxial layers 122 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 122 to define a channel or channels of a device is further discussed below.

It is noted that four layers of the epitaxial layers 122 and three layers of the epitaxial layers 124 are alternately arranged as illustrated in FIG. 2, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 122 is between 2 and 10.

The epitaxial layers 124 in channel regions(s) may eventually be removed and serve to define a vertical distance between adjacent channel region(s) for a subsequently-formed multi-gate device. Accordingly, the epitaxial layers 124 may also be referred to as sacrificial layers, and epitaxial layers 122 may also be referred to as channel layers.

By way of example, epitaxial growth of the layers of the epitaxial etch stop layer 121 and the stack 120 may be performed by a molecular beam epitaxy (MBE) process, a metalorganic chemical vapor deposition (MOCVD) process, and/or other suitable epitaxial growth processes. In some embodiments, the epitaxially grown epitaxial etch stop layer 121 include different material than that of the substrate 110. In some embodiments, the epitaxially grown layers 122 and 124 include a different material than that of the epitaxal etch stop layer 121. As stated above, in at least some examples, the epitaxially grown epitaxial etch stop layer 121 include an epitaxially grown silicon germanium (SiGe) layer, the epitaxial layers 122 include an epitaxially grown silicon (Si) layer. and the epitaxial layers 124 include an epitaxially grown silicon germanium (SiGe) layer. The composition of the SiGe layer of the epitaxial etch stop layer 121 may be different from that of the SiGe layer of the epitaxial layers 124. Alternatively, in some embodiments, either of the epitaxial etch stop layer 121 and the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials and compositions of the epitaxial etch stop layer 121 and the epitaxial layers 122 and 124 may be chosen based on providing differing oxidation and/or etching selectivity properties. In some embodiments, the epitaxial etch stop layer 121 and the epitaxial layers 122 and 124 are substantially dopant-free (i.e., having an extrinsic dopant concentration from about 0 cm$^{-3}$ to about $1\times10^{18}$ cm$^{-3}$), where for example, no intentional doping is performed during the epitaxial growth process.

Figure 3:
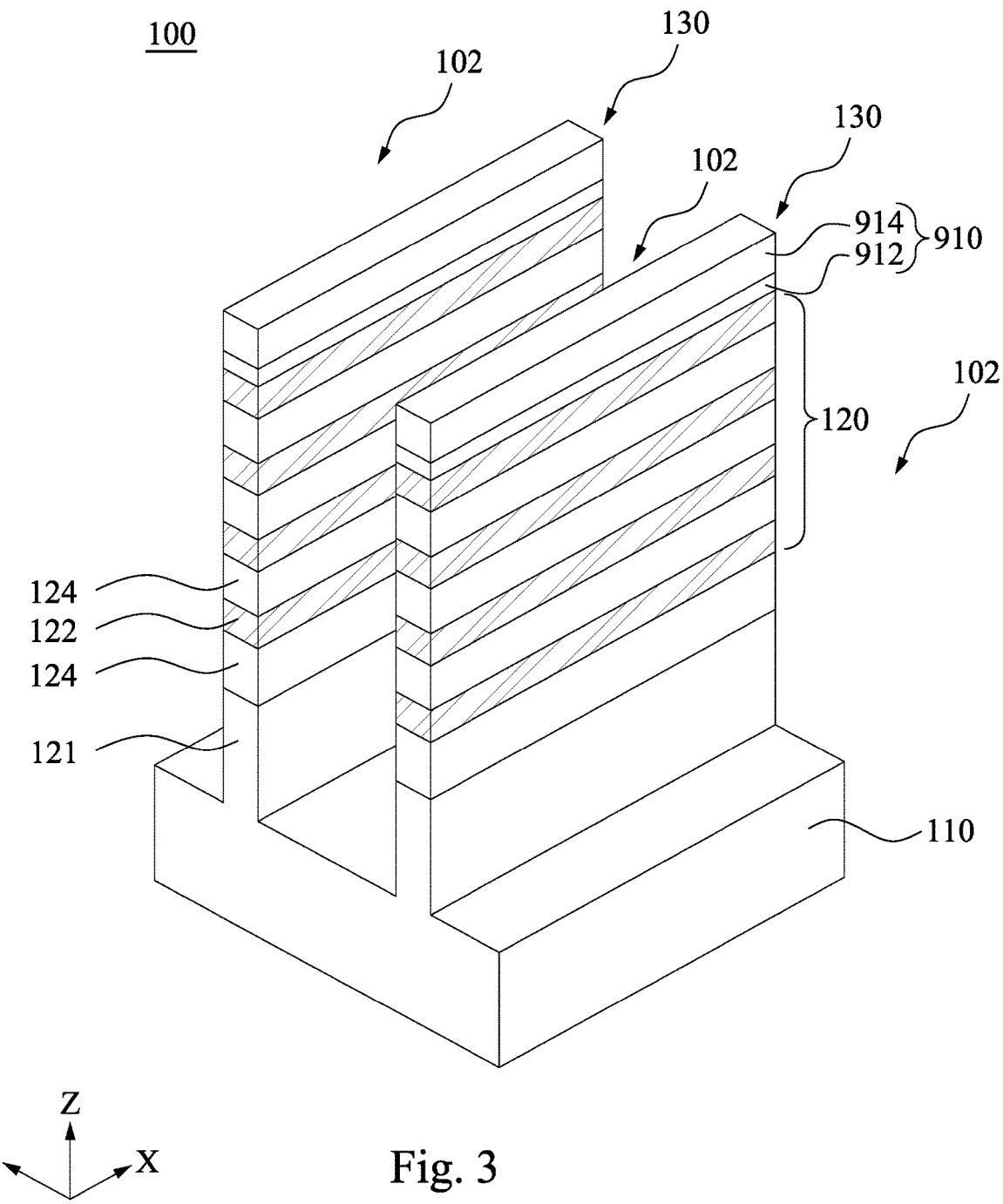

Referring to FIG. 3, a plurality of semiconductor fins 130 extending from the substrate 110 are formed. In various embodiments, each of the fins 130 includes a semiconductor portion 112 formed from the substrate 110, a portion formed from the epitaxial etch stop layer 121, and portions of each of the epitaxial layers of the epitaxial stack 120 including epitaxial layers 122 and 124. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120. The etching process can include dry etching, wet etching, reactive ion etching (RIE), and/or other suitable processes.

In the illustrated embodiment as illustrated in FIGS. 2 and 3, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130.

Figure 4:
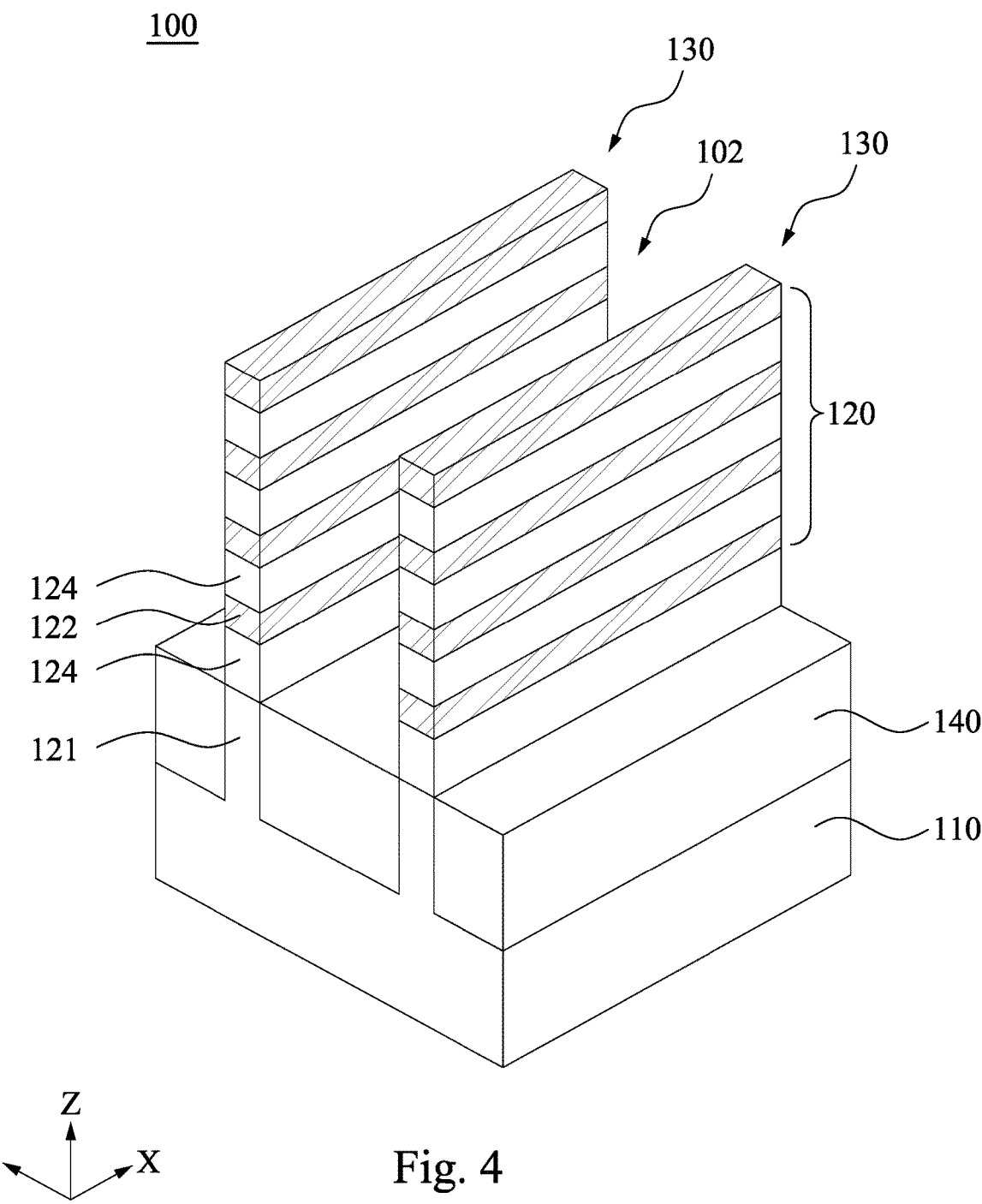

Referring to FIG. 4, shallow trench isolation (STI) features 140 are formed interposing the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, the dielectric layer (and subsequently formed STI features 140) may include a multi-layer structure, for example, having one or more liner layers.

In some embodiments of forming the isolation (STI) features 140, after deposition of the dielectric layer, the deposited dielectric material is thinned and planarized, for example by a chemical mechanical polishing (CMP) process. In some embodiments, the HM layer 910 (as illustrated FIG. 3) functions as a CMP stop layer. The STI features 140 interposing the fins 130 are recessed. Referring to the example of FIG. 4, the STI features 140 are recessed providing the fins 130 extending above the STI features 140. In some embodiments, the recessing process may include a dry etching process, a wet etching process, and/or a combination thereof. The HM layer 910 may also be removed before, during, and/or after the recessing of the STI features 140. The nitride layer 914 of the HM layer 910 may be removed, for example, by a wet etching process using $H_3PO_4$ or other suitable etchants. In some embodiments, the oxide layer 912 of the HM layer 910 is removed by the same etchant used to recess the STI features 140. In some embodiments, a recessing depth is controlled (e.g., by controlling an etching time) so as to result in a desired height of the exposed upper portion of the fins 130. In the illustrated embodiment, the desired height exposes each of the layers of the epitaxial stack 120 in the fins 130.

Figure 5A:
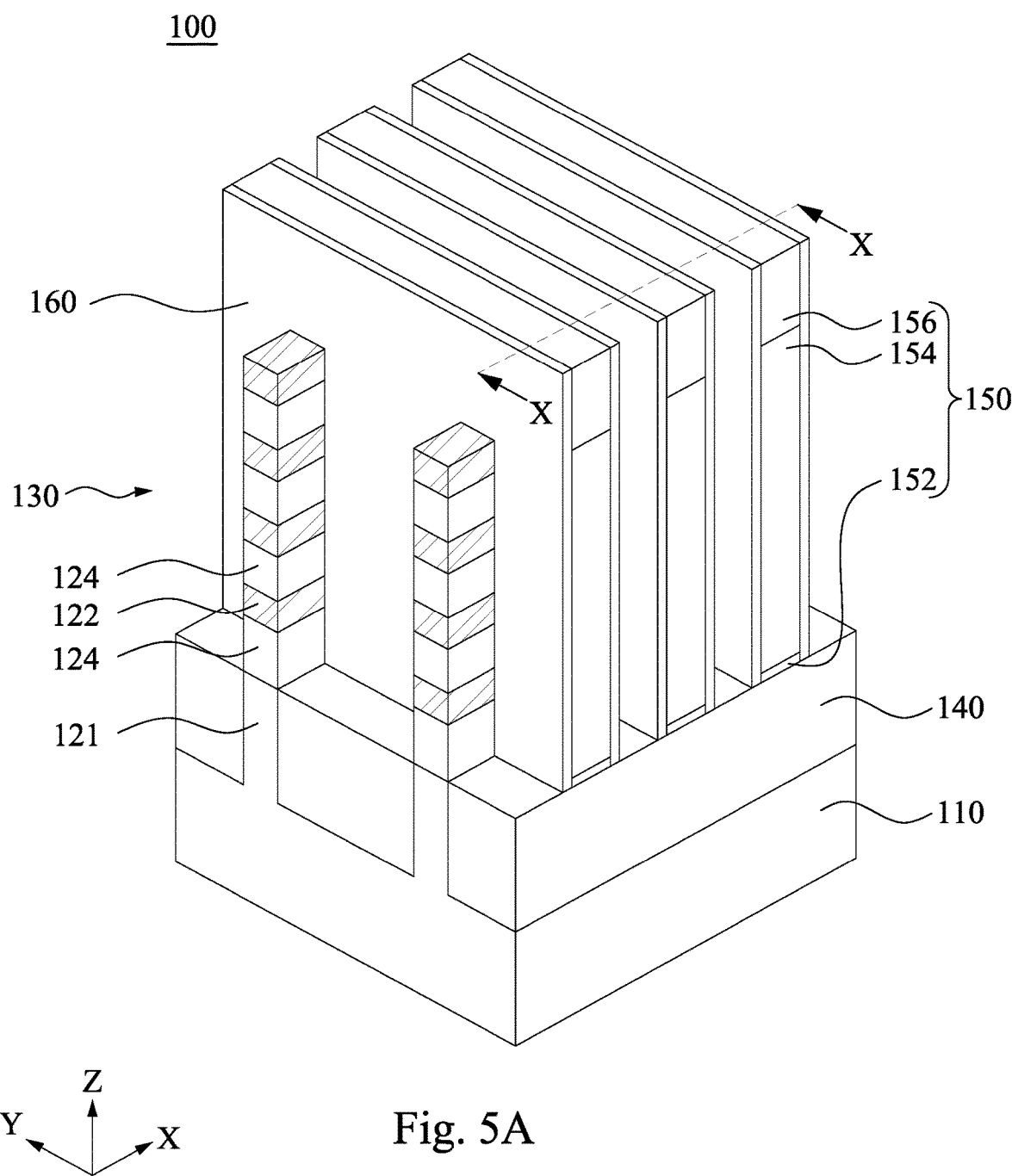
Figure 5B:
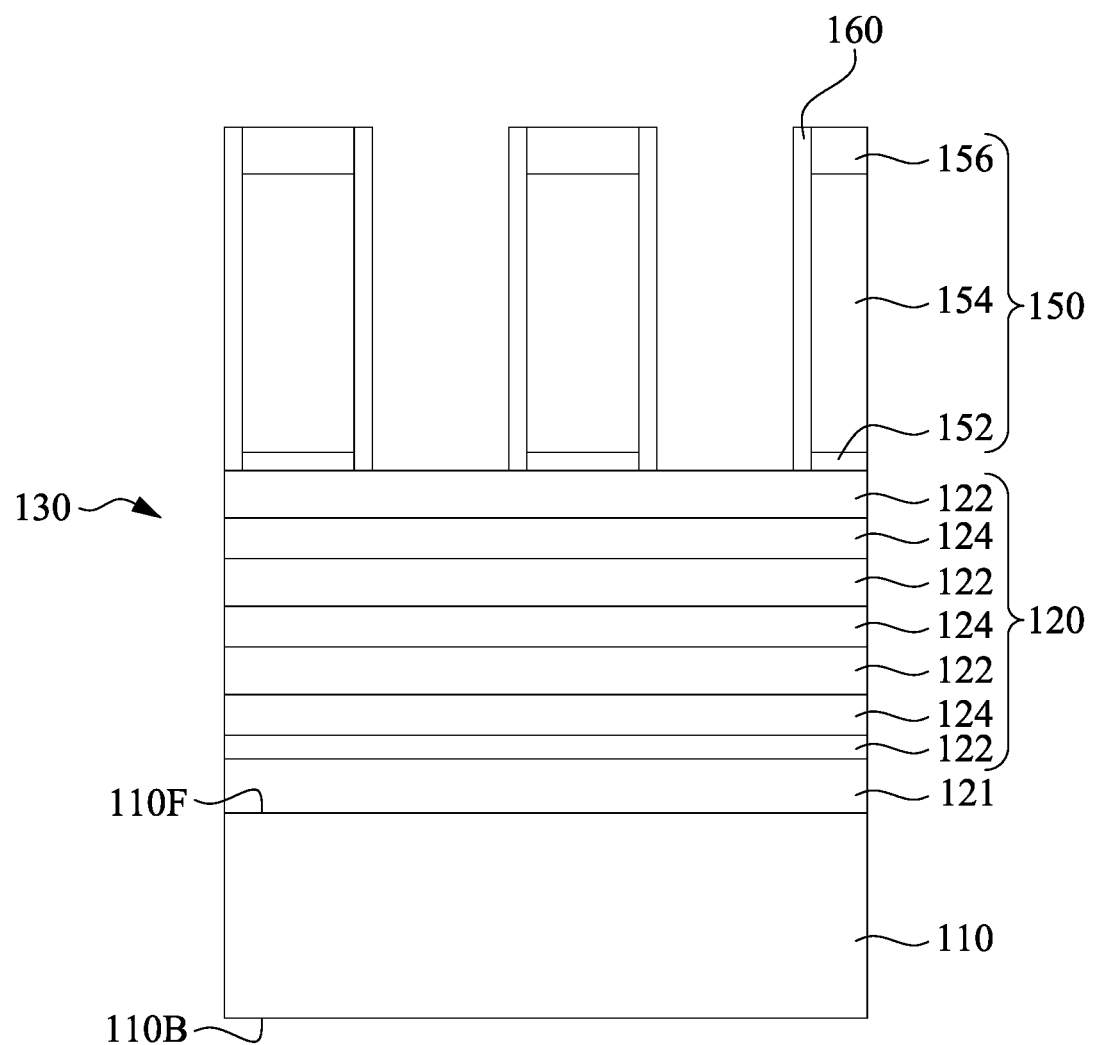

Referring to FIGS. 5A and 5B. FIG. 5B is a cross-sectional view taken along line X-X of FIG. 5A. Gate structures 150 are formed crossing the fins 130 over the front side 110F. In some embodiments, the gate structures 150 are dummy (sacrificial) gate structures that are subsequently removed. Thus, in some embodiments using a gate-last process, the gate structures 150 are dummy gate structures and will be replaced by the final gate structures at a subsequent processing stage of the integrated circuit device 100 (referring to FIG. 23). In particular, the dummy gate structures 150 may be replaced at a later processing stage by a high-k dielectric layer (HK) and metal gate electrode (MG) as discussed below. In some embodiments, the dummy gate structures 150 are formed over the substrate 110 and are at least partially disposed over the fins 130. The portion of the fins 130 underlying the dummy gate structures 150 may be referred to as the channel region. The dummy gate structures 150 may also define a source/drain (S/D) region of the fins 130, for example, the regions of the fins 130 adjacent and on opposing sides of the channel region.

In the illustrated embodiment, the formation of the gate structures 150 first forms a dummy gate dielectric layer 152 over the fins 130. In some embodiments, the dummy gate dielectric layer 152 may include $SiO_2$, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, the formation of the gate structures 150 forms a dummy gate electrode layer 154 and a hard mask 156 which may include multiple layers (e.g., an oxide layer and a nitride layer). In some embodiments, the dummy gate structures 150 are formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask 156 includes an oxide layer such as a pad oxide layer that may include $SiO_2$, and a nitride layer such as a pad nitride layer that may include $Si_3N_4$ and/or silicon oxynitride. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, and the hard mask 156.

After the formation of the dummy gate structures 150, gate spacers 160 are formed on sidewalls of the dummy gate structures 150. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 160. For example, an anisotropic etching process is performed on the deposited spacer material layer to expose portions of the fins 130 not covered by the dummy gate structures 150 (e.g., in source/drain features of the fins 130). Portions of the spacer material layer directly above the dummy gate structures 150 may be completely removed by this anisotropic etching process. In some embodiments, the spacer material layer 160 includes multiple layers, and therefore the gate spacers 160 may be multi-layer structures.

Figure 6:
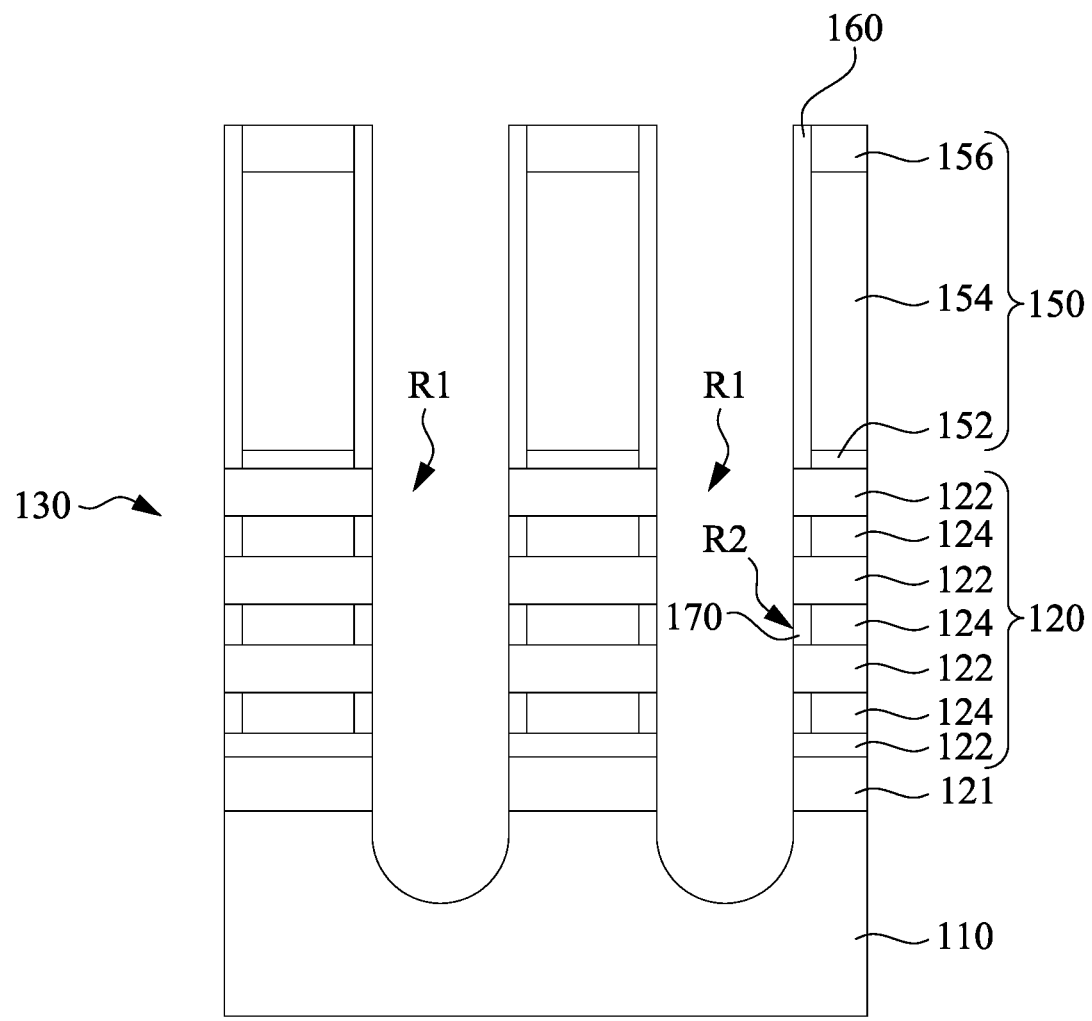

FIGS. 6-23 are cross-sectional views of the integrated circuit device 100 at intermediate stages of the fabricating method taken along the same cut as in FIG. 5B. Referring to FIG. 6, exposed portions of the semiconductor fins 130 that extend laterally beyond the gate spacers 160 (e.g., in source/drain features of the fins 130) are etched by using, for example, an anisotropic etching process that uses the dummy gate structures 150 and the gate spacers 160 as an etch mask, resulting in recesses R1 into the semiconductor fins 130 and adjacent to and between corresponding dummy gate structures 150. After the anisotropic etching, end surfaces of the channel layers 122 and sacrificial layers 124 are aligned with respective outermost sidewalls of the gate spacers 160, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, the sacrificial layers 124 are laterally or horizontally recessed by using suitable selective etching process, resulting in lateral recesses R2 each vertically between corresponding channel layers 122. By way of example and not limitation, the sacrificial layers 124 are SiGe and the channel layers 122 are silicon allowing for the selective etching of the sacrificial layers 124. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 122 is not significantly etched by the process of laterally recessing the sacrificial layers 124. As a result, the channel layers 122 laterally extend past opposite end surfaces of the sacrificial layers 124.

In some embodiments, due to the different compositions of the sacrificial layers 124 and the epitaxial etch stop layer 121, during the laterally recessing process the selective wet etching etches the sacrificial layers 124 at a faster etch rate than it etches the epitaxial etch stop layer 121. The epitaxial etch stop layer 121 may not be significantly etched by the process of laterally recessing the sacrificial layers 124. As a result, the epitaxial etch stop layer 121 laterally extend past opposite end surfaces of the sacrificial layers 124.

Inner spacers 170 are subsequently formed on opposite end surfaces of the laterally recessed sacrificial layers 124. In some embodiments, an inner spacer material layer is formed to fill the recesses R2. The inner spacer material layer may be a low-K dielectric material, such as $SiO_2$, SiN, SiCN, or SiOCN, and may be formed by a suitable deposition method, such as ALD. After the deposition of the inner spacer material layer, an anisotropic etching process may be performed to trim the deposited inner spacer material, such that only portions of the deposited inner spacer material that fill the recesses R2 left by the lateral etching of the sacrificial layers 124 are left. After the trimming process, the remaining portions of the deposited inner spacer material are denoted as inner spacers 170, for the sake of simplicity. The inner spacers 170 serve to isolate metal gates from source/drain features formed in subsequent processing. In the example of FIG. 6, sidewalls of the inner spacers 170 are aligned with sidewalls of the channel layers 122.

Figure 7:
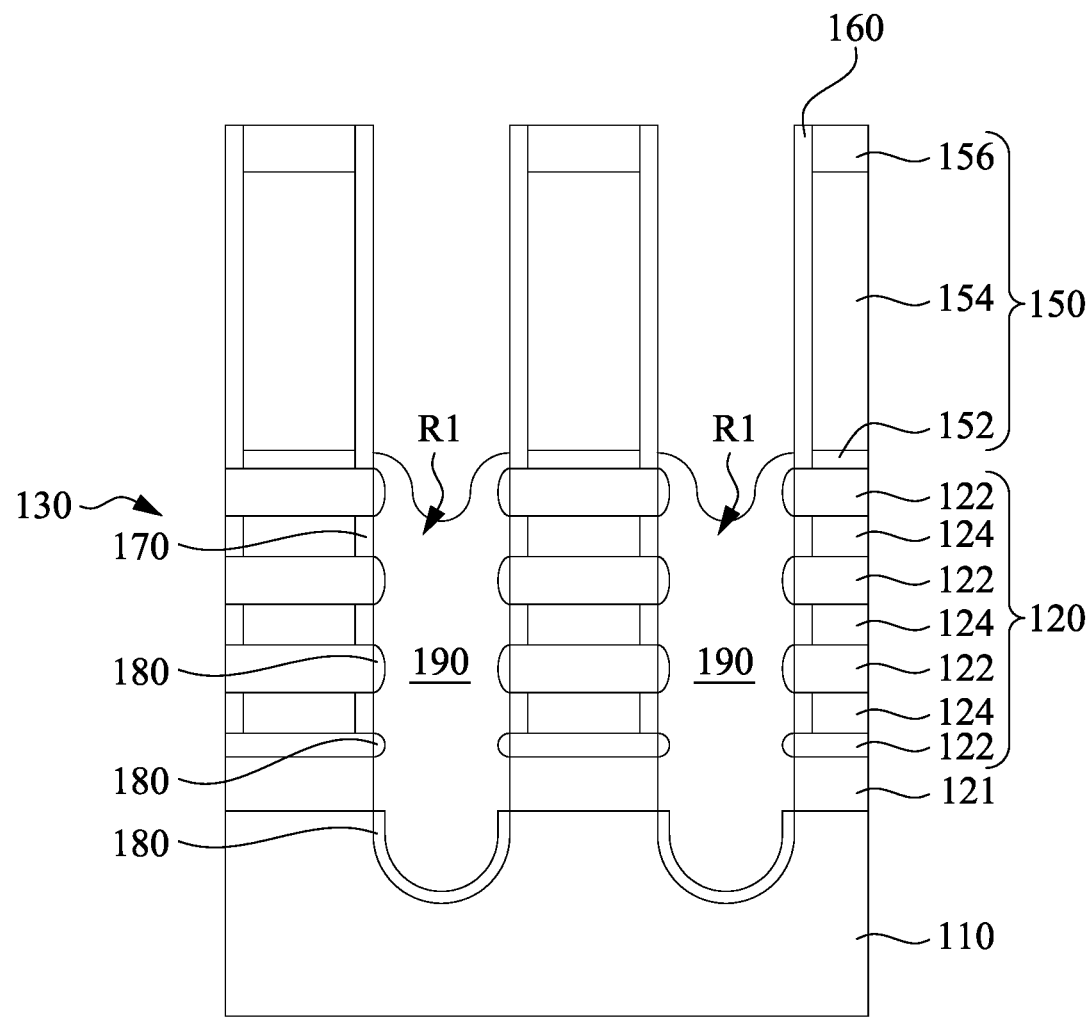

Referring to FIG. 7, doped epitaxial features 190 are formed in the respective recesses R1. In some embodiments, the doped epitaxial features 190 may include Ge, Si, GaAs, AlGaAs, SiGe, GaAsP, SiP, or other suitable material. The doped epitaxial features 190 may be in-situ doped during the epitaxial process by introducing doping species including: p-type dopants, such as boron or $BF_2$; n-type dopants, such as phosphorus or arsenic; and/or other suitable dopants including combinations thereof. If the doped epitaxial features 190 are not in-situ doped, an implantation process (i.e., a junction implant process) is performed to dope the doped epitaxial features 190. In some embodiments, the doped epitaxial features 190 may have a dopant concentration higher than about $1 \times 10^{18}$ cm$^{-3}$).

The doped epitaxial features 190 may be formed by performing an epitaxial growth process that provides an epitaxial material on the fins 130. Suitable epitaxial growth processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the channel layers 122 and the substrate 110.

In some embodiments, prior to the formation of the doped epitaxial features 190, an epitaxial layer 180 is formed on the exposed surfaces of the channel layers 122 and the substrate 110. The epitaxial layer 180 may be formed by the above epitaxial growth process. In some embodiments, the epitaxial layer 180 may be formed by the epitaxial growth process the same as that of the doped epitaxial features 190. In some embodiments, the epitaxial layer 180 may be lightly doped or undoped. For example, the epitaxial layer 180 may have a dopant concentration ranging from about 0 cm$^{-3}$ to about 1×10$^{18}$ cm$^{-3}$, where for example, no intentional doping is performed during the epitaxial growth process.

Figure 8:
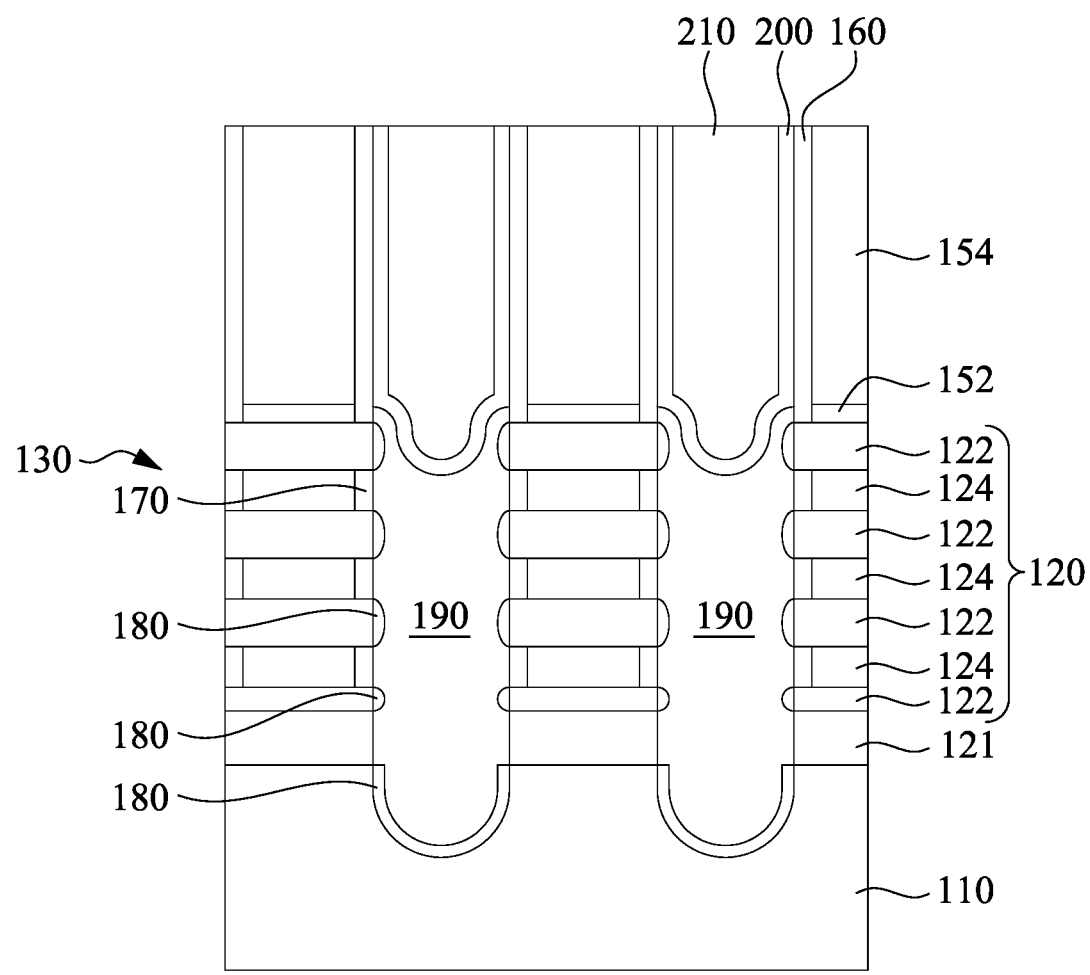

Referring to FIG. 8, a front-side ILD layer 210 is formed on the substrate 110. The ILD layer 210 is referred to a "front-side" ILD layer in this context because it is formed on a front-side of the multi-gate transistors (i.e., a side of the multi-gate transistors that gates protrude from the substrate 110). In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG). The front-side ILD layer 210 may be deposited by a PECVD process or other suitable deposition technique. In some embodiments, a contact etch stop layer (CESL) 200 is also formed prior to forming the ILD layer 210. In some examples, the CESL 200 includes a silicon nitride layer, silicon oxide layer, a silicon oxynitride layer, and/or other suitable materials having a different etch selectivity than the front-side ILD layer 210. In some embodiments, after formation of the front-side ILD layer 210, a high thermal budget process is performed to the structure to anneal the front-side ILD layer 210.

In some examples, after depositing the front-side ILD layer 210, a planarization process may be performed to remove excessive materials of the front-side ILD layer 210. For example, a planarization process includes a chemical mechanical planarization (CMP) process which removes portions of the front-side ILD layer 210 (and CESL 200, if present) overlying the dummy gate structures 150 and planarizes a top surface of the structure. In some embodiments, the CMP process also removes hard mask layers 156 (as shown in FIG. 7) and exposes the dummy gate electrode layer 350.

Figure 9:
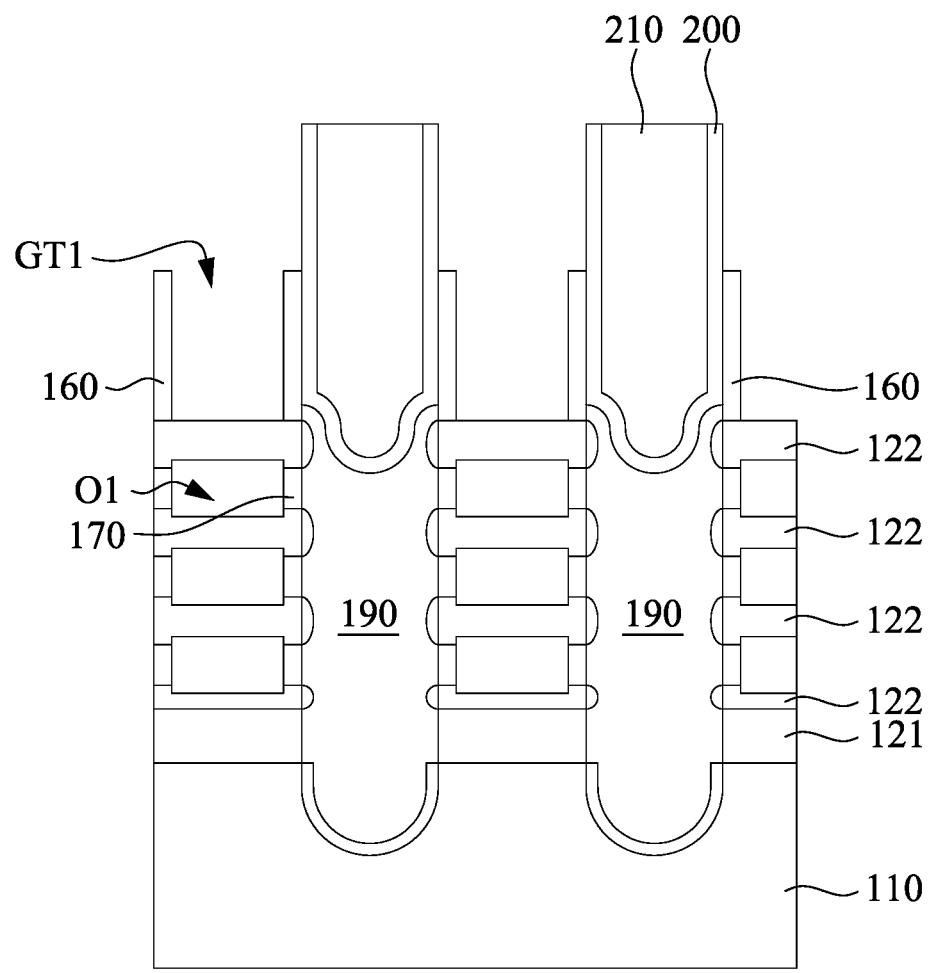

Referring to FIG. 9, dummy gate structures 150 (referring to FIG. 8) are removed first, and then the sacrificial layers 124 (referring to FIG. 8) are removed. The resulting structure is illustrated in FIG. 9. In the illustrated embodiments, the removal of the dummy gate structures 150 (referring to FIG. 8) includes a selective etching process (e.g., selective dry etching, selective wet etching, or a combination thereof) that etches the materials in dummy gate structures 150 (referring to FIG. 8) at a faster etch rate than it etches other materials (e.g., gate spacers 160, CESL 200 and/or front-side ILD layer 210), thus resulting in gate trenches GT1 between corresponding gate spacers 160, with the sacrificial layers 124 exposed in the gate trenches GT1. Subsequently, the sacrificial layers 124 (referring to FIG. 8) in the gate trenches GT1 are removed by using another selective etching process that etches the sacrificial layers 124 (referring to FIG. 8) at a faster etch rate than it etches the channel layers 122, thus forming openings O1 between neighboring channel layers 122. In this way, the channel layers 122 become nanosheets suspended over the substrate 110 and between the doped epitaxial features 190. This step is also called a channel release process. At this interim processing step, the openings O1 between nanosheets 122 may be filled with ambient environment conditions (e.g., air, nitrogen, etc). In some embodiments, the nanosheets 122 can be interchangeably referred to as nanowires, nanoslabs and nanorings, depending on their geometry. For example, in some other embodiments the channel layers 122 may be trimmed to have a substantial rounded shape (i.e., cylindrical) due to the selective etching process for completely removing the sacrificial layers 124 (referring to FIG. 8). In that case, the resultant channel layers 122 can be called nanowires.

In some embodiments, the sacrificial layers 124 (referring to FIG. 8) are removed by using a selective wet etching process. In some embodiments, the sacrificial layers 124 (referring to FIG. 8) are SiGe and the channel layers 122 are silicon allowing for the selective removal of the sacrificial layers 124 (referring to FIG. 8). In some embodiments, the selective wet etching includes an APM etch (e.g., ammonia hydroxide-hydrogen peroxide-water mixture). In some embodiments, the selective removal includes SiGe oxidation followed by a SiGeO$_x$ removal. For example, the oxidation may be provided by O$_3$ clean and then SiGeO$_x$ removed by an etchant such as NH$_4$OH that selectively etches SiGeO$_x$ at a faster etch rate than it etches Si. Moreover, because oxidation rate of Si is much lower than oxidation rate of SiGe, the channel layers 122 may not be significantly etched by the channel release process. It can be noted that both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

In some embodiments, due to the different compositions of the sacrificial layers 124 (referring to FIG. 8) and the epitaxial etch stop layer 121, during the channel release step the selective wet etching etches the sacrificial layers 124 (referring to FIG. 8) at a faster etch rate than it etches the epitaxial etch stop layer 121. The epitaxial etch stop layer 121 may not be significantly etched by the channel release step.

In some embodiments, the etching process performed in the channel release step also lowers the top surfaces of the gate spacers 160. For example, top surfaces of the gate spacers 160 are lower than top surfaces of the CESL 200 and the ILD layer 210.

Figure 10A:
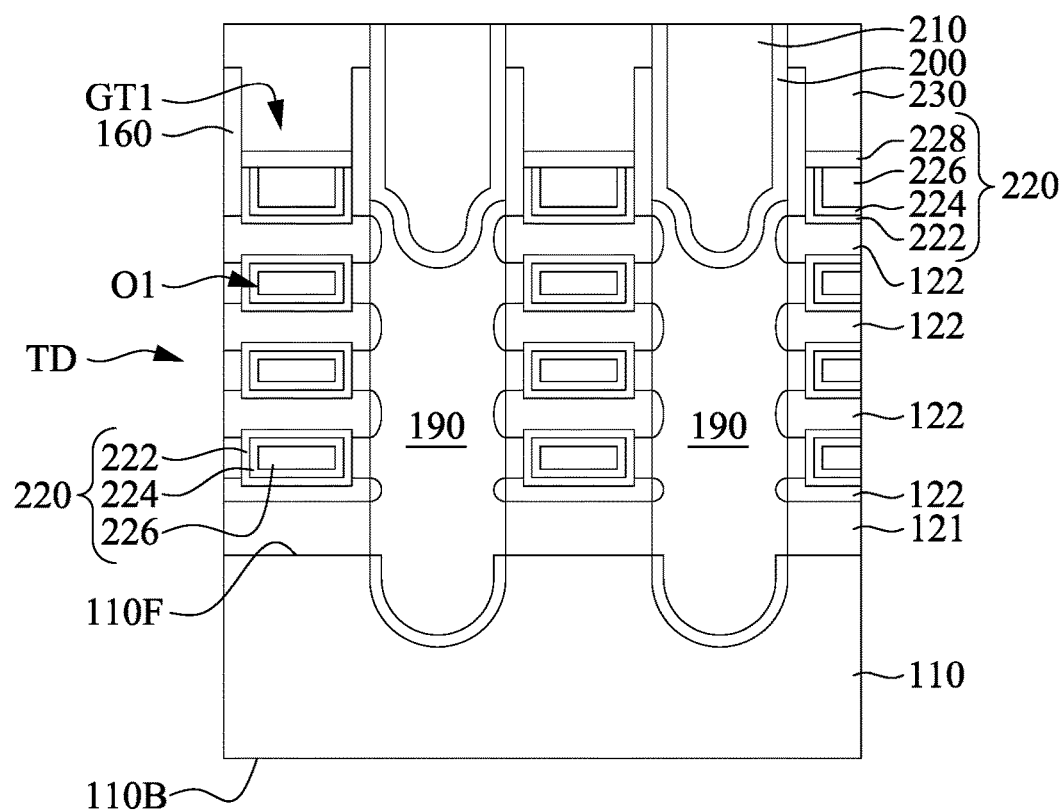
Figure 10B:
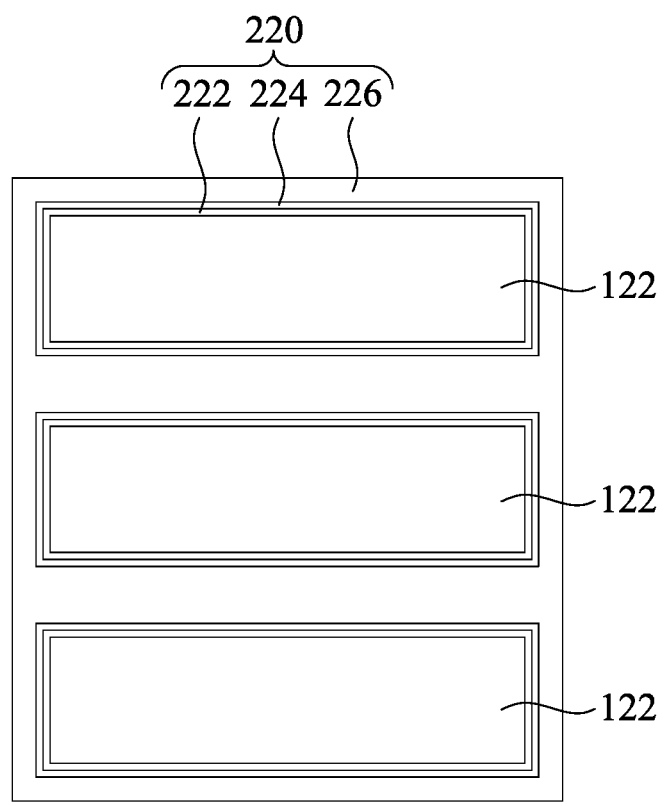

Referring to FIG. 10A, replacement gate structures 220 are respectively formed in the gate trenches GT1 to surround each of the nanosheets 122 suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of nanosheets 122. For example, high-k/metal gate structures 220 are formed within the openings O1 (as illustrated in FIG. 9) provided by the release of nanosheets 122. In various embodiments, the high-k/metal gate structure 220 includes an interfacial layer 222 formed around the nanosheets 122, a high-k dielectric layer 224 formed around the interfacial layer 222, a work function metal layer 226 formed around the high-k dielectric layer 224, and a fill metal 228 formed around the work function metal layer 226 and filling a remainder of gate trenches GT1. The interfacial layer 222 may be a silicon oxide layer. High-k gate dielectrics, as used and described herein, include dielectric materials having a high dielectric constant, for example, greater than that of thermal silicon oxide (~3.9). The work function metal layer 226 and/or fill metal 228 used within high-k/metal gate structures 220 may include a metal, metal alloy, or metal silicide. Formation of the high-k/metal gate structures 220 may include depositions to form various gate materials, one or more liner layers, and one or more CMP processes to remove excessive gate materials. As illustrated in a cross-sectional view of FIG. 10B that is taken along a longitudinal axis of a high-k/metal gate structure 220, such as Y direction indicated in FIG. 5A, the high-k/metal gate structure 220 surrounds each of the nanosheets 122, and thus is referred to as a gate of a GAA FET.

In some embodiments, the interfacial layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer 224 may include hafnium oxide ($HfO_2$). Alternatively, the high-k dielectric layer 224 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 226 may include work function metals to provide a suitable work function for the high-k/metal gate structures 220. For an n-type GAA FET, the work function metal layer 226 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 226 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 228 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

After the formation of the replacement gate structures 220, a dielectric material 230 is formed over the replacement gate structures 220 and filling up the gate trench GT1. The dielectric material 230 may include silicon nitride. Formation of the dielectric material 230 may include depositing a dielectric material is over the replacement gate structures 220 and the front-side ILD layer 210, and filling up the gate trench GT1, and planarized by the deposited dielectric material until the front-side ILD layer 210 is exposed.

Through the replacement process, transistor devices TD are formed over the front side 110F of the substrate 110. The transistor devices TD may include nanosheets 122, a gate structure 220 surrounding the nanosheets 122, and the source and drain epitaxial features 190. In the present embodiments, the transistor device TD may act as a selector transistor device (e.g., the selector transistor device 700 in FIG. 1) for memory array. The multiple nanosheets stack selector circuit can be formed to obtain higher current supply. Suitable N-type or P-type transistor device TD may be flexibly chosen for selector design for various purposes of device/circuit performances, such as high device performance, high circuit performance, or low power consumption. In some other embodiments, the transistor device TD may act as a logic transistor device, and free of being electrically connected to the memory array.

Figure 11:
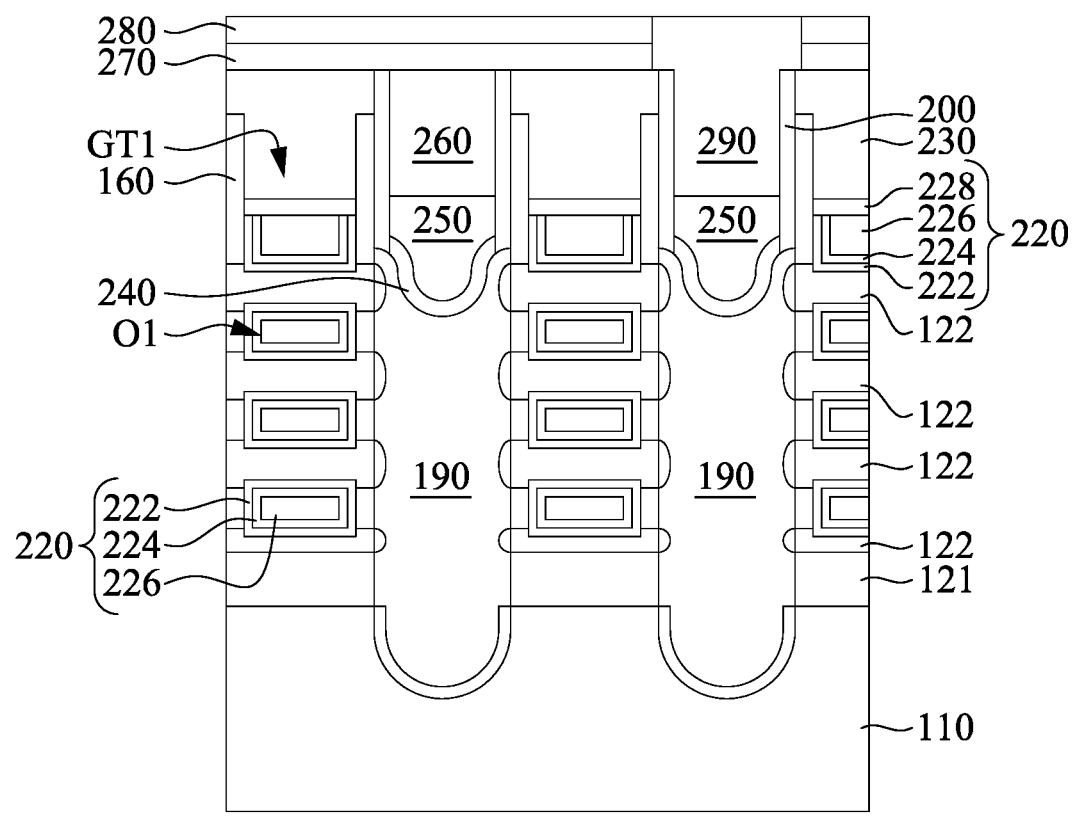

Referring the FIG. 11, contacts 250 are formed over and connected with front sides of the epitaxial features 190. In some embodiments, contact openings are first formed through the front-side ILD layer 210 to expose the epitaxial features 190 by using suitable photolithography and etching techniques. Subsequently, silicide regions 240 are formed on the front side of the epitaxial features 190 by using a silicidation process, followed by forming contacts 250 over the silicide regions 240. Silicidation may be formed by depositing a metal layer (e.g., nickel layer or cobalt layer) over the exposed epitaxial features 190, annealing the metal layer such that the metal layer reacts with silicon (and germanium if present) in the epitaxial features 190 to form the metal silicide region 240 (e.g., nickel silicide or cobalt silicide), and thereafter removing the non-reacted metal layer. Contacts 250 may be formed by depositing one or more metal materials (e.g., tungsten, cobalt, copper, the like or combinations thereof) to fill the contact holes by using suitable deposition techniques (e.g., CVD, PVD, ALD, the like or combinations thereof), followed by a CMP process to remove excess metal materials outside the contact openings.

In some embodiments, after the formation of the contacts 250, an ILD layer 260 is formed over the contacts 250. The ILD layer 260 may include material similar to those aforementioned ILD layers, and be deposited by similar method thereof. The ILD layer 260 may be planarized until the dielectric material 230 is exposed. Subsequently, the dielectric layers 270 and 280 may formed over the dielectric material 230 and the ILD layer 260. The dielectric layers 270 and 280 may include suitable dielectric materials. For example, the dielectric layer 270 may include silicon nitride, and the dielectric layer 280 may include silicon oxide.

A conductive via 290 may be formed over the contacts 250 through the LD layer 260 and the dielectric layers 270 and 280. In some embodiments, via openings are first formed through the LD layer 260 and the dielectric layers 270 and 280 to expose the contacts 250 by using suitable photolithography and etching techniques. Conductive via 290 may be formed by depositing one or more metal materials (e.g., tungsten, cobalt, copper, the like or combinations thereof) to fill the via openings by using suitable deposition techniques (e.g., CVD, PVD, ALD, the like or combinations thereof), followed by a CMP process to remove excess metal materials outside the contact openings.

Figure 12:
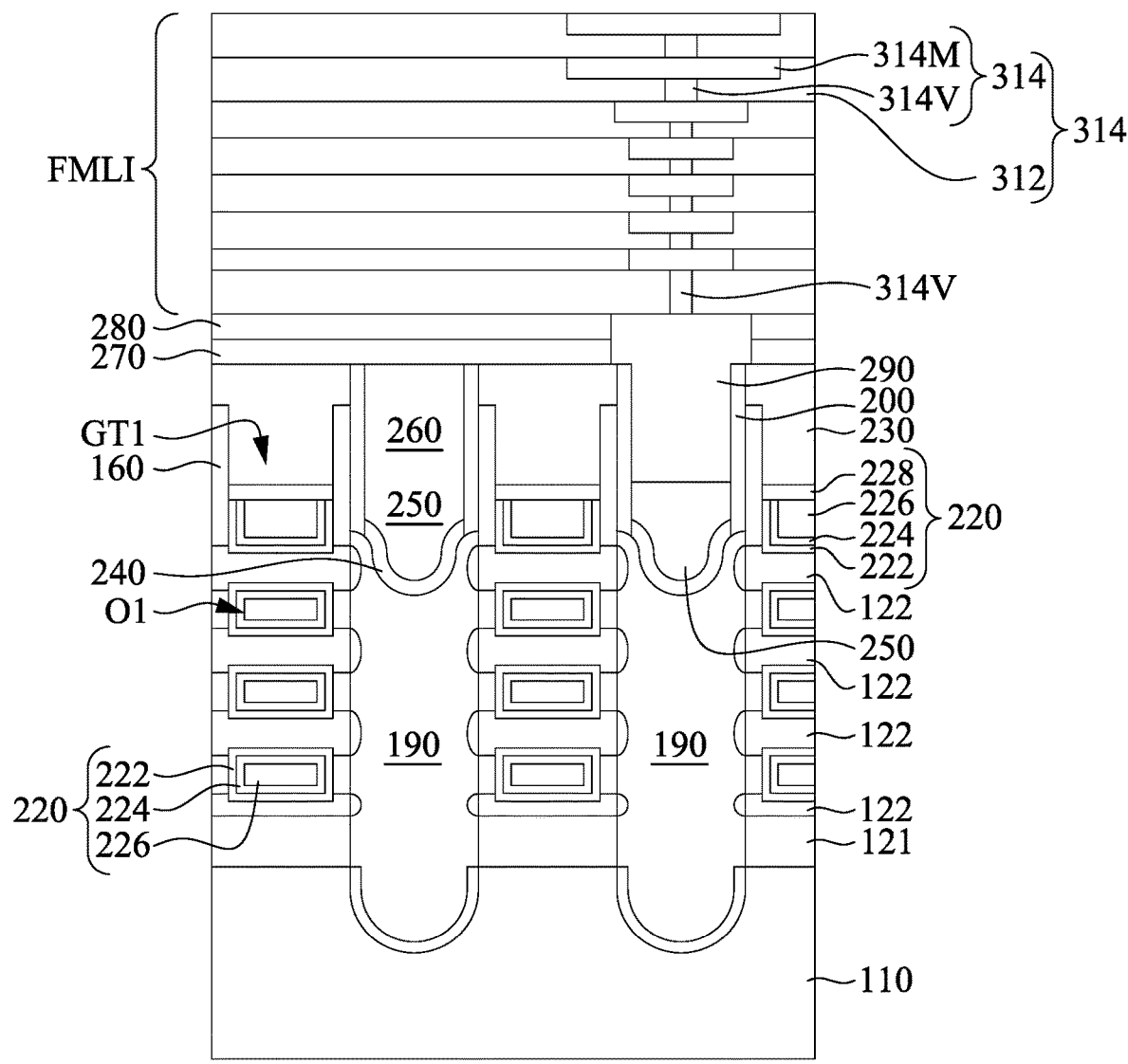

Referring the FIG. 12, a front-side multilayer interconnection (MLI) structure FMLI is formed over the substrate 110. The front-side MLI structure FMLI may have include a plurality of front-side interconnect layers 310. The interconnect layer may also be referred to as a metallization layer in the context. The number of front-side interconnect layers 310 may vary according to design specifications of the integrated circuit. The front-side interconnect layers 310 each comprise a front-side inter-metal dielectric (IMD) layer 312 and conductive features 314 embedded in the front-side IMD layer 312. The conductive feature 314 may be one or more horizontal interconnects, such as front-side metal lines 314M, respectively extending horizontally or laterally vertically in the front-side IMD layers 312, and vertical interconnects, such as front-side metal vias 314V, respectively extending vertically in the front-side IMD layers 312. In some embodiments, a front-side metal via 314V in the bottommost front-side interconnect layer 310 is in contact with the conductive via 290 to make electrical connection to the epitaxial features 190. For example, the front-side MLI structure FMLI may include a source line (e.g., one of front-side metal lines 314M) electrically connected to the contacts 250 and the epitaxial feature 190 through the conductive via 290.

The front-side metal lines 314M and front-side metal vias 314V can be formed using, for example, a single damascene process, a dual damascene process, the like, or combinations thereof. In some embodiments, the front-side IMD layer 312 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 314M and 314V may comprise metal materials such as copper, aluminum, tungsten, combinations thereof, or the like. In some embodiments, the front-side metal lines and vias 314M and 314V may further comprise one or more barrier/adhesion layers (not shown) to protect the respective front-side IMD layers 312 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. In some embodiments, the front-side metal lines 314M and front-side metal vias 314V in combination may be referred to as a front-side metallization pattern.

Figure 13:
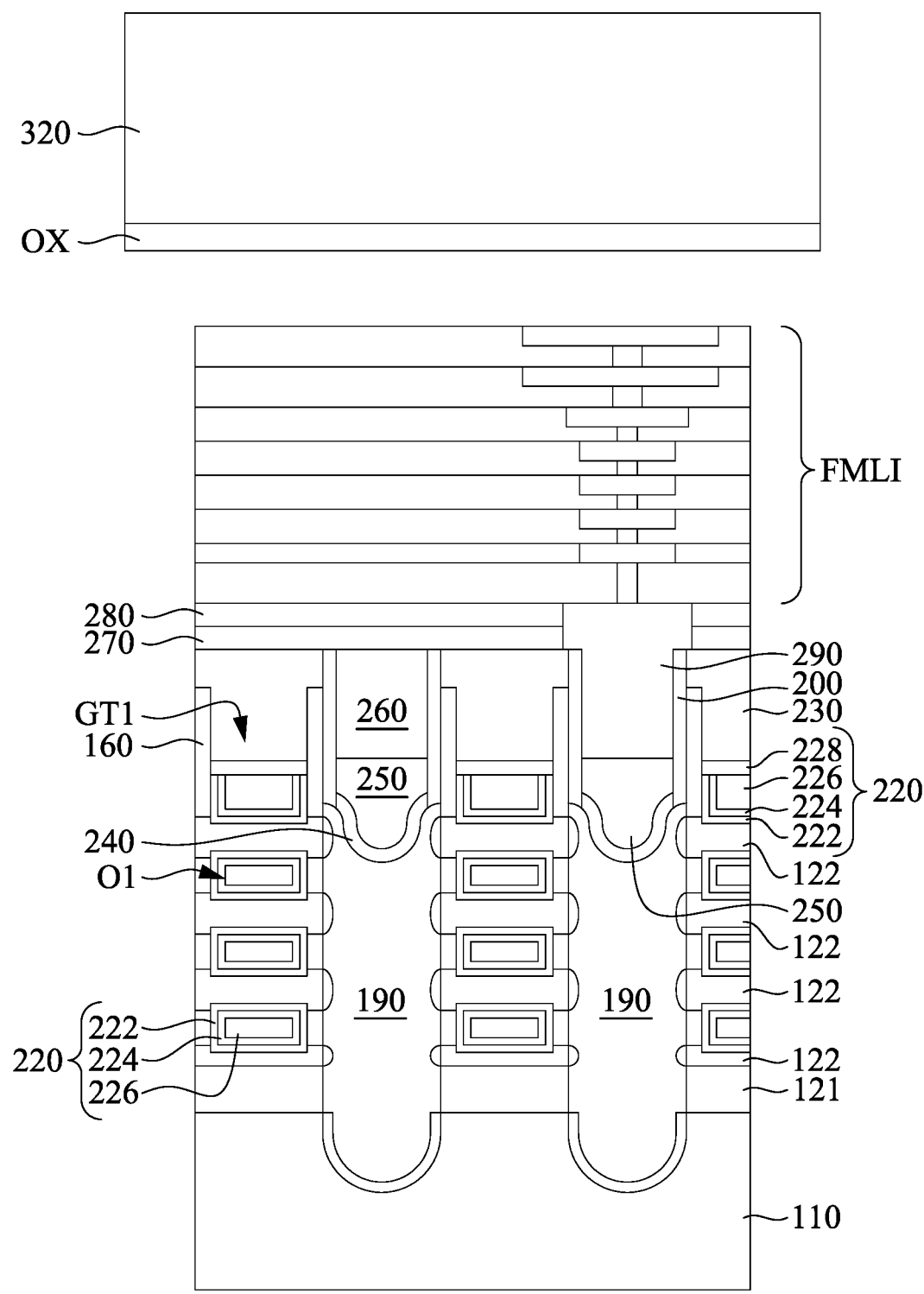

Referring to FIG. 13, a carrier substrate 320 is bonded to the front-side MLI structure FMLI in accordance with some embodiments of the present disclosure. The carrier substrate 320 may be silicon, doped or undoped, or may include other semiconductor materials, such as germanium; a compound semiconductor; or combinations thereof. The carrier substrate 320 may provide a structural support during subsequent processing on backside of the integrated circuit device and may remain in the final product in some embodiments. In some other embodiments, the carrier substrate 320 may be removed after the subsequent processing on backside of integrated circuit device is complete. In some embodiments, a cap dielectric layer OX may be formed over the MLI structure FMLI, and then the carrier substrate 320 is bonded to the cap dielectric layer OX, for example, fusion bonding. The cap dielectric layer OX may include suitable oxide materials.

Figure 14:
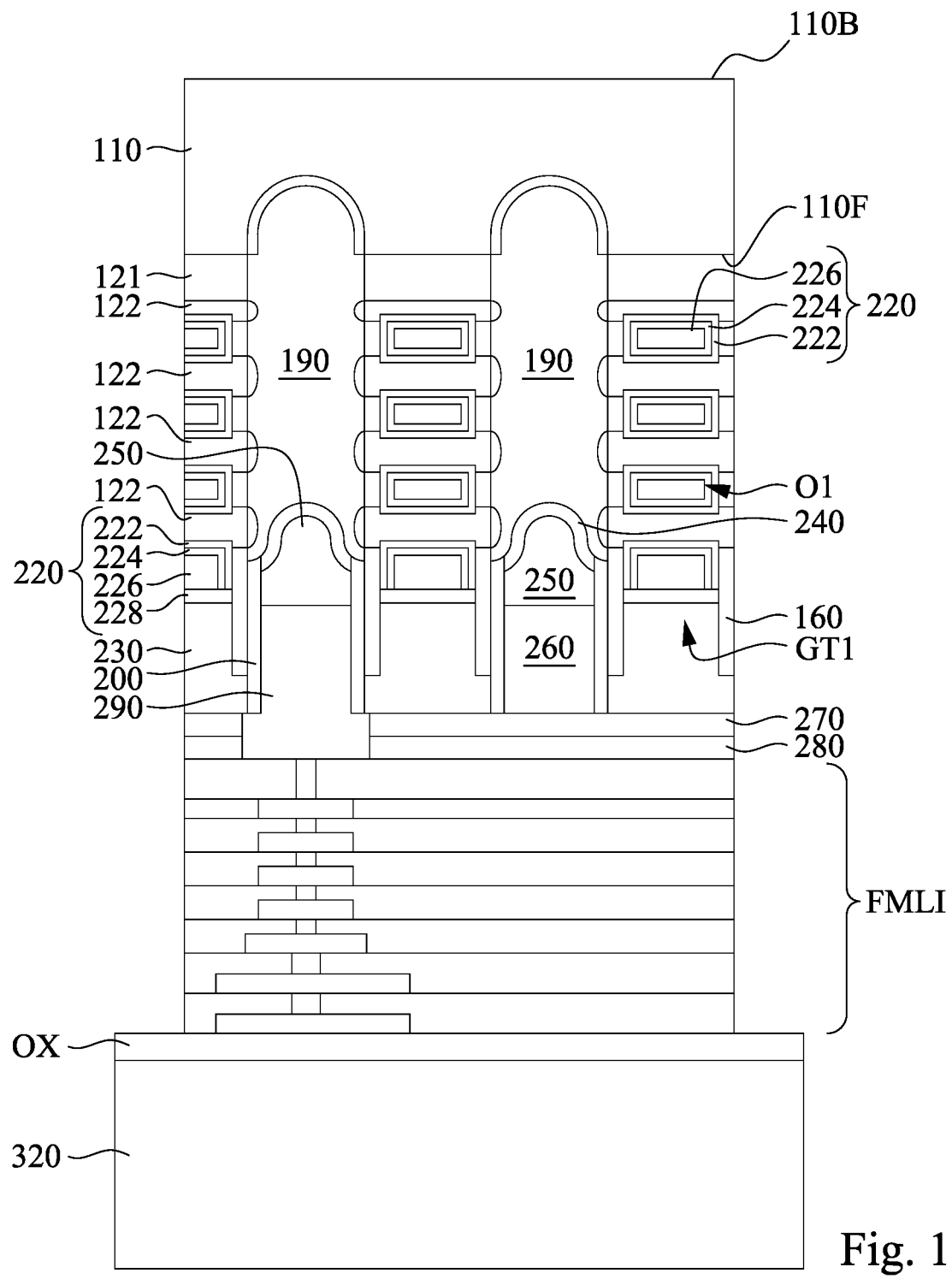

Referring to FIG. 14, the structure of FIG. 13 is flipped upside down, such that the backside 110B of the substrate 110 faces upwards, as illustrated in FIG. 13. In some embodiments, the substrate 110 may further be thinned down by, for example, a CMP process, a trimming and thinning process, a grinding process, or the like.

Figure 15:
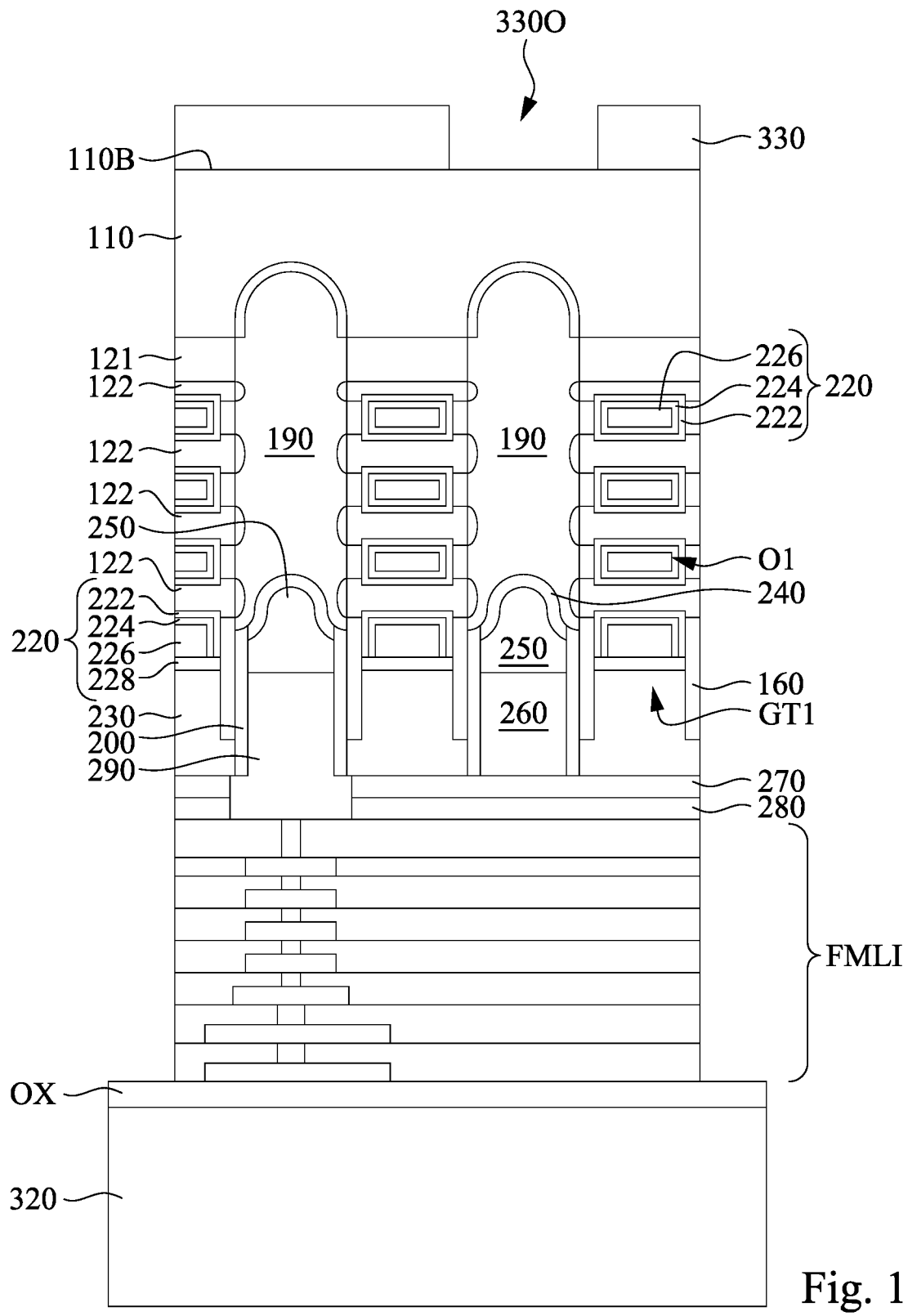

Referring to FIG. 15, a hard mask layer 330 is formed on a backside 110B of the substrate 110, and then patterned to have suitable openings 3300 corresponding to the doped epitaxial features 190, respectively. In some embodiments, the hard mask layer 330 is deposited by CVD and/or other suitable techniques. The hard mask layer 330 may be patterned by using suitable processes including photolithography and etch processes. The photolithography process may include forming a photoresist layer (not shown) over the hard mask layer 330, exposing the photoresist to a pattern, performing post-exposure bake processes, and developing the resist to form a patterned mask including the resist. The patterned photoresist may then be used to protect regions of the hard mask layer 330, while an etch process forms openings 3300 in unprotected regions through the hard mask layer 330. The openings 3300 may be etched using a dry etch (e.g., reactive ion etching), a wet etch, and/or combination thereof.

Figure 16:
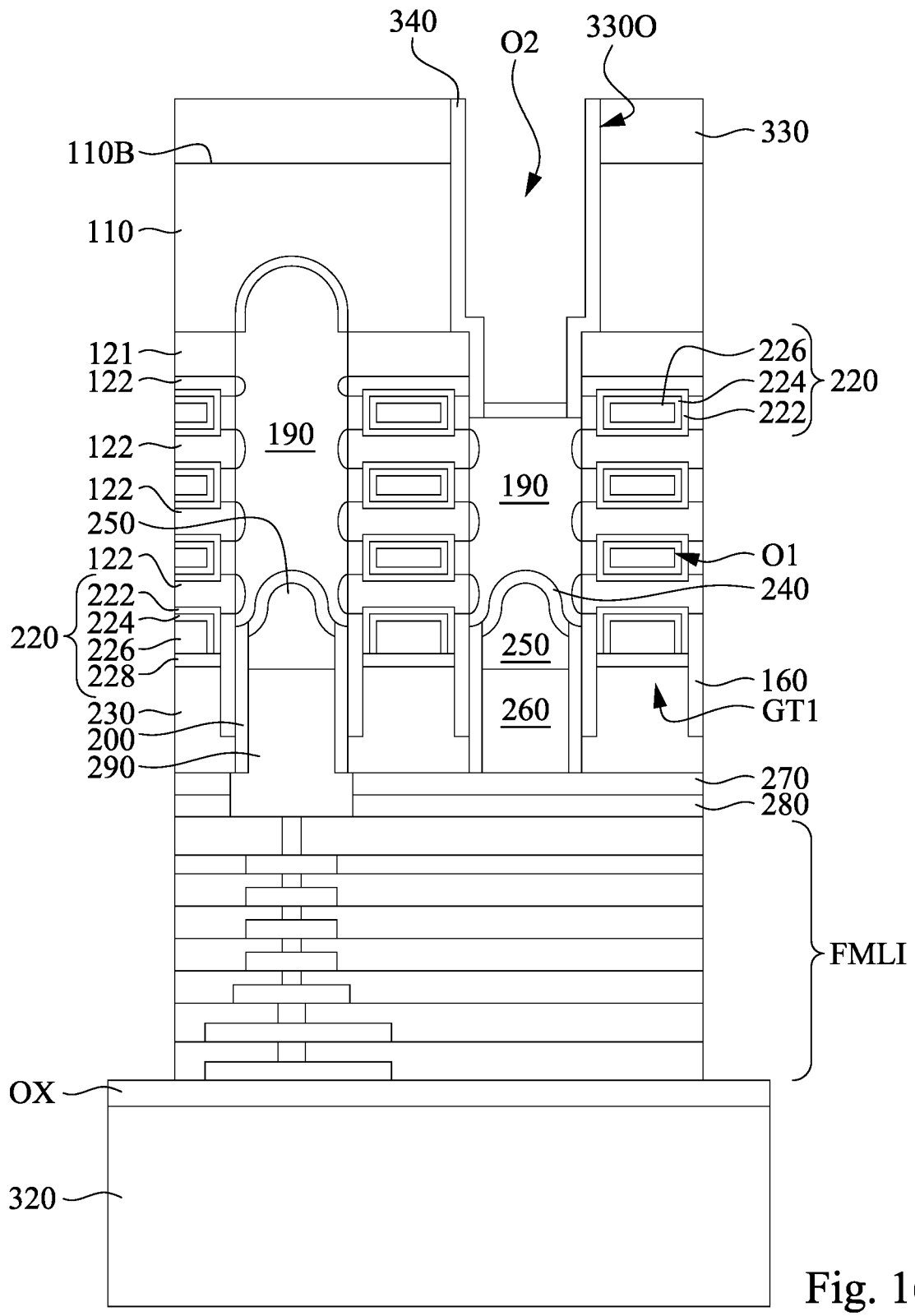

Referring to FIG. 16, the substrate 110 is patterned to form an opening O2 exposing backsides of the epitaxial features 190. The patterning may include suitable etching process, such as a dry etch (e.g., reactive ion etching), a wet etch, and/or combination thereof. In some embodiments, an etching process is performed to remove portions of the substrate 110 exposed by the openings 3300 of the hard mask layer 330, while other portions of the substrate 110 covered by the patterned hard mask layer 330 are protected from being etched during the etching process.

After the formation of the opening O2, a protection layer 340 may be deposited on the back side of the substrate 110 and into the opening O2. The protection layer 340 can protect the epitaxial features 190 from being oxidation. The protection layer 340 may include silicon nitride. Subsequently, portions of the protection layer 340 over the backsides of the epitaxial features 190 may be removed by suitable anisotropic etching process. Through the process, the protection layer 340 may extend along and around the sidewall of the opening O2 and expose the backsides of the epitaxial features 190.

Figure 17:
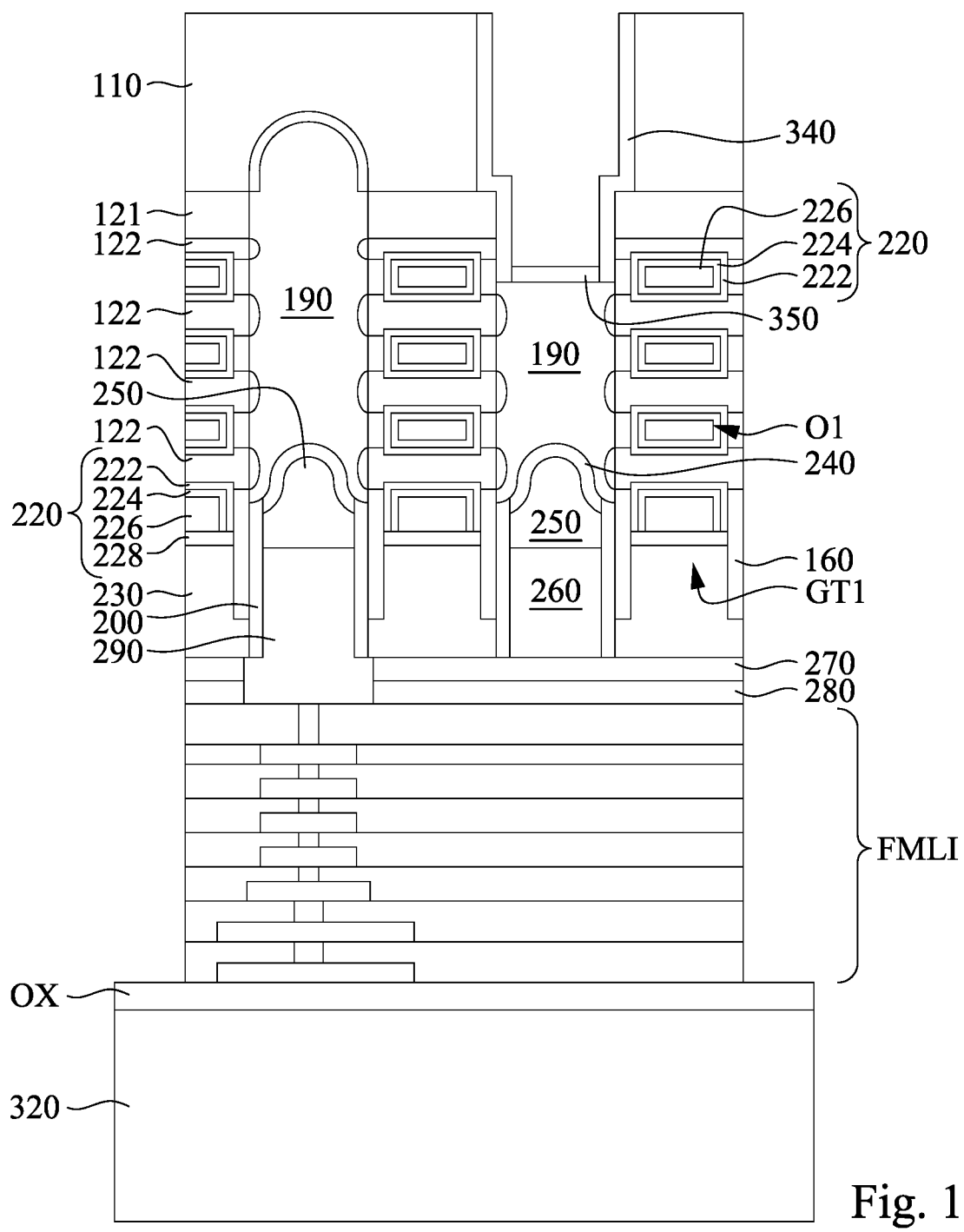

Referring to FIG. 17, silicide regions 350 are formed on the backsides of the epitaxial features 190 by using a silicidation process. The silicidation process may be performed by depositing a metal layer (e.g., nickel layer or cobalt layer) over the exposed backsides of the epitaxial features 190, annealing the metal layer such that the metal layer reacts with silicon (and germanium if present) in the epitaxial features 190 to form the metal silicide regions 350 (e.g., nickel silicide or cobalt silicide), and thereafter removing the non-reacted metal layer. In some embodiments, a pre-clean process may be performed to the exposed backsides of the epitaxial features 190 prior to the silicidation process.

Figure 18:
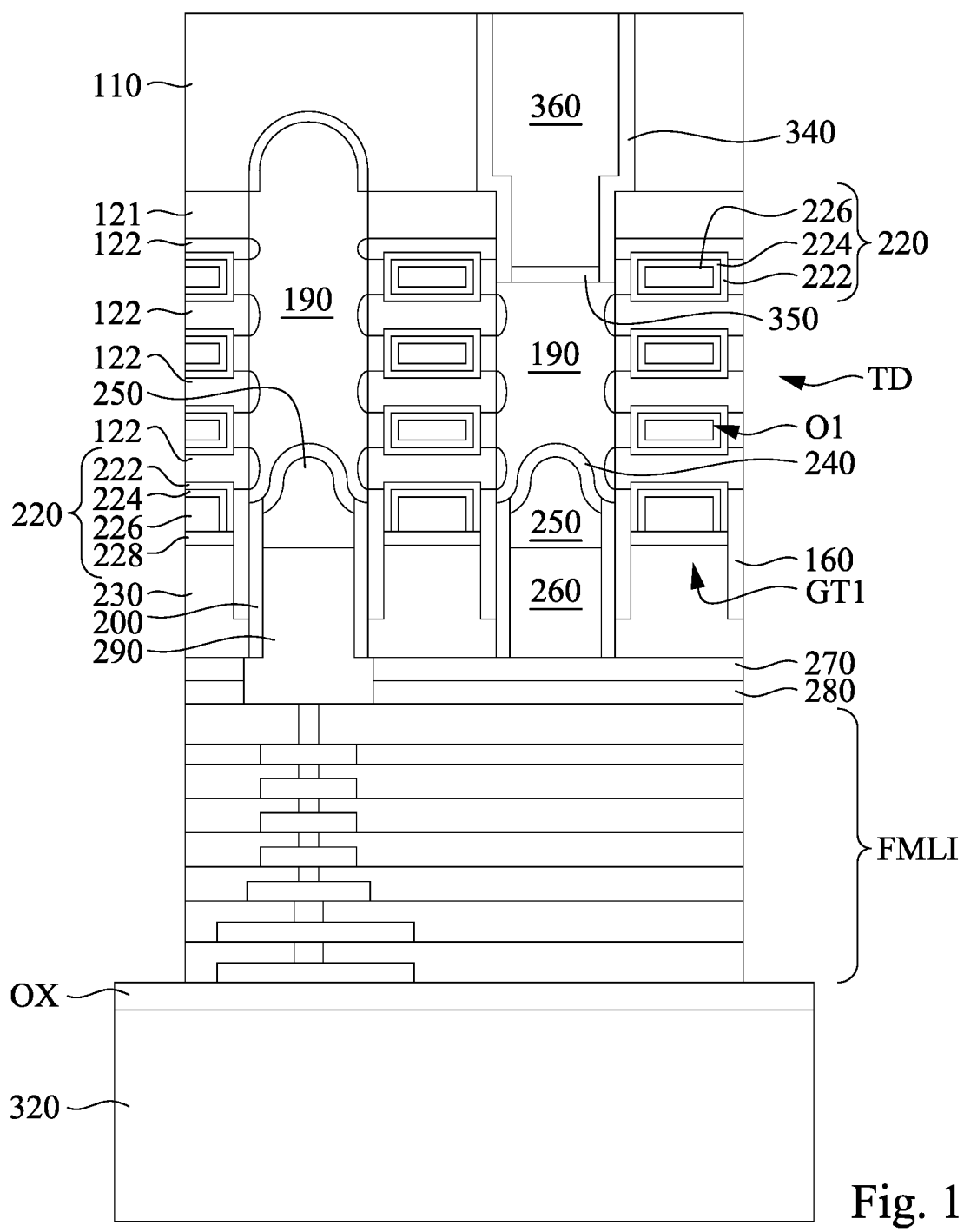

Referring to FIG. 18, backside contact features 360 are respectively formed over the silicide regions 350. Backside contact features 360 may be formed by depositing one or more metal materials (e.g., tungsten, cobalt, copper, the like or combinations thereof) to fill the opening O2 by using suitable deposition techniques (e.g., CVD, PVD, ALD, the like or combinations thereof), followed by a CMP process to remove excess metal materials outside the opening O2. Through the process, a backside contact feature 360 are connected with a back side of a source/drain epitaxial feature 190 of the transistor device TD. In some embodiments, the opening O2 is a via opening, and the formed backside contact feature 360 is a via contact.

Figure 19:
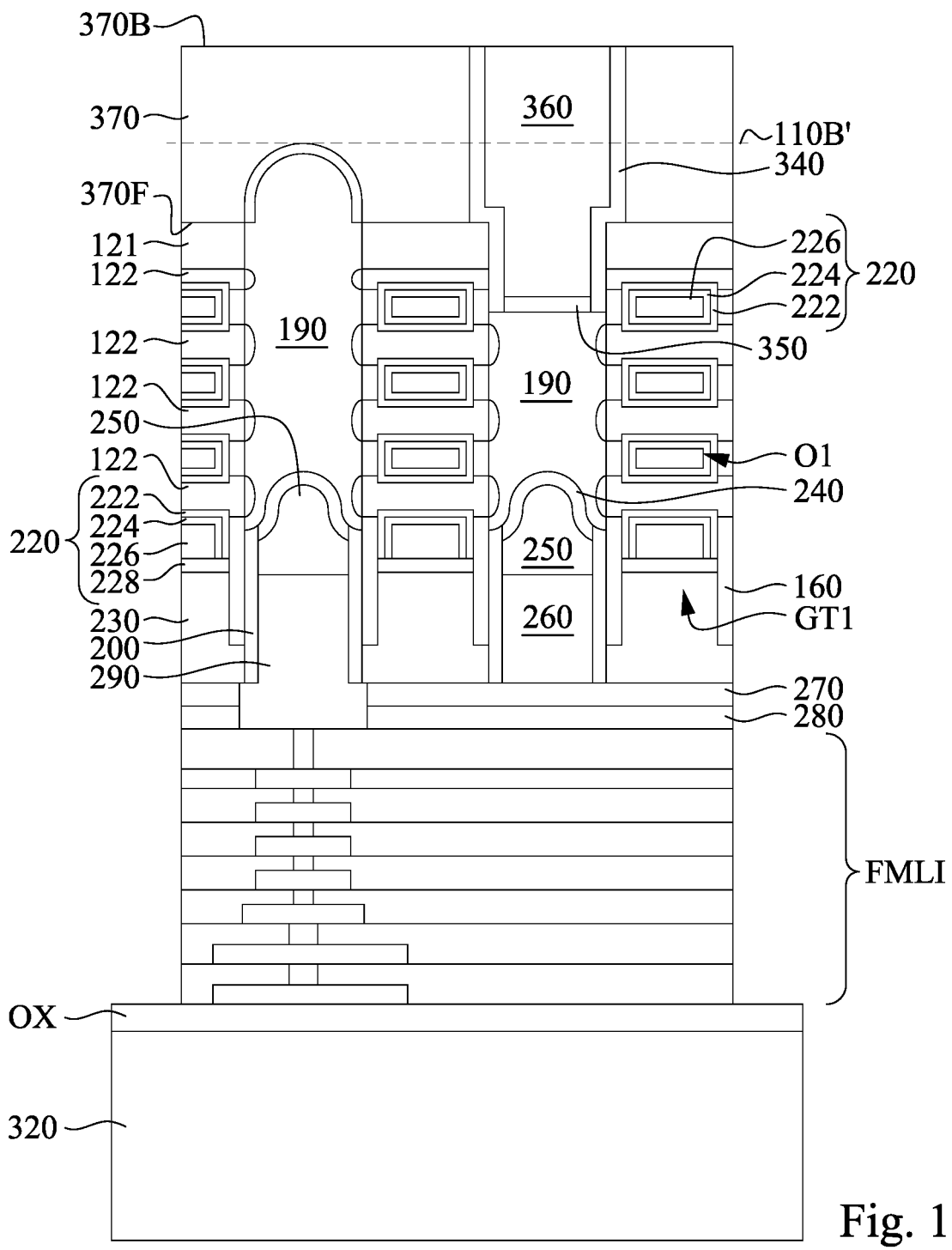

Referring to FIG. 19, the substrate 110 is replaced with a backside ILD layer 370. In some embodiments, the substrate 110 (referring to FIG. 18) is first removed by a selective etching process that etches Si at a faster etch rate than it etches the backside contact features 360, the protection layer 340, and the epitaxial etch stop layer 121. Subsequently, a backside ILD layer 370 is formed around the backside contact features 360 and over the epitaxial etch stop layer 121. For example, one or more dielectric materials is deposited over the backside contact features 360, the protection layer 340, and the epitaxial etch stop layer 121 by using suitable deposition techniques such as a conform deposition technique like CVD. Subsequently, the deposited dielectric material is thinned down by using, for example, an etch back process, a planarization process (e.g., a CMP process) or the like, until reaching the backside contact features 360.

In some embodiments, the backside ILD layer 370 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside ILD layer 370 has a same material as the front-side ILD layer 210. The ILD layer 370 is referred to as a "backside" ILD layer in the embodiments because it is formed on a backside of the multi-gate transistors opposite to the front-side of the multi-gate transistors that replacement gate structures 220 protrude from the nanosheets 122.

In the context, the dashed line 110B' indicates a position of back sides of the source/drain features, which may include both the doped epitaxial feature 190 and the epitaxial layer 180. The dashed line 110B' may be referred to as a wafer backside or a back side of the substrate in the subsequent process. In the context, for better illustrate, the ILD layer 370 may include a front side 370F facing the gate structure 220 of the transistor device TD, and a back side 370B facing away from the gate structure 220 of the transistor device TD.

Figure 20:
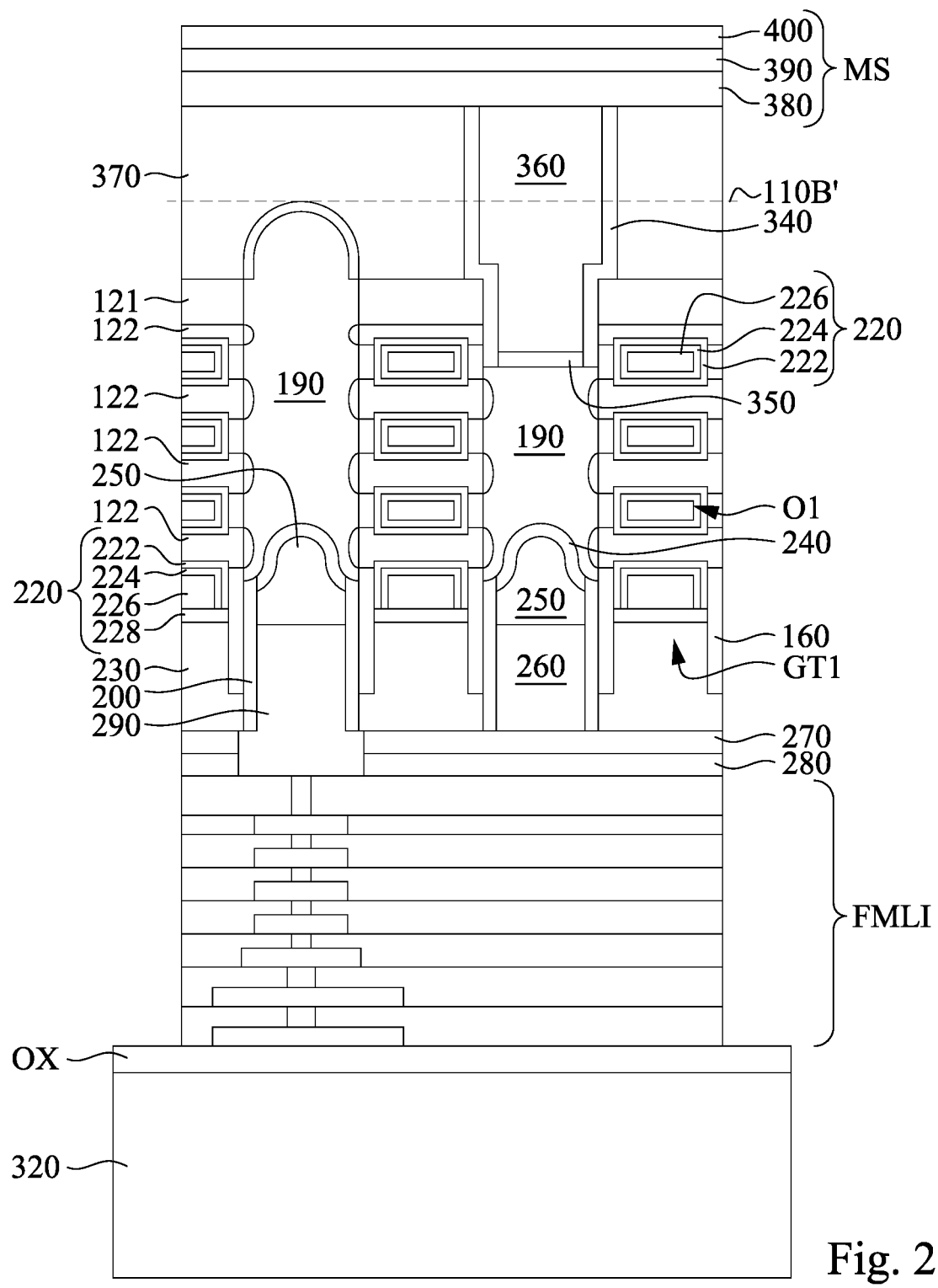

Referring to FIG. 20, a memory film stack MS is formed over the backside ILD layer 370 and the backside contact features 360. In some embodiments, the memory film stack MS includes a bottom electrode layer 380, a resistance switching layer 390 over the bottom electrode layer 380, and a top electrode layer 400 over the resistance switching layer 390.

In some embodiments, the bottom electrode layer 380 extends along top surfaces of the backside contact features 360 and of the backside ILD layer 370. The bottom electrode layer 380 can be a single-layered structure or a multi-layered structure. In some embodiments, the bottom electrode layer 380 includes titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 380 may be exemplarily performed using CVD, PVD, ALD, the like, and/or a combination thereof.

The resistance switching layer 390 is deposited over the bottom electrode layer 380. In some embodiments, the resistance switching layer 390 may be a magnetic tunnel junction (MTJ) structure. To be specific, the resistance switching layer 390 includes at least a first magnetic layer, a tunnel barrier layer and a second magnetic layer are formed in sequence over the bottom electrode layer 380. The magnetic moment of the second magnetic layer may be programmed causing the resistance of the resulting MTJ cell to be changed between a high resistance and a low resistance.

In some embodiments, the first magnetic layer includes an anti-ferromagnetic material (AFM) layer and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the resistance switching layer 390. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, thermal or e-beam evaporated deposition. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element fabricated from the resistance switching layer 390. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporated deposition, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron, compound or alloy thereof. An exemplary formation method of the second magnetic layer includes sputtering, PVD, ALD, e-beam or thermal evaporated deposition, or the like.

In some embodiments where resistive random access memory (RRAM) cells are to be formed on the wafer, the resistance switching layer 390 may include a RRAM dielectric layer such as metal oxide composite, such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state.

A top electrode layer 400 is deposited over the resistance switching layer 390. The top electrode layer 400 includes a conductive material. In some embodiments, the top electrode layer 400 comprises titanium (Ti), tantalum (Ta), platinum (Pt), ruthenium (Ru), tungsten (W), aluminum (Al), copper (Cu), the like or combinations thereof. An exemplary formation method of the top electrode layer 400 includes sputtering, PVD, ALD or the like. The top electrode layer 400 can be a single-layered structure or a multi-layered structure. In some embodiments, the top electrode layer 400 is similar to the bottom electrode layer 380 in terms of composition.

Figure 21:
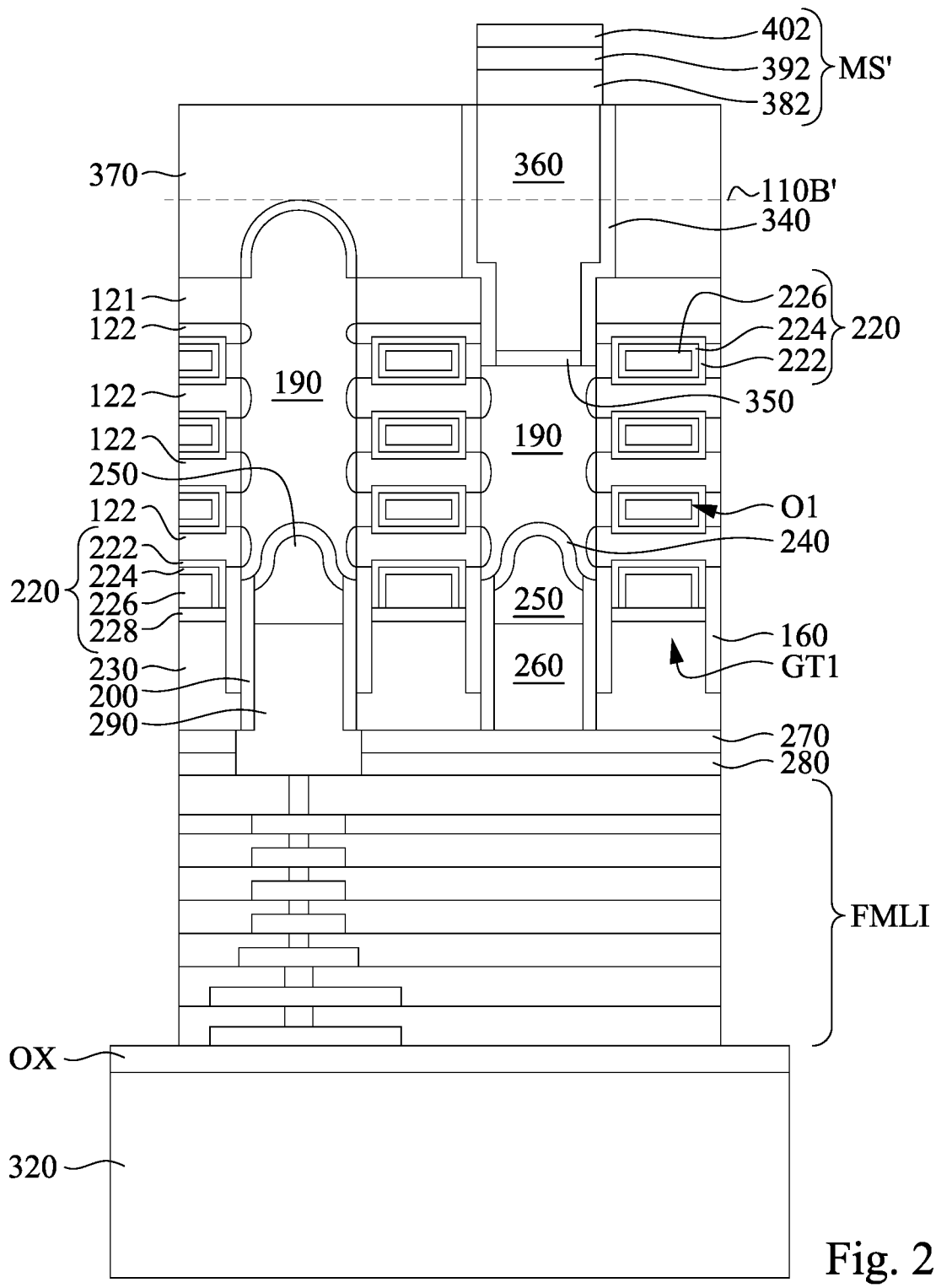

Referring to FIG. 21, the memory film stack MS is patterned into plural memory stacks MS' respectively over back sides of the backside contact features 360 facing away from the source/drain epitaxial features 190. Each of the memory stack MS' may include a bottom electrode 382 patterned from the bottom electrode layer 380 (referring to FIG. 19), a resistance switching element 392 patterned from the resistance switching layer 390 (referring to FIG. 19), and a top electrode 402 patterned from the top electrode layer 400. The patterning may include suitable lithography process and plural suitable etching processes.

Figure 22:
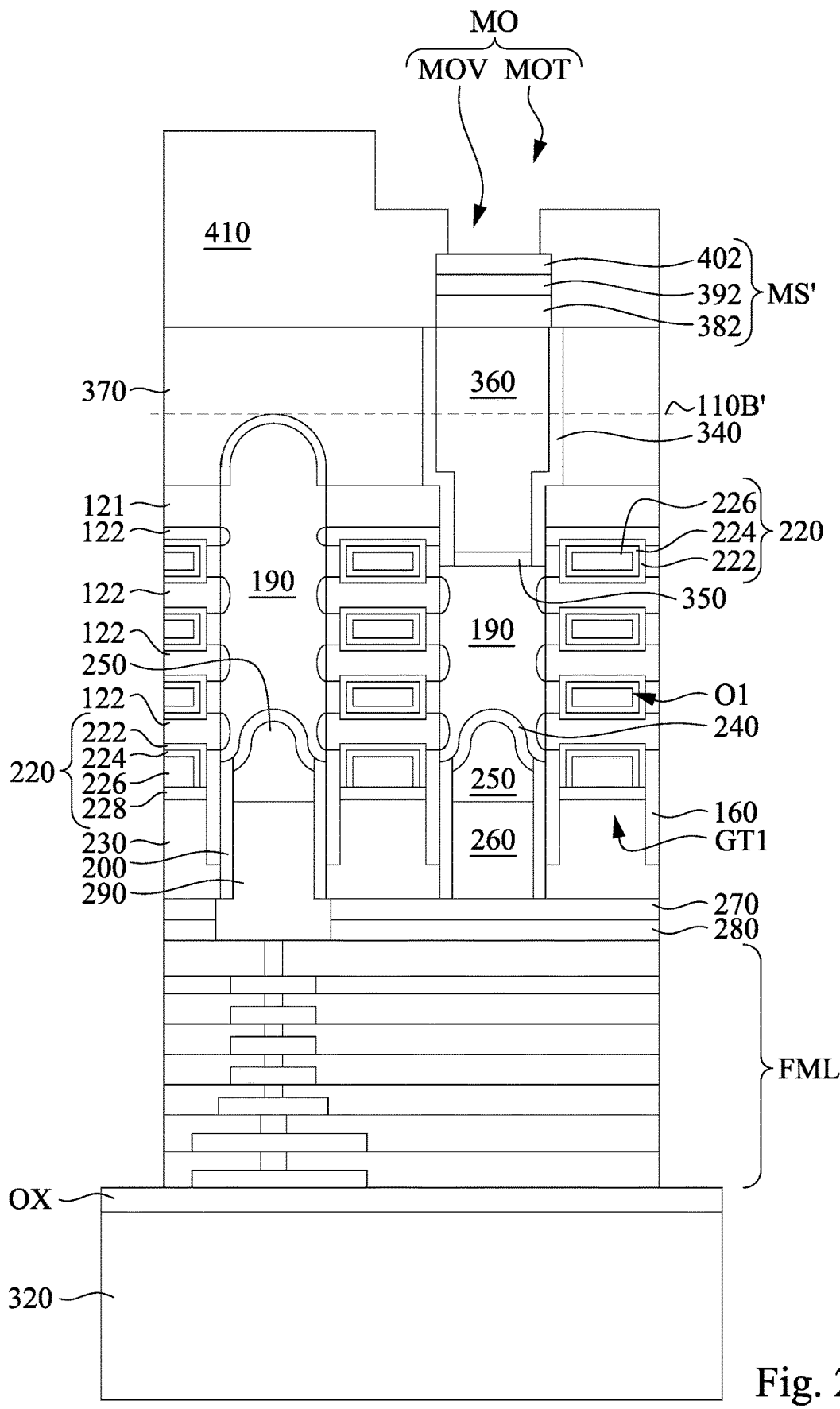

Referring to FIG. 22, an ILD layer 410 is deposited over the memory structure MS' and the backside ILD layer 370 using suitable deposition techniques. The ILD layer 410 may be silicon oxide, extreme or extra low-k silicon oxide such as a porous silicon oxide layer. For example, the ILD layer 410 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

After the formation of the ILD layer 410, a top electrode opening MO is formed in the ILD layer 410. The top electrode opening MO may expose a top surface of the top electrode 402 of the memory structure MS'. In some embodiments, formation of the top electrode opening MO may include a via etching process, a trench etching process, or the combination thereof. The via etching process may be performed to etch a via opening MOV in the ILD layer 410. The trench etching process may be performed to etch a trench opening MOT in the ILD layer 410. The via etching process and the trench etching process may include suitable anisotropic etching processes. In some embodiments where the ILD layer 410 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. Sometimes, the trench etching process may deepen the via opening MOV after the via etching process. Alternative, in some other embodiments, the trench etching process may be performed prior to the via etching process.

Through these etching processes, the top electrode opening MO may be a via opening MOV, a trench opening MOT, or the combination thereof. In some other embodiments, the vias opening MOV may be omitted, and the trench etching process may be performed to etch the trenches MOT to expose the top electrode 162 without the via etching process.

Figure 23:
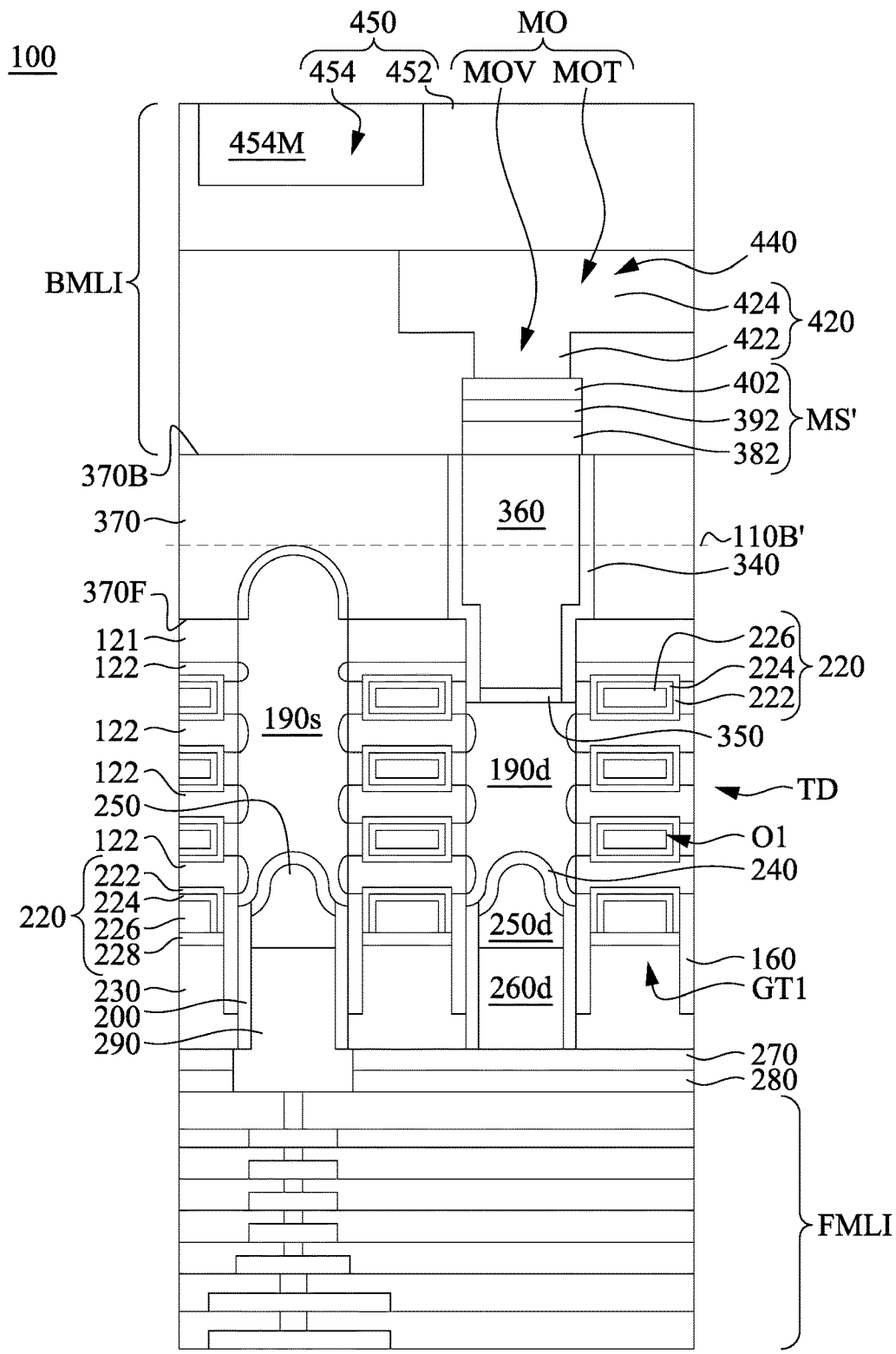

Dereference is made to FIG. 23. A conductive feature 420 is formed in the top electrode opening MO and in contact with the top electrode 402. Formation of the conductive feature 420 may include filling the top electrode opening MO with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode opening MO, thereby forming the conductive feature 420.

In the present embodiments, the conductive feature 420 includes a conductive line 424 in the trench opening MOT and a conductive via 422 in the via opening MOV. In some embodiments, the conductive via 422 may be omitted, and the conductive line 424 is in direct contact with the top electrode 402. In some embodiments, the ILD layer 410, the memory stacks MS', the conductive features 420 are in combination referred to as a backside interconnect layer 440, which forms a bottommost interconnect layer of a backside MLI structure BMLI.

In some embodiments, the conductive feature 420 including the conductive line 424 in the backside interconnect layer 440 is a bit line that extends across and is in contact with one or more memory structures MS', so as to make electrical connection to one or more memory structures MS'. Because the bit line is formed in the backside MLI structure BMLI, more routing space can be provided for the integrated circuit device 100.

In some embodiments, the backside MLI structure BMLI may further include one or more backside interconnect layers 450 formed over the backside interconnect layer 440. The backside interconnect layer 450 comprises a backside IMD layer 452 and conductive features 454. The conductive features 454 may include one or more vertical interconnects, such as backside metal vias (not shown), and one or more horizontal interconnects, such as backside metal lines 454M, respectively extending horizontally or lateralling in the backside IMD layer 452. The number of the backside interconnect layers 450 may vary according to design specifications of the integrated circuit device 100. Only one backside interconnect layer 450 is illustrated in FIG. 23 for the sake of simplicity. After the formation of the backside MLI structure BMLI, the carrier substrate 320 may be removed from the front-side MLI structure FMLI.

Through the operations, an integrated circuit device 100 is fabricated. In some embodiments, the integrated circuit device 100 includes a dielectric layer 370, a transistor device TD, the front-side MLI structure FMLI, and the backside MLI structure BMLI. The transistor device TD and the front-side MLI structure FMLI are located over a frontside of the dielectric layer 370. The backside MLI structure BMLI is located over a back side 370B of the dielectric layer 370. The transistor device TD may include nanosheets 122, a gate structure 220 surrounding the nanosheets 122, and the source and drain epitaxial features 190. For better illustration, one of the epitaxial features 190 of the transistor device TD may be referred as a source epitaxial feature 190s, and another of the epitaxial features 190 of the multi-gate device may be referred as a drain epitaxial feature 190d. In the present embodiments, the transistor device TD may act as a selector transistor device (e.g., the selector transistor device 700 in FIG. 1) for memory array. For example, the backside MLI structure BMLI may include a memory structure MS' electrically connected to the drain epitaxial feature 190d through the backside contact feature 360 and a bit line (e.g., backside metal lines 444M) electrically connected to the memory structure MS'. The front-side MLI structure FMLI may include a source line (e.g., one of front-side metal lines 314M) electrically connected to the source epitaxial feature 190s through the contacts 250 and the conductive via 290. In some other embodiments, the transistor device TD may act as a logic transistor device, and free of being electrically connected to the memory structure MS'.

In the figure, the front side 370F of the dielectric layer 370 faces downwards, and the back side 370B of dielectric layer 370 faces upwards. As the front side 370F of the dielectric layer 370 faces downwards. the gate structure 220 of transistor device TD is over the frontside MLI structure FMLI, the dielectric layer 370 is over the transistor device TD, the memory structure MS' is over the dielectric layer 370, and the backside interconnect layer 450 of the backside MLI structure BMLI is over the memory structure MS'. In some embodiments, the structure may be turned upside-down, such that the front side 370F of the dielectric layer 370 faces upwards, and the back side 370B of dielectric layer 370 faces downwards. As the front side 370F of the dielectric layer 370 faces upwards. the memory structure MS' is over the backside interconnect layer 450 of the backside MLI structure BMLI, the dielectric layer 370 is over the memory structure MS', the gate structure 220 of transistor device TD is over the dielectric layer 370, and a frontside interconnect layer 310 over the gate structure 220.

In some embodiments, by disposing memory cell on the back side of the substrate, the interconnect distance between memory cell and power rail to logic, periphery, selector control circuit has been significantly reduced, thereby achieving area reduction and high density memory applications. By the frontside and the backside metal interconnects, it is easier for place and routing design from front side and back side power rail for better memory performance. The memory cell may be formed with thicker MTJ thickness to maintain magnetic field requirement in back side memory due to no limitation for BEOL via or metal thickness requirement. With thick MTJ thickness, the width of memory cell can be reduced without decreasing the charge storage ability, thereby enlarging the space between adjacent memory cells. The enlarged space between adjacent memory cells is beneficial for eliminate the interference between two adjoins MTJ signal. For example, magnetic shielding element 460, illustrated in FIG. 36 later, can be disposed between adjacent memory cells for preventing inter-cell interference. In the present embodiments, the selector transistor device is a gate all around (GAA) transistor. In some other embodiments, the selector transistor device can be a FinFet.

FIGS. 24-26B is a cross-sectional view of an integrated circuit in accordance with some embodiments of the present disclosure. The same or similar configurations, materials, processes and/or operation as described with FIGS. 2-23 may be employed in the following embodiments, and the detailed explanation may be omitted. One difference between the present embodiments and the embodiments of FIGS. 2-23 is that: the backside MLI structure BMLI may further include a source line (e.g., backside metal lines 444S) connected to the source epitaxial feature 190s.

Figure 24:
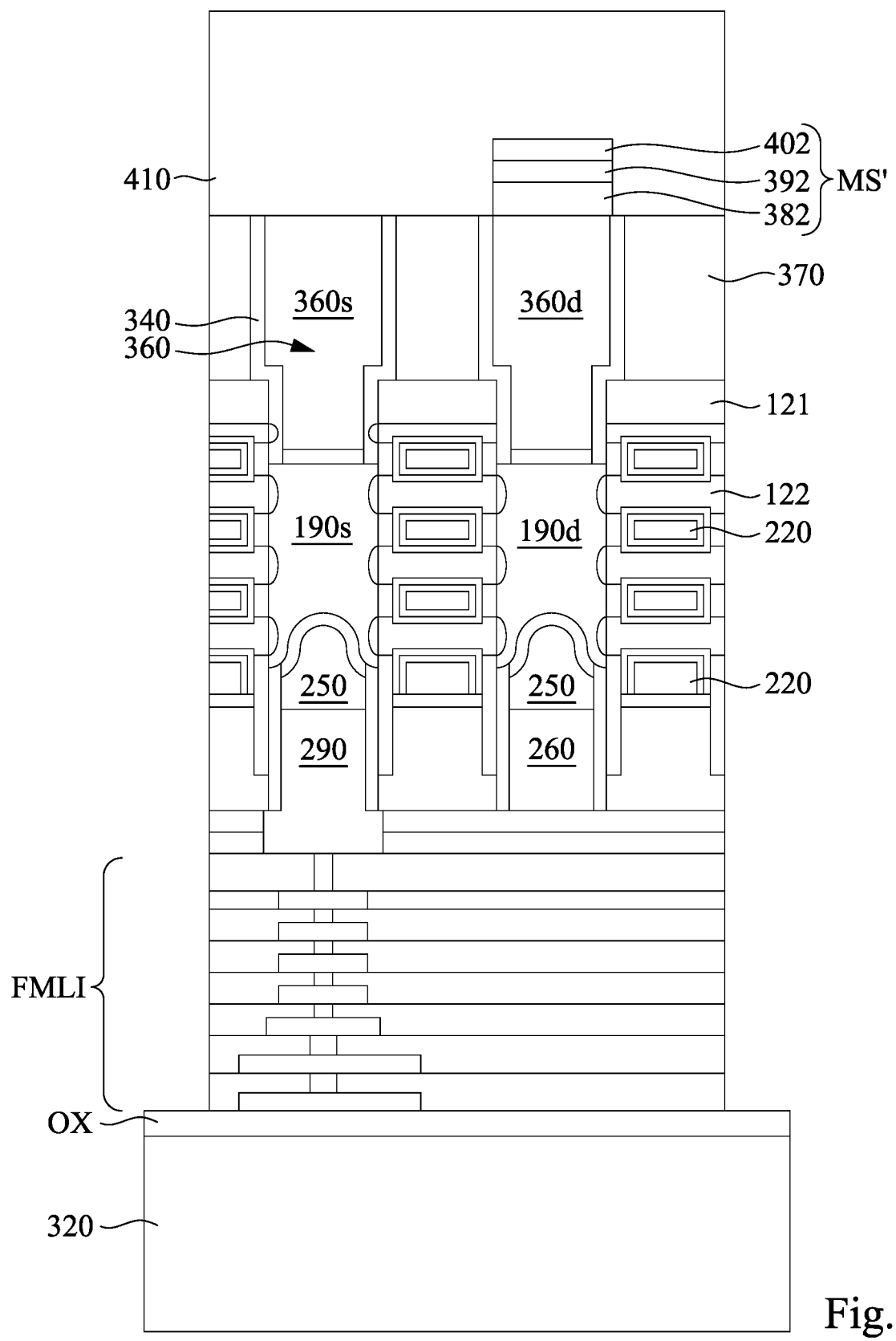
FIGS. 24-26B illustrate various stages of manufacturing an integrated circuit device according to some embodiments of the present disclosure.

Referring to FIG. 24, backside contact features 360 are respectively formed on back sides of the drain epitaxial feature 190d and the source epitaxial feature 190s. Formation processes of the backside contact features 360 are similar to those illustrated with respect to FIGS. 15-18, and therefore not repeated herein. For better illustration, in the present embodiments, one of the backside contact features 360 over and connected with the source epitaxial feature 190s may be referred as a backside contact feature 360s, and another of the backside contact features 360 over and connected with the drain epitaxial feature 190d may be referred as a backside contact feature 360d. After the formation of the backside contact features 360s and 360d, the substrate 110 is replaced with the backside ILD layer 370, as the process illustrated with respect to FIG. 19.

Subsequently, the memory structure MS' is formed on the backside contact features 360d, and not on the backside contact features 360s. Formation process of the memory structure MS' are similar to those illustrated with respect to FIGS. 20-21, and therefore not repeated herein.

An ILD layer 410 is deposited over the memory structure MS' and the backside ILD layer 370 using suitable deposition techniques. The ILD layer 410 may be silicon oxide, extreme or extra low-k silicon oxide such as a porous silicon oxide layer. For example, the ILD layer 410 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

Figure 25:
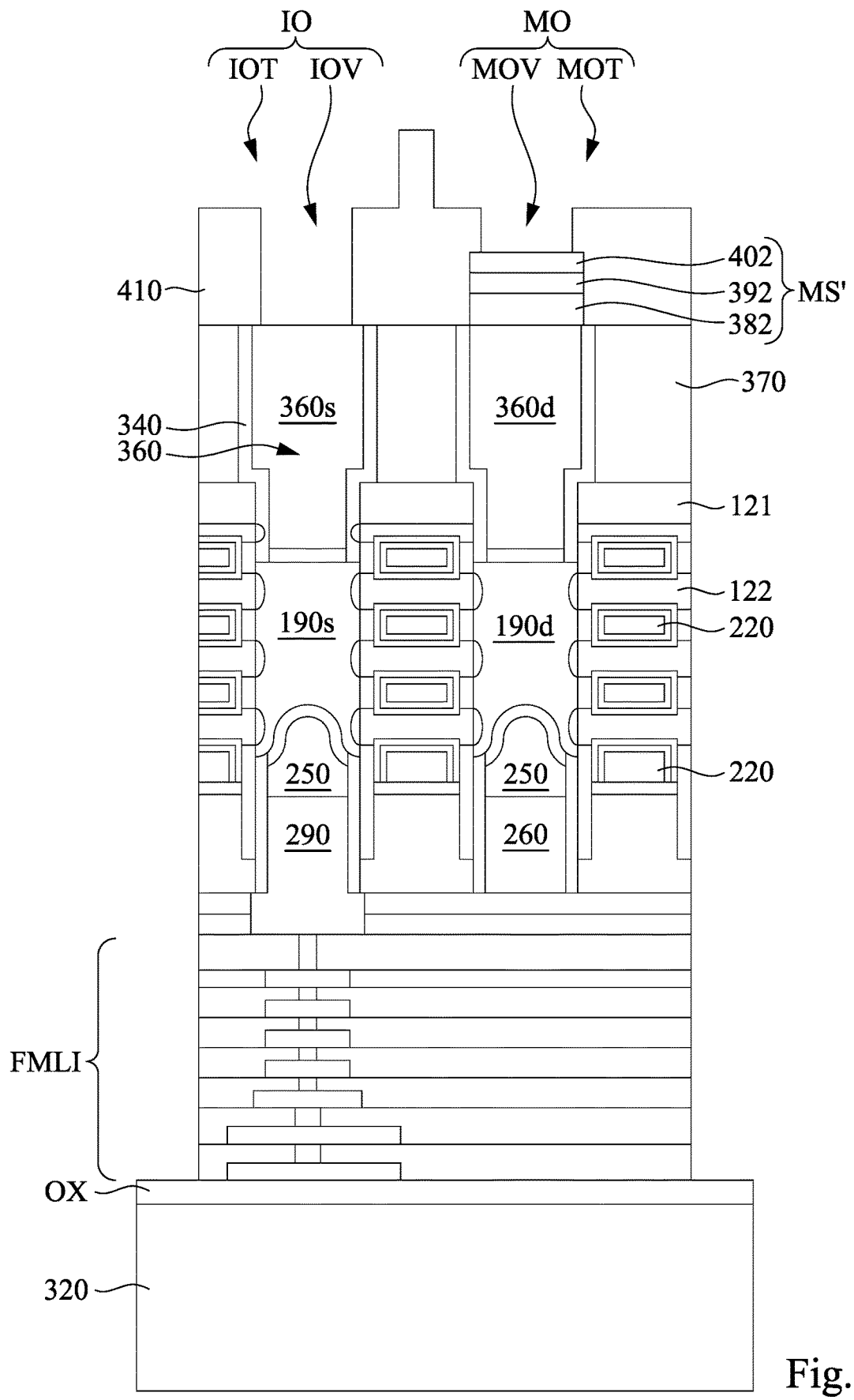

Referring to FIG. 25, after the formation of the ILD layer 410, a top electrode opening MO and an interconnect opening IO is formed in the ILD layer 410. The top electrode opening MO may expose a top surface of the top electrode 402 of the memory structure MS', and the interconnect opening IO may expose a top surface of the backside contact feature 360s. In some embodiments, formation of the top electrode opening MO and the interconnect opening IO may include a via etching process and a trench etching process. The via etching process may be performed to etch via openings MOV and IOV in the ILD layer 410. The trench etching process may be performed to etch trench openings MOT and IOT in the ILD layer 410. The via etching process and the trench etching process may include suitable anisotropic etching processes. In some embodiments where the ILD layer 410 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. Sometimes, the trench etching process may deepen the via openings MOV and IOT after the via etching process. Alternative, in some other embodiments, the trench etching process may be performed prior to the via etching process.

Through these etching processes, the interconnect opening IO may be a combination of the trench opening IOT and the via opening IOT. The top electrode opening MO may be a via opening MOV, a trench opening MOT, or the combination thereof. In some other embodiments, the vias opening MOV may be omitted, and the trench etching process may be performed to etch the trenches MOT to expose the top electrode 162 without the via etching process.

Figure 26A:
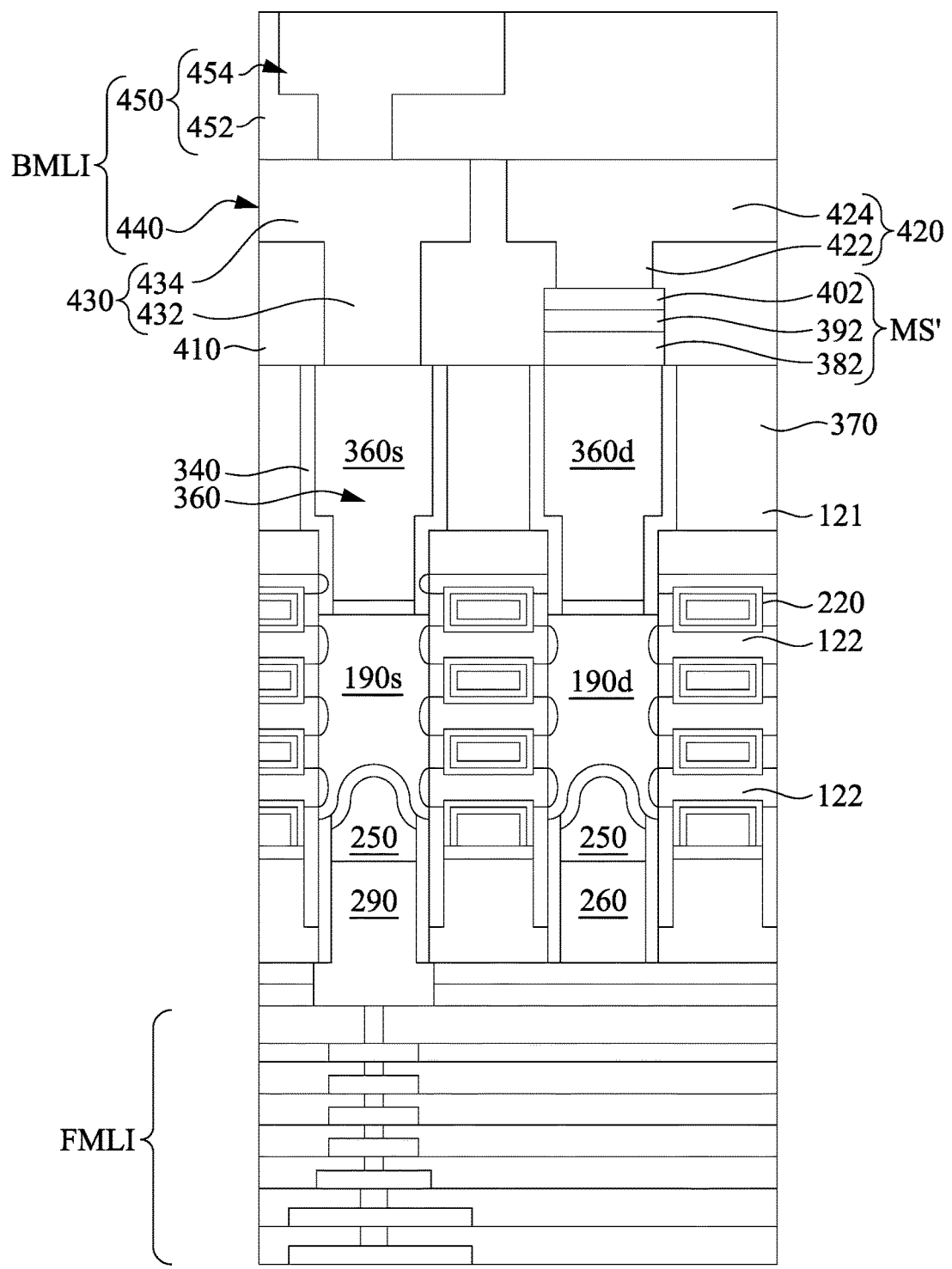

Referring to FIG. 26A, conductive features 420 and 430 are respectively formed in the top electrode opening MO and the interconnect opening IO, and respectively in contact with the top electrode 402 and the backside contact feature 360s.

Formation of the conductive features 420 and 430 may include filling the top electrode opening MO and the interconnect opening IO with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode opening MO and the interconnect opening IO, thereby forming the conductive features 420 and 430.

In the present embodiments, the conductive feature 430 includes a conductive line 434 in the trench opening IOT and a conductive via 432 in the via opening IOV. In the present embodiments, the conductive feature 420 includes a conductive line 424 in the trench opening MOT and a conductive via 422 in the via opening MOV. In some embodiments, the conductive via 422 may be omitted, and the conductive line 424 is in direct contact with the top electrode 402.

In some embodiments, the ILD layer 410, the memory stacks MS', the conductive features 420 and 430 are in combination referred to as a backside interconnect layer 440, which forms a bottommost interconnect layer of a backside MLI structure BMLI. The backside MLI structure BMLI may further include one or more backside interconnect layers 440 formed over the backside interconnect layer 440. After the formation of the backside MLI structure BMLI, the carrier substrate 320 may be removed from the front-side MLI structure FMLI.

Figure 26B:
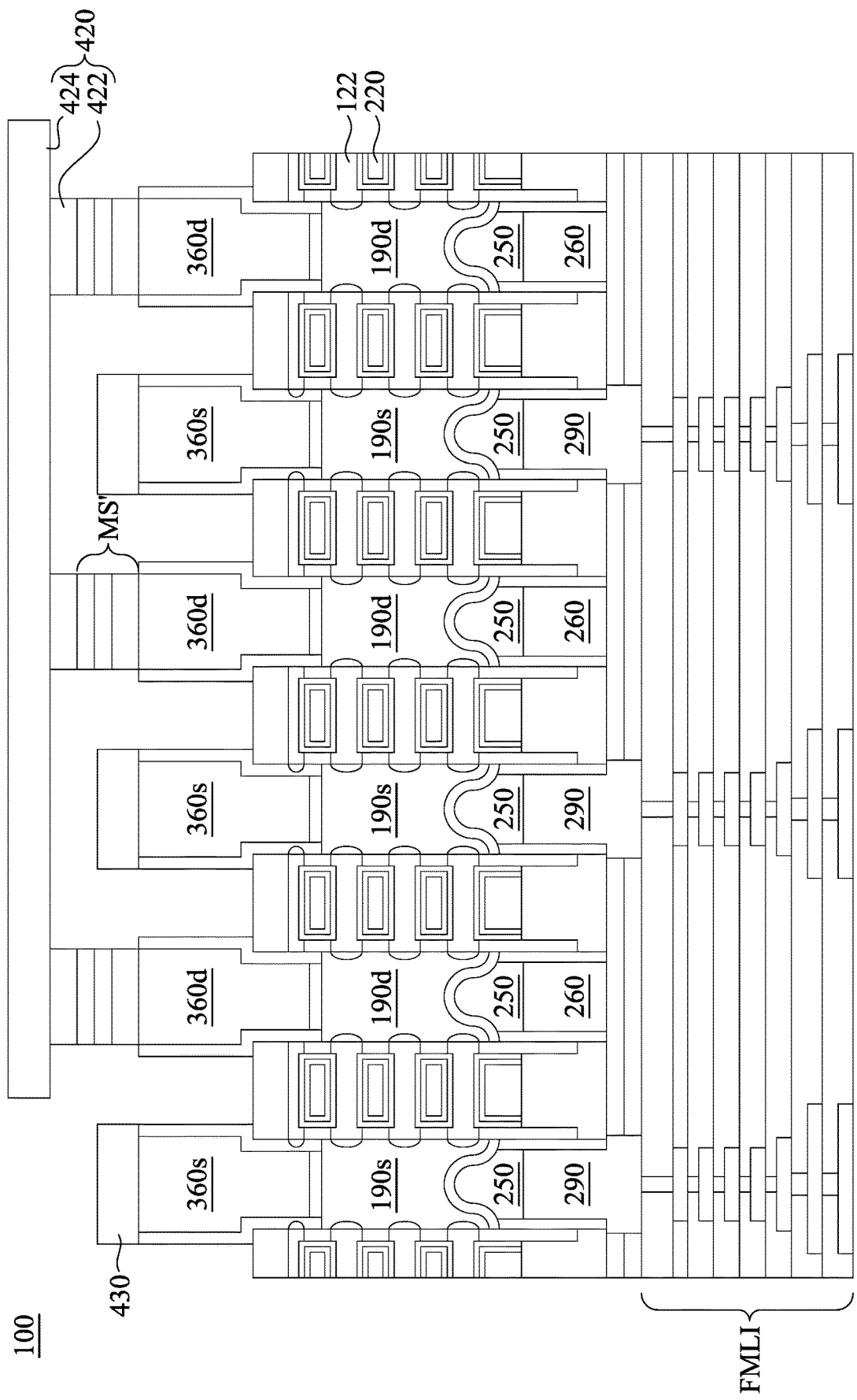

FIG. 26B illustrates a schematic cross-sectional view of the integrated circuit device 100 of FIG. 26A, in which plural memory stacks MS' are shown. Reference is made to FIGS. 26A and 26B. In some embodiments, the conductive line 424 in the backside interconnect layer 440 is a bit line electrically connected with one or more memory structures MS', so as to make electrical connection with one or more memory structures MS'. In some embodiments, the conductive line 434 of the conductive feature 430 in the backside interconnect layer 440 is a source line that is electrically connected with one or more backside contact features 360s. For example, the source line (e.g., the conductive line 434) is over a back side of the backside contact features 360s facing away from the source epitaxial feature 190s. Because the bit line and the source line are formed in the backside MLI structure BMLI, more routing space can be provided for the integrated circuit device 100.

In some embodiments, the conductive feature 420 including the conductive line 424 extends across and is in contact with memory structures MS', and the conductive feature 430 including the conductive line 434 is electrically connected with through the backside contact features 360s through backside interconnect layers 440. In some other embodiments, the conductive feature 430 including the conductive line 434 extends across and is in contact with backside contact features 360s, and the conductive feature 420 including the conductive line 424 is electrically connected with through the memory structures MS' through backside interconnect layers 440. Other details of the present embodiments are similar to those illustrated in the embodiments of FIGS. 2-26B, and therefore not repeated herein.

Figure 27A:
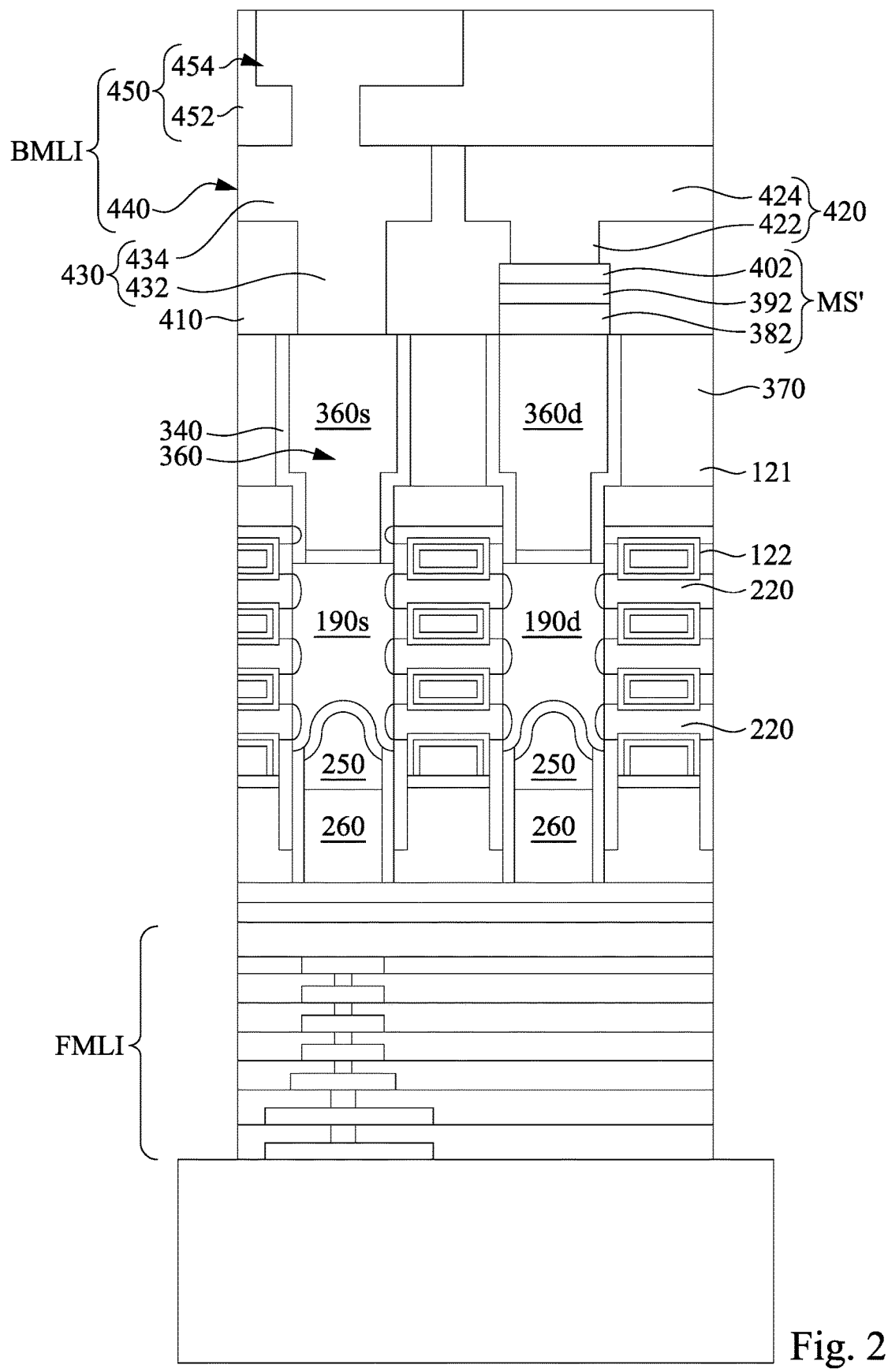
FIGS. 27A-27B illustrate schematic cross-sectional views of an integrated circuit device in accordance with some embodiments of the present disclosure.
Figure 27B:
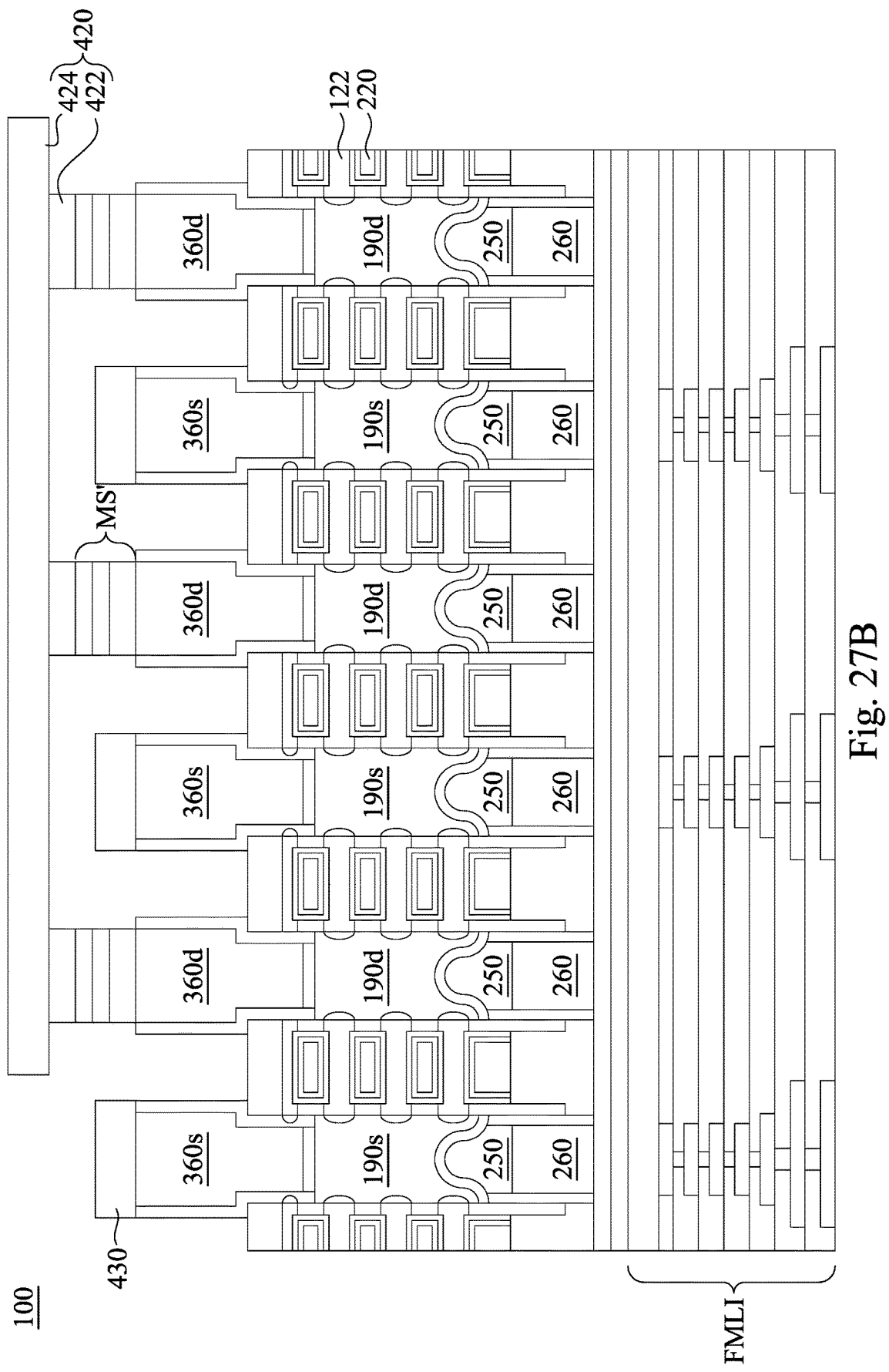

FIGS. 27A-27B illustrate schematic cross-sectional views of an integrated circuit device 100 in accordance with some embodiments of the present disclosure. FIG. 27A illustrates a schematic cross-sectional view of the integrated circuit device 100, in which one memory stack MS' is shown. FIG. 27B illustrates a schematic cross-sectional view of the integrated circuit device 100 of FIG. 27A, in which plural memory stacks MS' are shown. The same or similar configurations, materials, processes and/or operation as described with FIGS. 24-26B may be employed in the following embodiments, and the detailed explanation may be omitted. One difference between the present embodiments and the embodiments of FIGS. 24-26B is that: the conductive via 290 is not formed on the contacts 250. In the present embodiments, the source epitaxial feature 190s may be connected to a source line (e.g., one of front-side metal lines 314M) in the backside MLI structure BMLI, such that the front-side MLI structure FMLI may be free of a source line since, and therefore the conductive via 290 that make electrical connection between the source epitaxial feature 190s and the front-side MLI structure may be omitted. Other details of the present embodiments are similar to those illustrated in the embodiments of FIGS. 24-26B, and therefore not repeated herein.

Figure 28:
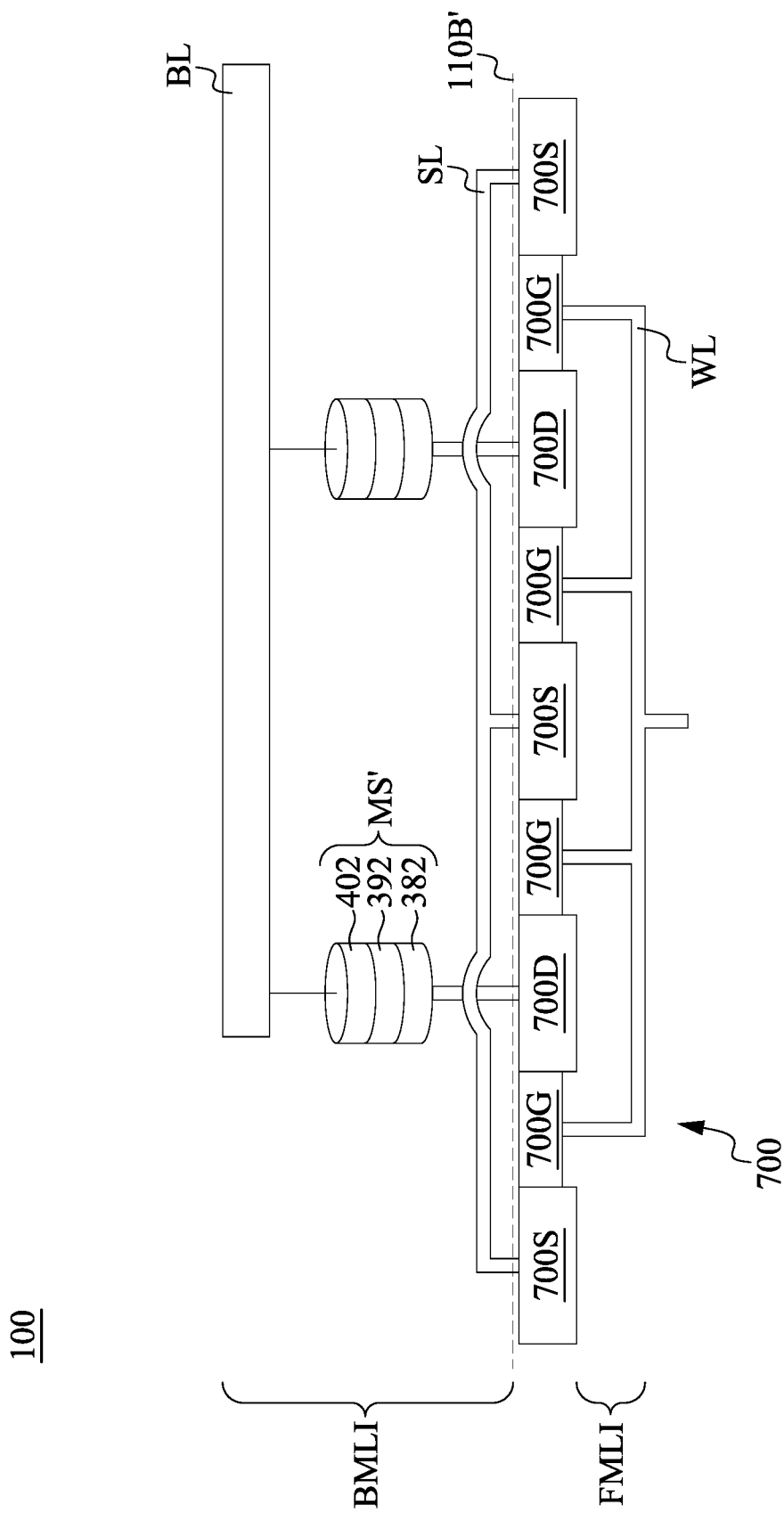
FIG. 28 is a simplified schematic cross-sectional view of an integrated circuit device in accordance with some embodiments of the present disclosure.

FIG. 28 is a simplified schematic cross-sectional view of an integrated circuit device 100 in accordance with some embodiments of the present disclosure. As illustrated previously, the integrated circuit device 100 includes plural selector transistor devices 700, the front-side MLI structure FMLI, and the backside MLI structure BMLI. In the present embodiments, the backside MLI structure BMLI includes plural memory structure MS', bit lines BL, and source lines SL. In some embodiments, each of the selector transistor devices 700 include a source feature 700S, a drain feature 700D, and a gate feature 700G. In some embodiments, the memory structures MS' are respectively electrically connected to the drain features 700D. In some embodiments, one of the bit lines BL is connected to the plural memory structures MS'. In some embodiments, the source lines SL are electrically connected to the back sides of the source features 700S. In the present embodiments, the frontside MLI structure FMLI includes word lines WL, and the word lines WL are connected to the plural gate features 700G.

In some embodiments, the selector transistor devices 700 may be aforementioned multi-gate devices. In other words, each of the source features 700S and the drain features 700D may include the doped epitaxial feature 190 and the epitaxial layer 180 in FIG. 23, and the gate features 700G may include the gate structure 220 in FIG. 23. The dashed line 110B' may indicate a position of back sides of the source/drain features 700S/700D, e.g., the back sides of a combination of the doped epitaxial feature 190 and the epitaxial layer 180 in FIG. 23. The dashed line 110B' may be referred to as a wafer backside or a back side of the substrate in the context. Other details of the present embodiments are similar to those illustrated previously, and therefore not repeated herein.

Figure 29:
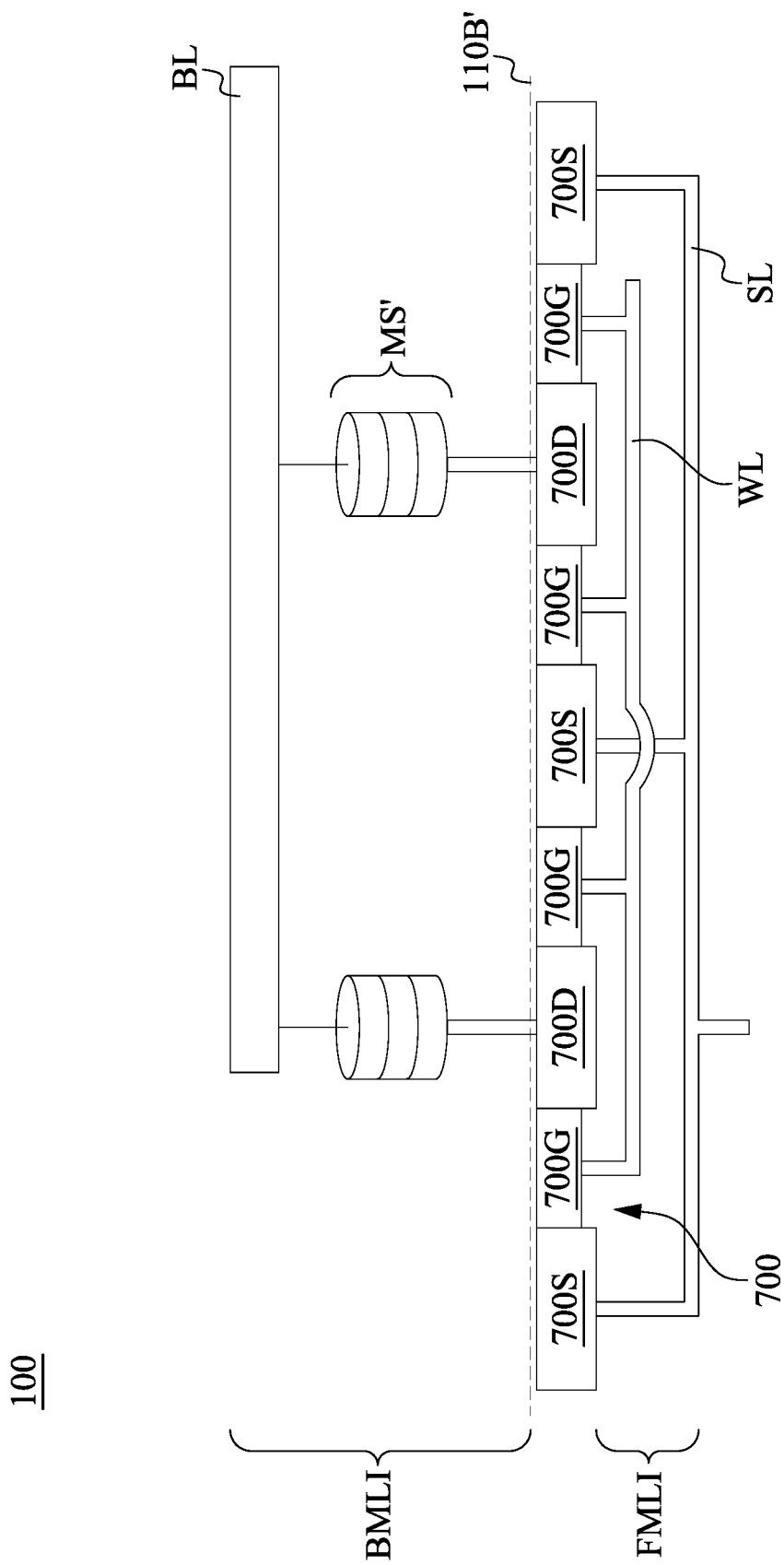
FIG. 29 is a simplified schematic cross-sectional view of an integrated circuit device in accordance with some embodiments of the present disclosure.

FIG. 29 is a simplified schematic cross-sectional view of an integrated circuit device in accordance with some embodiments of the present disclosure. The same or similar configurations, materials, processes and/or operation as described with FIG. 28 may be employed in the following embodiments, and the detailed explanation may be omitted. One difference between the present embodiments and the embodiments of FIG. 28 is that: the frontside MLI structure FMLI includes source lines SL, and the source lines SL are electrically connected to front sides of the source features 700S of the selector transistor devices 700. In the present embodiments, the backside MLI structure BMLI may be free of a source line SL. Other details of the present embodiments are similar to those illustrated previously, and therefore not repeated herein.

Figure 30:
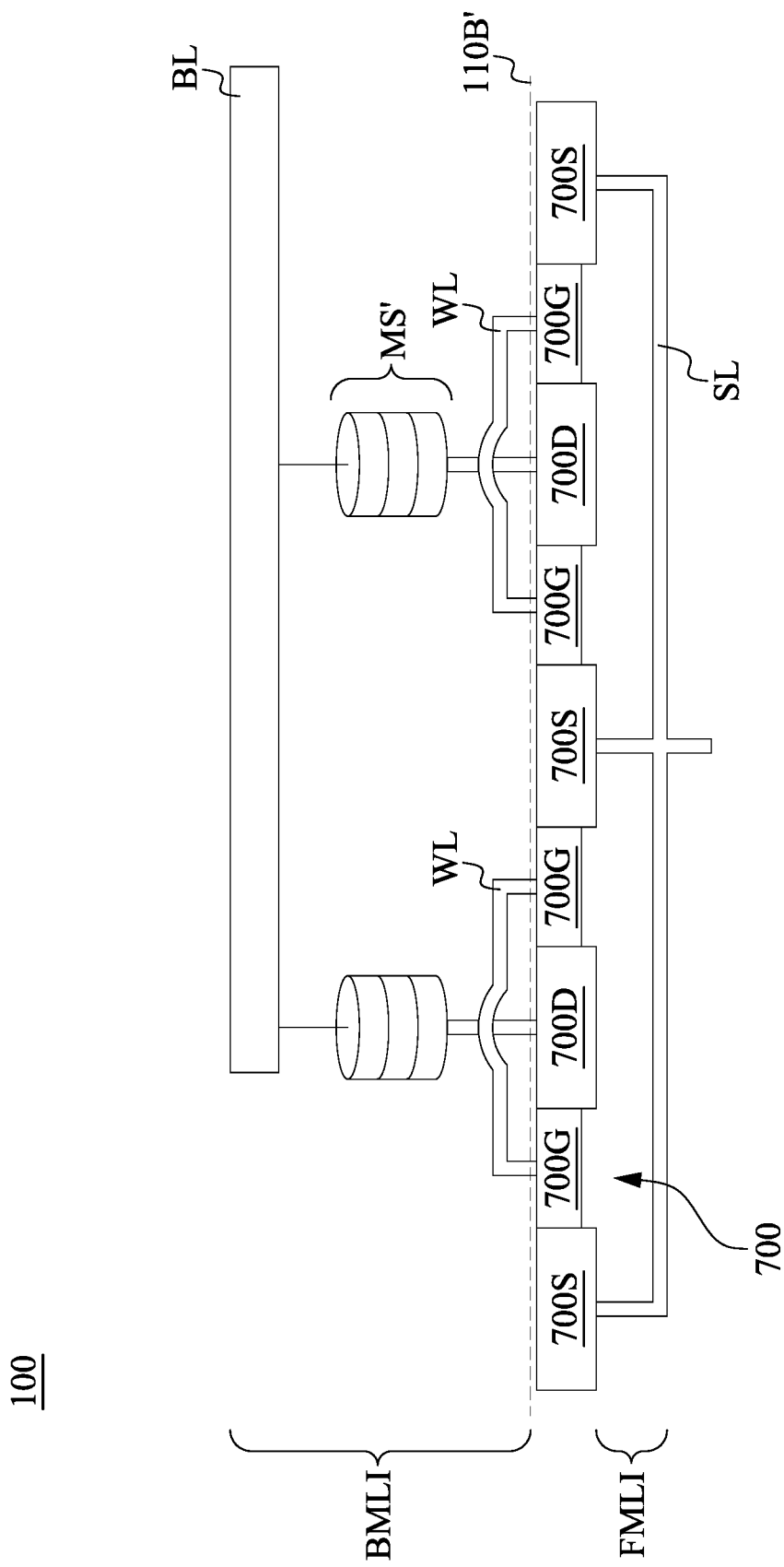
FIG. 30 is a simplified schematic cross-sectional view of an integrated circuit device in accordance with some embodiments of the present disclosure.

FIG. 30 is a simplified schematic cross-sectional view of an integrated circuit device in accordance with some embodiments of the present disclosure. The same or similar configurations, materials, processes and/or operation as described with FIG. 29 may be employed in the following embodiments, and the detailed explanation may be omitted. One difference between the present embodiments and the embodiments of FIG. 28 is that: the backside MLI structure BMLI includes one or more word lines WL, and one of the word lines WL is connected to plural gate features 700G of the selector transistor devices 700. In the present embodiments, the frontside MLI structure FMLI may be free of a word line WL. Other details of the present embodiments are similar to those illustrated previously, and therefore not repeated herein.

Figure 31:
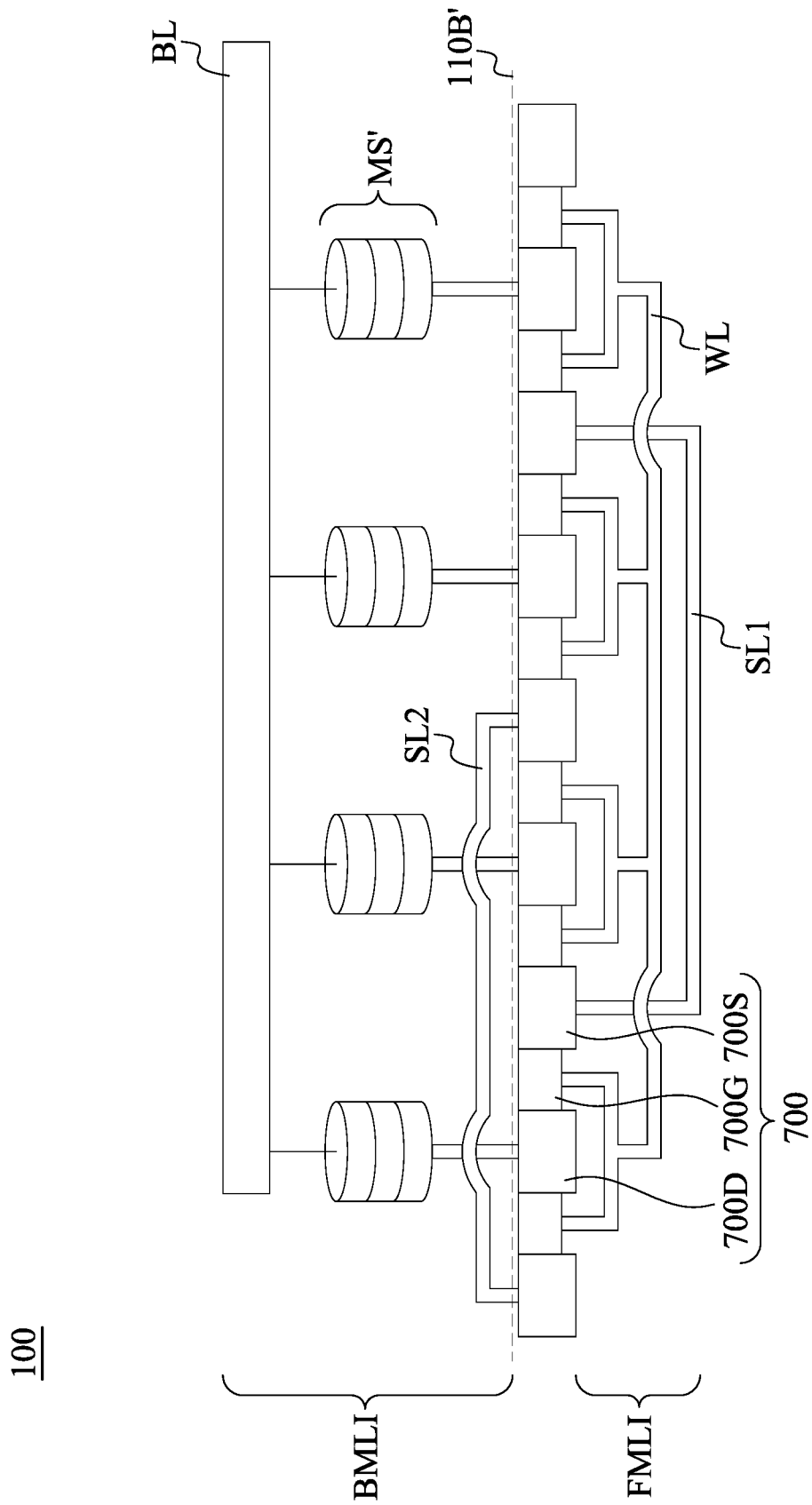
FIG. 31 is a simplified schematic cross-sectional view of an integrated circuit device in accordance with some embodiments of the present disclosure.

FIG. 31 is a simplified schematic cross-sectional view of an integrated circuit device in accordance with some embodiments of the present disclosure. The same or similar configurations, materials, processes and/or operation as described with FIG. 28 may be employed in the following embodiments, and the detailed explanation may be omitted. One difference between the present embodiments and the embodiments of FIG. 28 is that: the frontside MLI structure FMLI includes one or more source lines SL1, and the backside MLI structure BMLI also includes one or more source lines SL2. In some embodiments, even-numbered source features 700S may be electrically connected to the source lines SL1 of the frontside MLI structure FMLI, and the odd-numbered source features 700S may be electrically connected to the source lines SL2 of the backside MLI structure BMLI. Through the design, the source lines (e.g., source lines SL1 and SL2) can get wider to lower resistance, the array can be denser, and the coupling between adjacent source lines can be reduced. Other details of the present embodiments are similar to those illustrated previously, and therefore not repeated herein.

Figure 32:
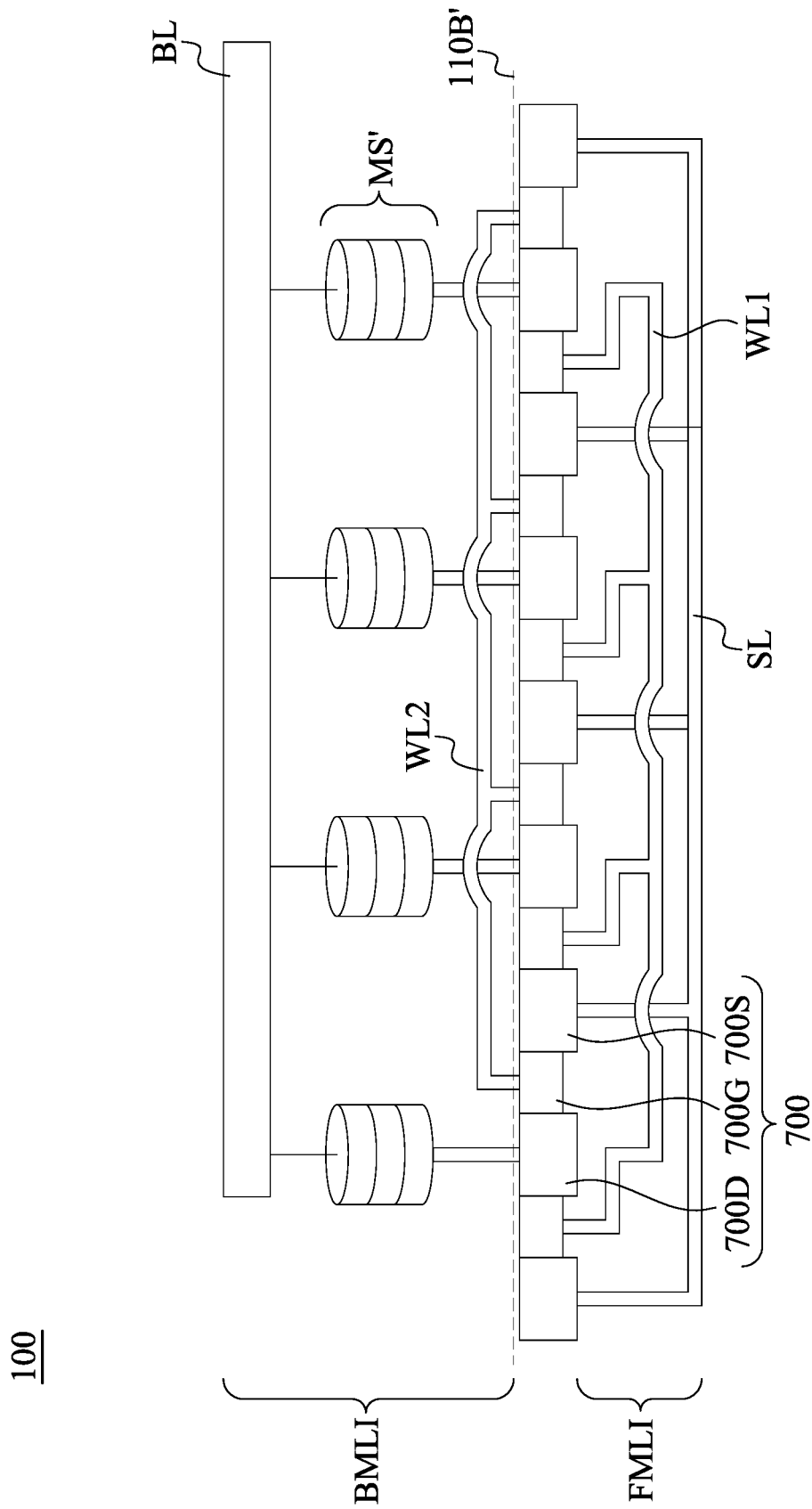
FIG. 32 is a simplified schematic cross-sectional view of an integrated circuit device in accordance with some embodiments of the present disclosure.

FIG. 32 is a simplified schematic cross-sectional view of an integrated circuit device in accordance with some embodiments of the present disclosure. The same or similar configurations, materials, processes and/or operation as described with FIG. 28 may be employed in the following embodiments, and the detailed explanation may be omitted. One difference between the present embodiments and the embodiments of FIG. 28 is that: in the present embodiments, the frontside MLI structure FMLI includes one or more word lines WL1, and the backside MLI structure BMLI also includes one or more word lines WL2. In some embodiments, odd-numbered gate features 700G may be electrically connected to the word lines WL1 of the frontside MLI structure FMLI, and the even-numbered gate features 700G may be electrically connected to the word lines WL2 of the backside MLI structure BMLI. Through the design, the word lines (e.g., word lines WL1 and WL2) can get wider to lower resistance, the array can be denser, the coupling between adjacent word lines can be reduced, and the word line rise time is increased. Other details of the present embodiments are similar to those illustrated previously, and therefore not repeated herein.

Figure 33:
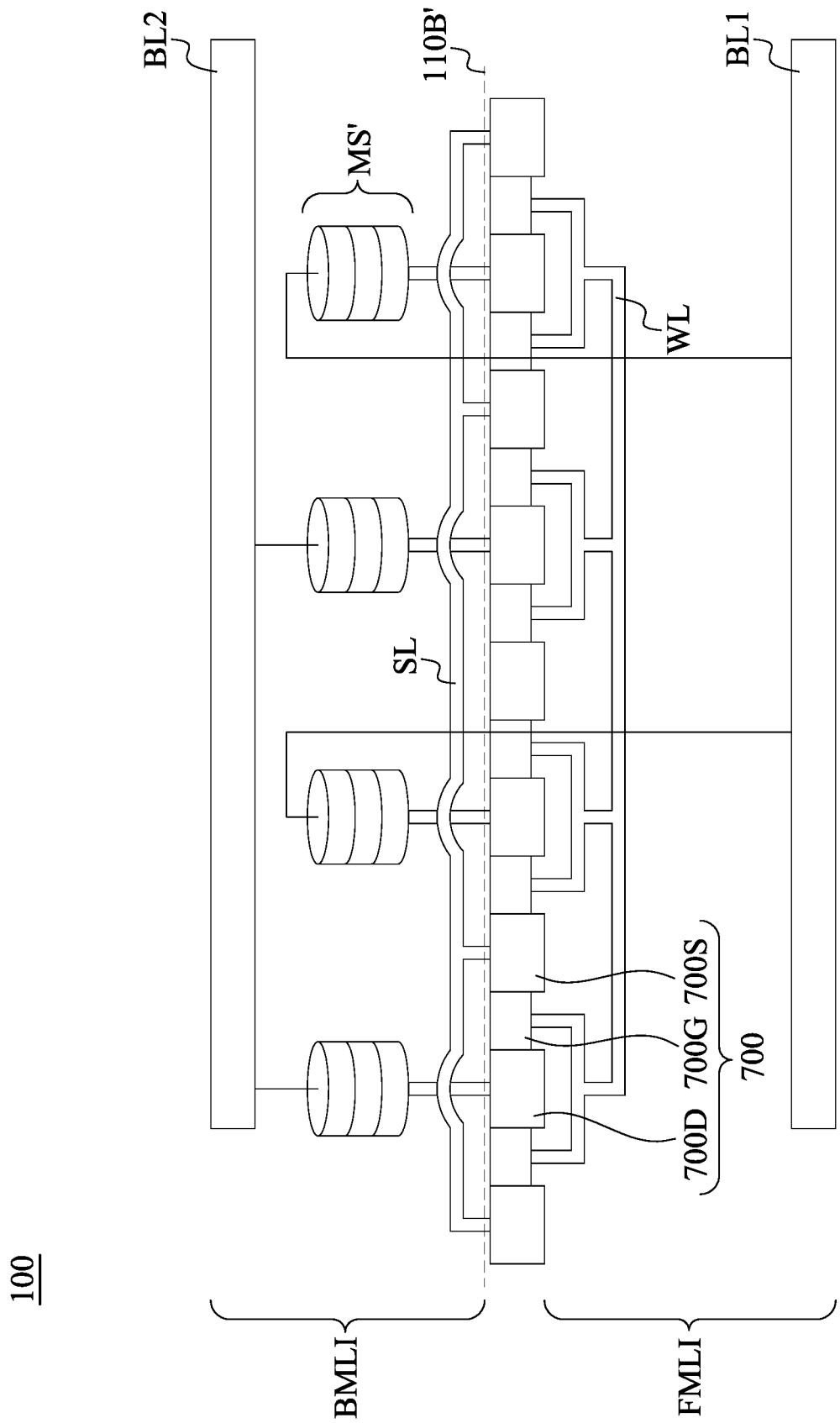
FIG. 33 is a simplified schematic cross-sectional view of an integrated circuit device in accordance with some embodiments of the present disclosure.

FIG. 33 is a simplified schematic cross-sectional view of an integrated circuit device in accordance with some embodiments of the present disclosure. The same or similar configurations, materials, processes and/or operation as described with FIG. 28 may be employed in the following embodiments, and the detailed explanation may be omitted. One difference between the present embodiments and the embodiments of FIG. 28 is that: the frontside MLI structure FMLI includes one or more bit lines BL1, and the backside MLI structure BMLI also includes one or more word lines BL2. In some embodiments, even-numbered memory structure MS' may be electrically connected to the bit lines BL1 of the frontside MLI structure FMLI, and the odd-numbered memory structure MS' may be electrically connected to the bit lines BL2 of the backside MLI structure BMLI. Through the design, the bit lines (e.g., bit lines BL1 and BL2) can get wider to lower resistance, the array can be denser, and the coupling between adjacent bit lines can be reduced. Other details of the present embodiments are similar to those illustrated previously, and therefore not repeated herein.

Figure 34A:
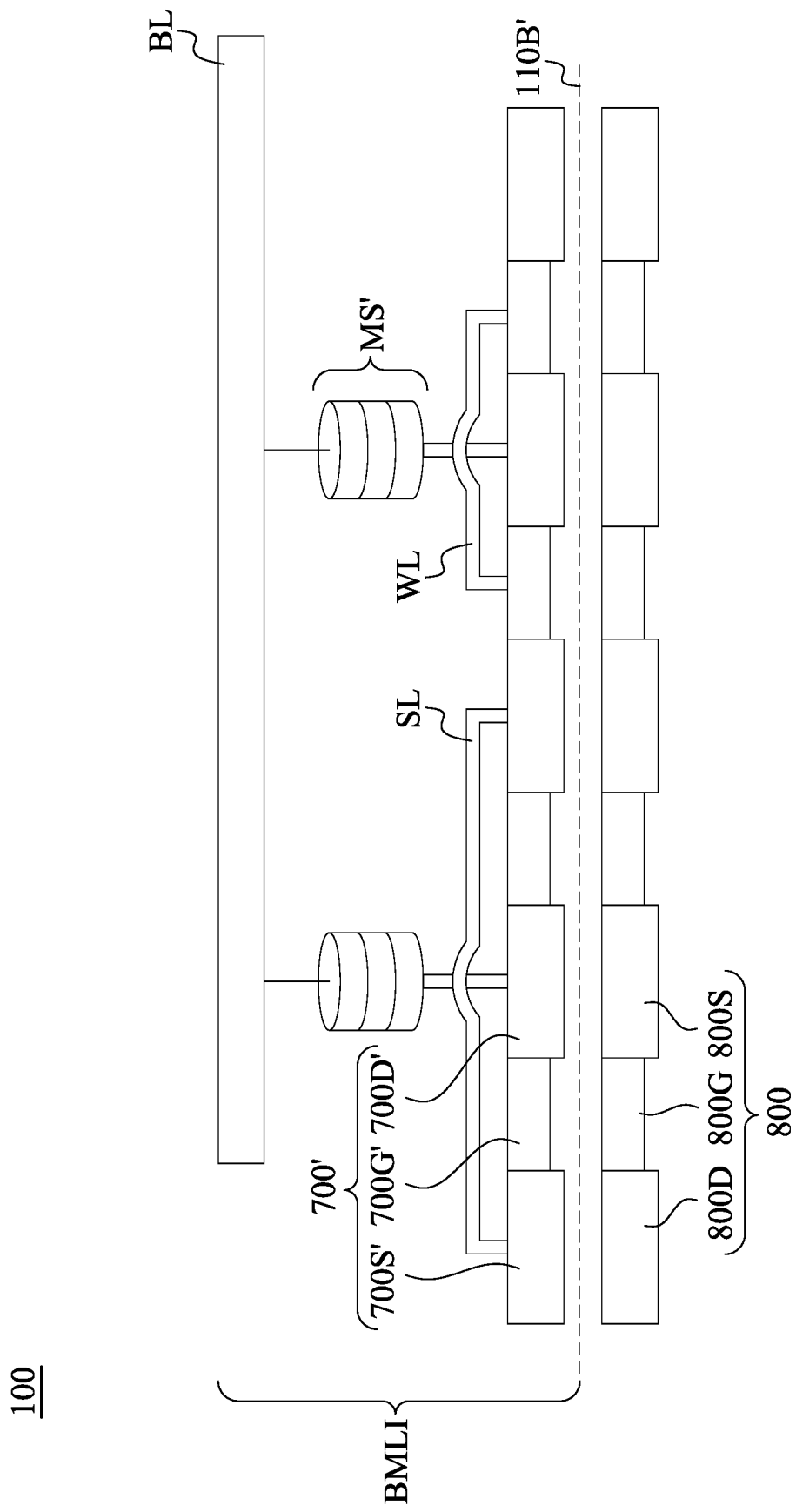
FIG. 34A is a simplified schematic cross-sectional view of an integrated circuit device in accordance with some embodiments of the present disclosure.
Figure 34B:
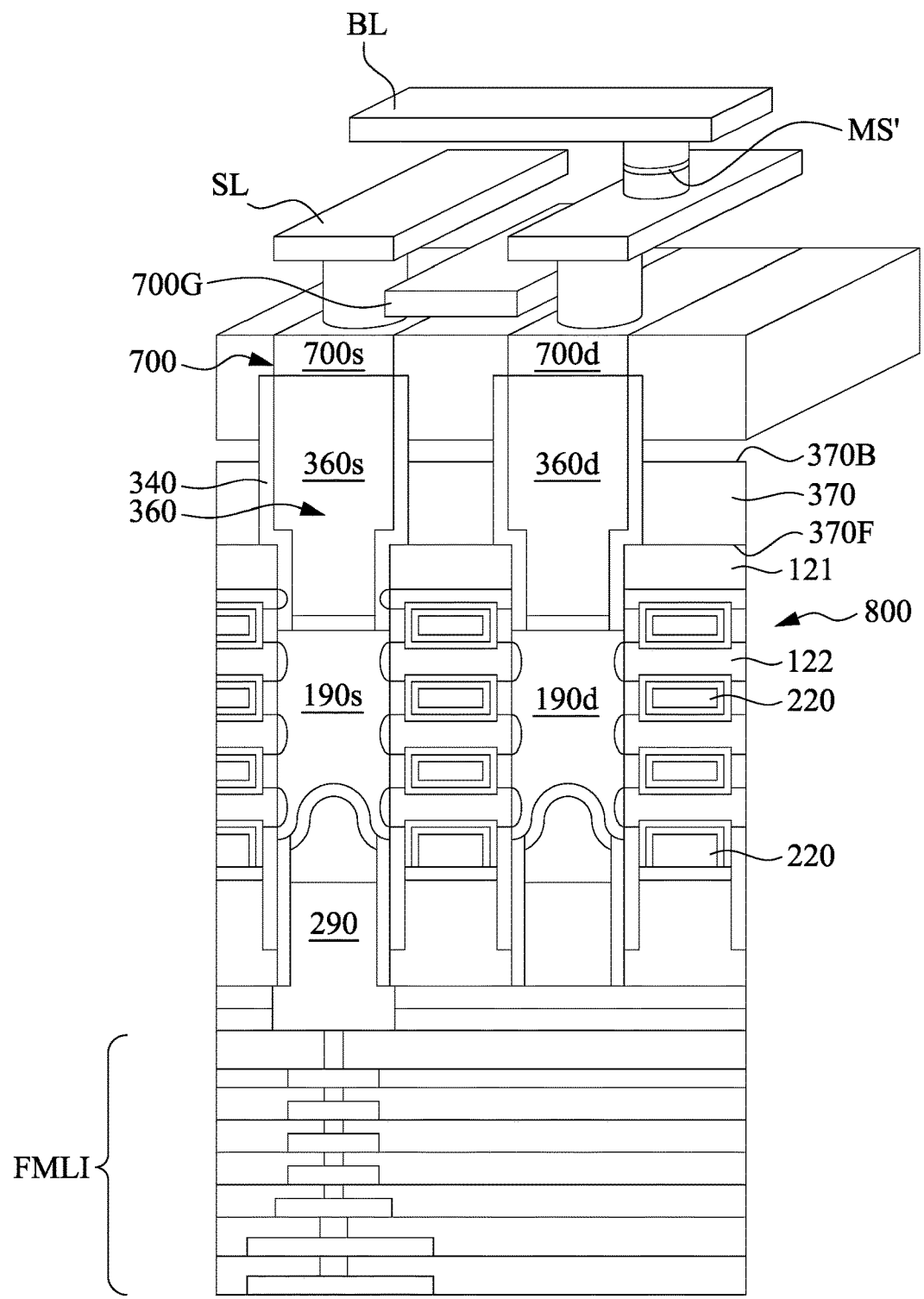
FIG. 34B is a simplified schematic view of the integrated circuit device of FIG. 34A.

FIG. 34A is a simplified schematic cross-sectional view of an integrated circuit device 100 in accordance with some embodiments of the present disclosure. FIG. 34B is a simplified schematic view of the integrated circuit device 100 of FIG. 34A. The same or similar configurations, materials, processes and/or operation as described with FIG. 28 may be employed in the following embodiments, and the detailed explanation may be omitted. One difference between the present embodiments and the embodiments of FIG. 28 is that: the integrated circuit device 100 further includes a backside selector transistor device 700' formed at wafer backside, the back side 370B of the dielectric layer 370, or back sides of the contact features 360. In some embodiments, each of the selector transistor devices 700' include a source feature 700S', a drain feature. 700D', and a gate feature 700G.' In some embodiments, the memory structures MS' are respectively electrically connected to the drain features 700D'. In some embodiments, one of the bit lines BL is connected to the plural memory structures MS'. In some embodiments, one of the source lines SL is electrically connected to back sides of the source features 700S'. In the present embodiments, the backside MLI structure BMLI includes one or more word lines WL, and one of the word lines WL is connected to the gate features 700G'.

In some embodiments, transistor devices 800 at frontside may act logic transistors, rather than selector transistors. That is, the frontside may be free of selector transistors. In some embodiments, each of the transistor devices 800 includes a source feature 800S, a drain feature 800D, and a gate feature 800G. The transistor devices 800 may include the same structure of transistor device TD and fabricated by the same processes as shown in FIGS. 2-23. For example, the logic transistor device 800 (e.g., the transistor device TD) is formed over the front side 110F of a semiconductor substrate 110 (referring to FIG. 10), the semiconductor substrate 110 is then replaced with a dielectric layer 370 (referring to FIG. 19) such that the dielectric layer 370 (referring to FIG. 19) is over a back side of the logic transistor device 800 (e.g., the transistor device TD), and then the memory structure is formed over a back side of the dielectric layer 370 facing away from the logic transistor device 800 (e.g., the transistor device TD). Other details of the present embodiments are similar to those illustrated previously, and therefore not repeated herein.

Figure 35A:
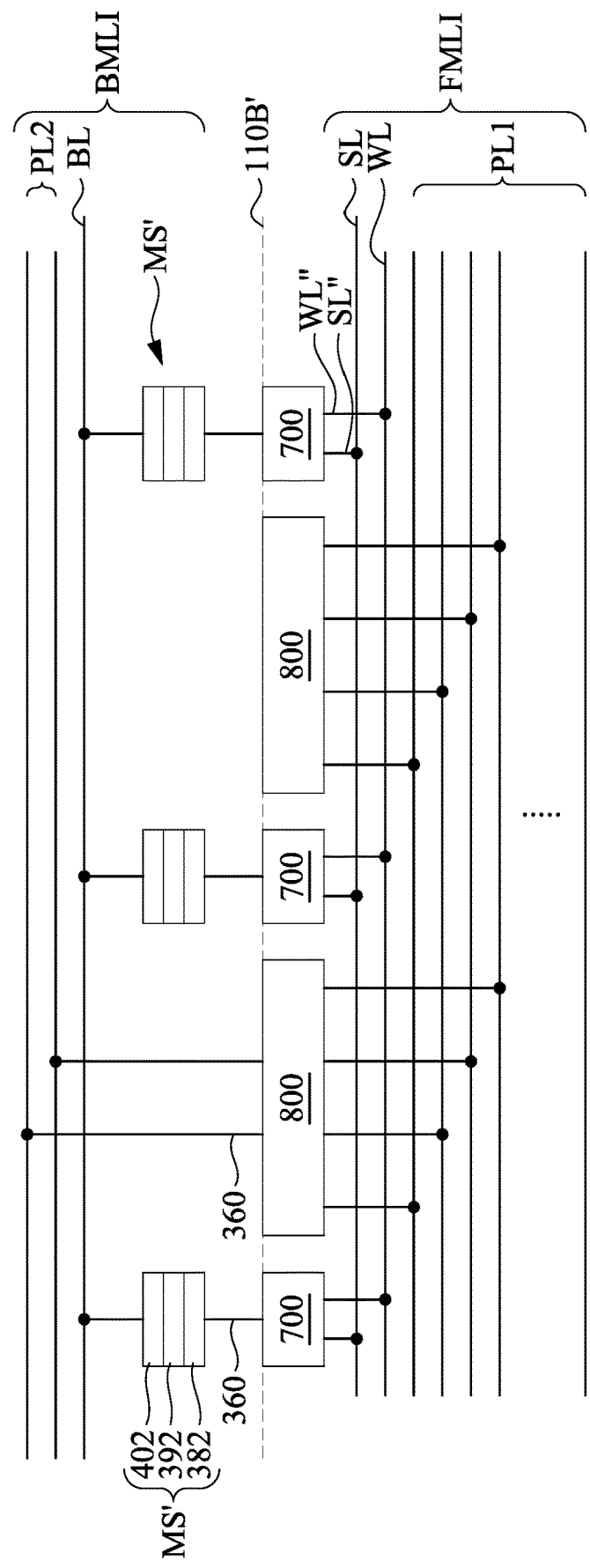
FIG. 35A is a simplified schematic cross-sectional diagram of an integrated circuit device in accordance with some embodiments of the present disclosure.
Figure 35B:
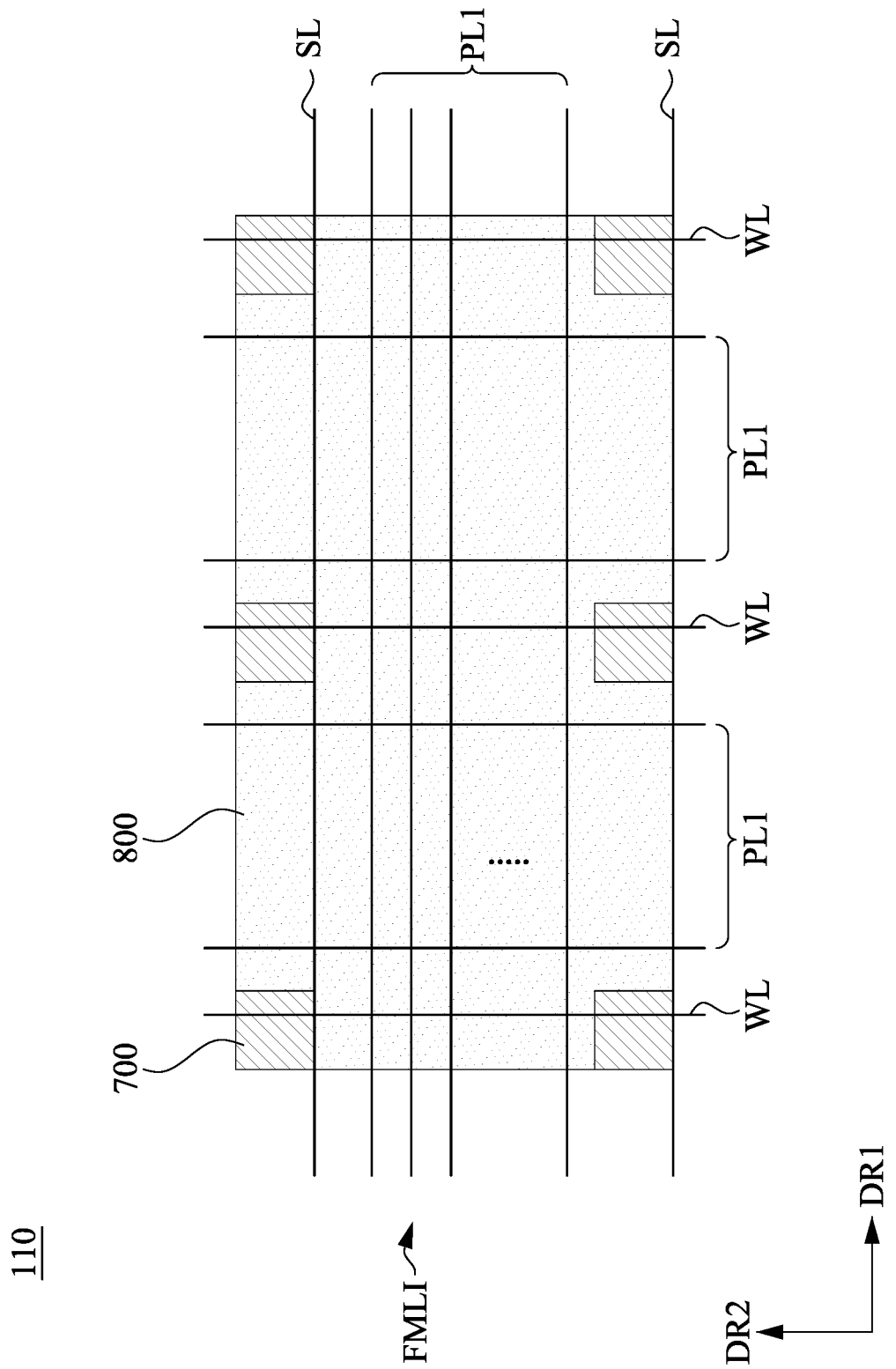
FIG. 35B is a schematic frontside wiring diagram of the integrated circuit device of FIG. 35A.
Figure 35C:
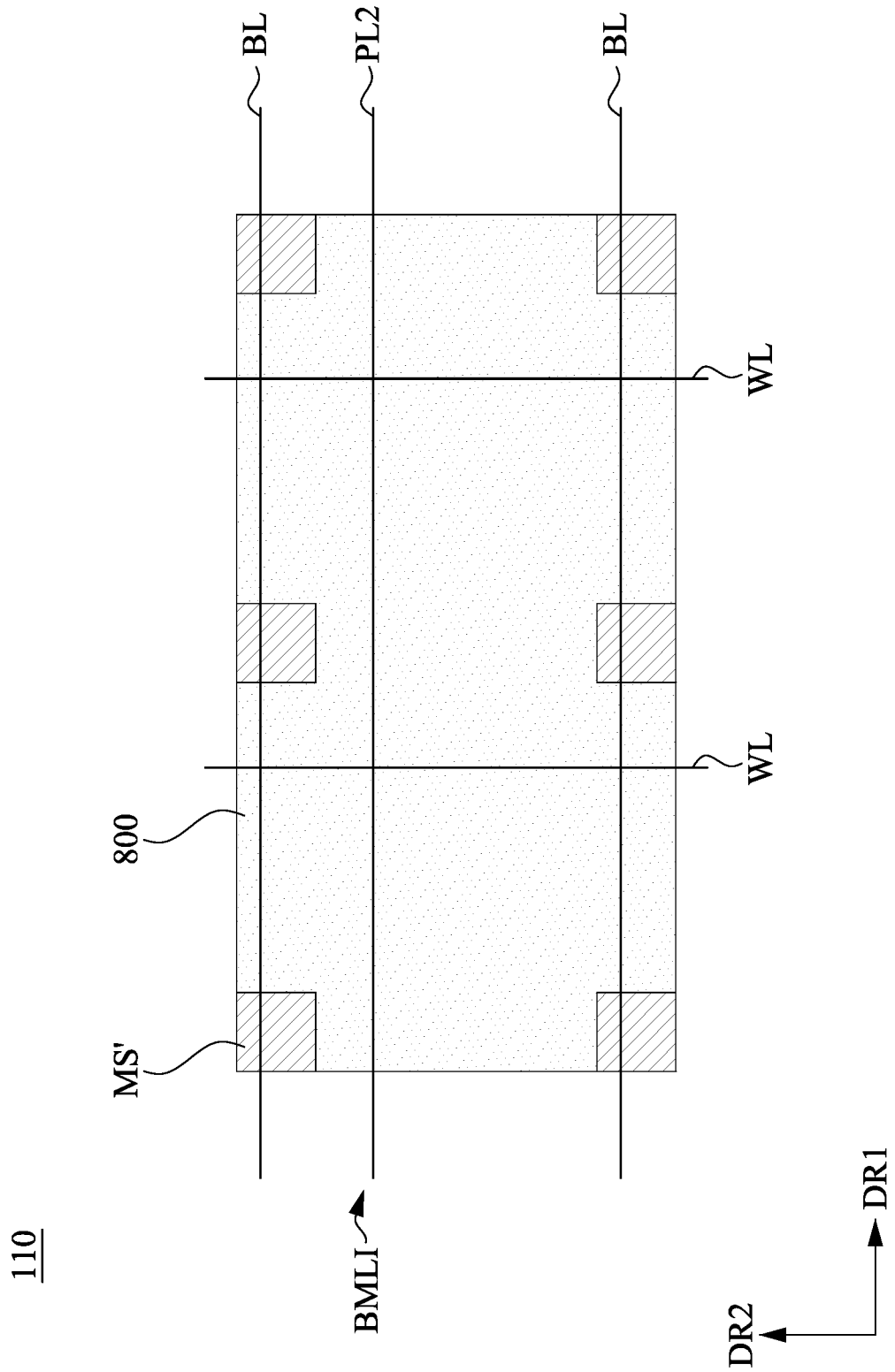
FIG. 35C is a schematic backside wiring diagram of the integrated circuit device of FIG. 35A.

FIG. 35A is a simplified schematic cross-sectional diagram of an integrated circuit device 100 in accordance with some embodiments of the present disclosure. FIG. 35B is a schematic frontside wiring diagram of the integrated circuit device 100 of FIG. 35A. FIG. 35C is a schematic backside wiring diagram of the integrated circuit device 100 of FIG. 35A. The same or similar configurations, materials, processes and/or operation as described with FIG. 28 may be employed in the following embodiments, and the detailed explanation may be omitted. One difference between the present embodiments and the embodiments of FIG. 28 is that: the integrated circuit device 100 further includes plural logic transistor devices 800 flexibly interposed between the selector transistor devices 700 at front side. For example, the logic transistor devices 800 located between a first one of a plurality of the selector transistor devices 700 and a second one of the selector transistor devices 700. That is, logic circuit is inserted inside memory array (e.g., mixing memory cells and logic circuit in the same array area). Empty area not used by logic can be filled up by active devices (selectors)

for memory cells. Through the configuration, regions for forming memory cells and logic device may be flexibly disposed with close proximity, thereby saving chip areas. The configuration may be used for routing dominant circuit. Since memory cells may take little or no front side routing metals, memory arrays are a free bonus for a very routing dense logic circuit. In some embodiments, the dashed line 110B' may indicate a position of a back side of the substrate or back sides of the source and drain epitaxial features 190s and 190d. The dashed line 110B' may be referred to as a wafer backside in the context.

The transistor devices 700 and 800 may include the same structure of transistor devices TD and fabricated by the same processes as shown in FIGS. 2-23. For example, the selector transistor device 700 and the logic transistor device 800 are over a front side 110F of the semiconductor substrate 110 (referring to FIG. 10). In some embodiments, contact features 360 are formed in the semiconductor substrate 110 (referring to FIG. 18) and respectively connected with back sides of the source/drain features (e.g., the source/drain epitaxial features 190) of the logic transistor device 800 and the selector transistor device 700 (e.g., the transistor device TD). Subsequently, the semiconductor substrate 110 may be replaced with a dielectric layer 370 (referring to FIG. 19), such that the dielectric layer 370 (referring to FIG. 19) is over back sides of the selector transistor device 700 and the logic transistor device 800 (e.g., the transistor device TD), and surrounds the contact features 360 that are electrically connected to the transistor device 700 and 800. The memory structure MS' can be then formed over a back side of the dielectric layer 370 facing away from the selector transistor device 700 and the logic transistor device 800 (e.g., the transistor devices TD), and the memory structure MS' is electrically connected to a source/drain feature (e.g., the source/drain epitaxial feature 190) of the selector transistor device 700 through a contact feature 360. The memory structure MS' may be placed at backside and vertically aligned with the selector transistor devices 700. Through the configuration, memory peripheral circuits (e.g., the area of the logic transistor device 800) can be mixed with memory array area (e.g., the area of the selector transistor device 700 and the memory structure MS'), with their own routing metals. Other details of the present embodiments are similar to those illustrated previously, and therefore not repeated herein.

Referring to FIGS. 35A and 35B, the frontside MLI structure FMLI may include source lines SL and word lines WL electrically connected to the selector transistor devices 700, and suitable power or signal lines PL1 electrically connected to the logic transistor devices 800. As viewed from the frontside, the source lines SL and a portion of the power or signal lines PL1 may extend along a first direction DR1, and the word lines WL and another portion of the power or signal lines PL1 may extend along a second direction DR2 intersecting the first direction DR1. The second direction DR2 may be orthogonal to the first direction DR1 in some embodiments.

Referring to FIGS. 35A and 35C, the backside MLI structure BMLI may include bit lines BL connected to the memory structures MS' and suitable power or signal lines PL2 electrically connected to the logic transistor devices 800. As viewed from the backside, the bit lines BL and a portion of the power or signal lines PL2 may extend along the first direction DR1, and another portion of the power or signal lines PL2 may extend along the second direction DR2. In present embodiments, the bit lines BL can be placed in the backside MLI structure BMLI at the backside 110B after the formation of the memory structure MS', and therefore the bit lines BL are connected to the top electrode 402 of the memory structure MS'. In present embodiments, the source lines SL or/and word lines WL are placed in the frontside MLI structure FMLI at front side. Other details of the present embodiments are similar to those illustrated previously, and therefore not repeated herein.

Figure 36:
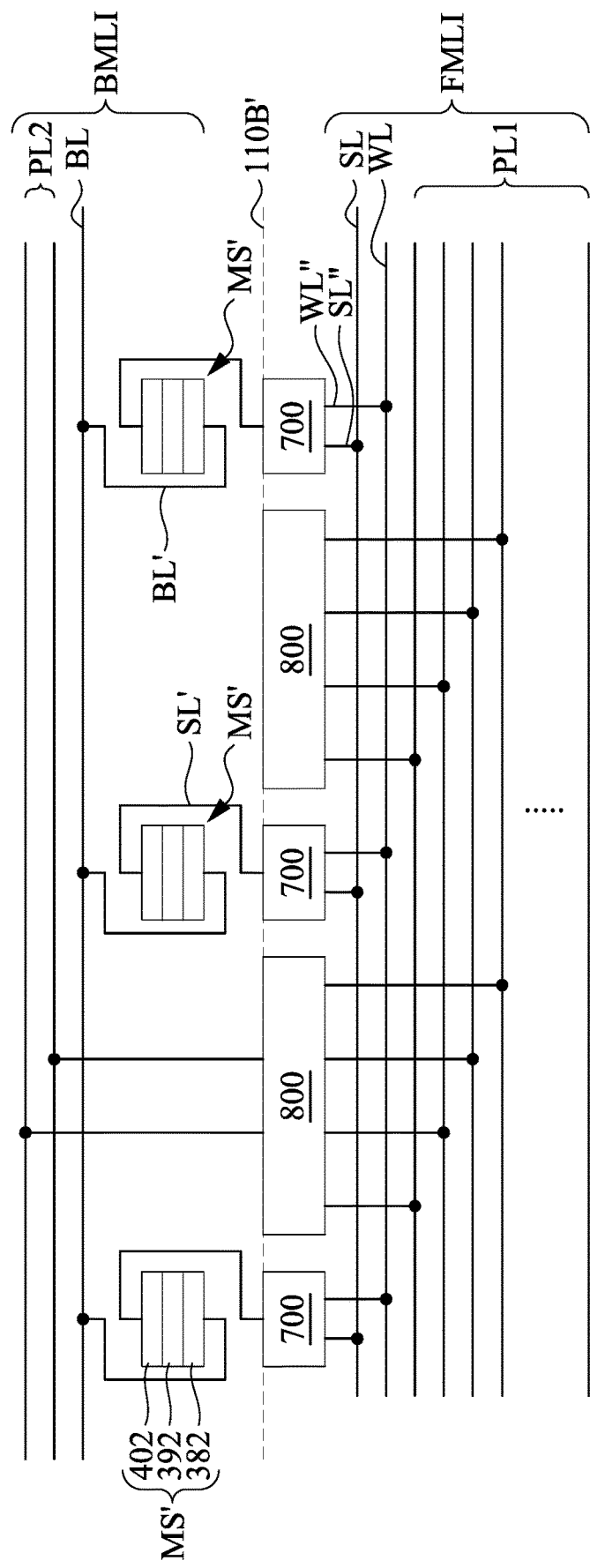
FIG. 36 is a simplified schematic cross-sectional diagram of an integrated circuit device in accordance with some embodiments of the present disclosure.

FIG. 36 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the bit lines BL can be placed in the backside MLI structure BMLI at the backside 110B' before the formation of the memory structure MS', and therefore the bit lines BL are connected to and in contact with the bottom electrode 382 of the memory structure MS'. The bit lines BL may include a metallization pattern BL' having metal lines and metal vias in one or plural interconnect layers, thereby being connected to the bottom electrode 382 of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the contact feature 360. The metallization pattern BL' may include conductive features (e.g., metal lines and metal vias) in the additional backside interconnect layer (not shown), and conductive features (e.g., metal lines and metal vias) in the backside interconnect layer 440 and 450. In the present embodiments, the top electrode 402 of the memory structure MS' may be electrically connected to the transistor devices 700 through a metallization pattern SL', and the metallization pattern SL' may have metal lines and metal vias in one or plural interconnect layers (e.g., the backside interconnect layer 440 and/or 450). The metallization pattern SL' may include a contact feature (e.g., the contact feature 360 in FIG. 23) connected to the selector transistor device 700. In present embodiments, source lines SL or/and word lines WL are placed in the frontside MLI structure FMLI at front side and electrically connected to the selector transistor devices 700 respectively through metal vias SL" and metal vias WL" in frontside MLI structure FMLI. Other details of the present embodiments are similar to those illustrated previously, and therefore not repeated herein.

Figure 37:
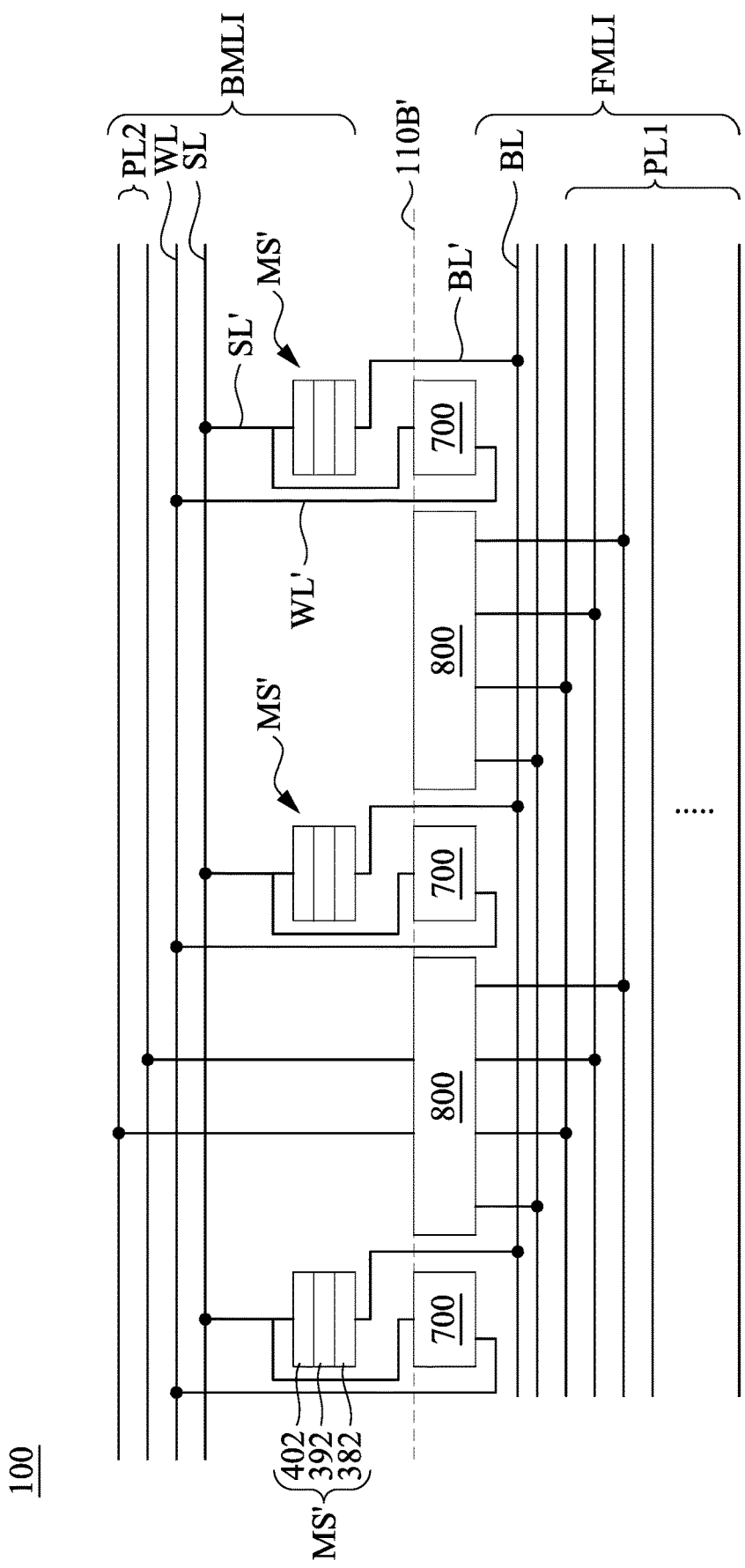
FIG. 37 is a simplified schematic cross-sectional diagram of an integrated circuit device in accordance with some embodiments of the present disclosure.

FIG. 37 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the bit lines BL can be placed in the frontside MLI structure FMLI, the source lines SL can be placed in the backside MLI structure BMLI at the backside 110B' before or after the formation of the memory structure MS', and the word lines WL are placed can be placed in the backside MLI structure BMLI at the backside 110B' after the formation of the memory structure MS'.

In the present embodiments, the source lines SL may include a metallization pattern SL' having metal lines and metal vias in one or plural interconnect layers (e.g., the backside interconnect layer 440 and/or 450), thereby being connected to the top electrode 402 of the memory structure MS' and the selector transistor devices 700. For example, some metal vias and lines of the metallization pattern SL' can be formed prior to the formation of the memory structure MS' and connected to the selector transistor devices 700, while other metal vias and lines of the metallization pattern SL' and the source lines SL can be formed after the formation of the memory structure MS' and connected to the top electrode 402 of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the contact feature 360. The metallization pattern SL' may include conductive features (e.g., metal lines and metal vias) in the additional backside interconnect layer (not shown), and conductive features (e.g., metal lines and metal vias) in the backside interconnect layer 440 and 450, the source lines SL itself may include conductive features (e.g., metal lines and metal vias) in the backside interconnect layer 450.

In the present embodiments, the bottom electrodes 382 of the memory structure MS' may be electrically connected to the bit line BL through a metallization pattern BL', and the metallization pattern BL' may have metal lines and metal vias in one or plural interconnect layers. The metallization pattern BL' may include a conductive plug extending across the backside 110B' and reach the bit line BL. For example, some metal vias and lines of the metallization pattern BL' can be formed prior to the formation of the memory structure MS', and therefore be in contact with the bottom electrodes 382 of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the contact feature 360. The metallization pattern BL' may include conductive features (e.g., metal lines and metal vias) in the additional backside interconnect layer (not shown).

In the present embodiments, the word line WL may be electrically connected to the selector transistor devices 700 through a metallization pattern WL', and the metallization pattern WL' may have metal lines and metal vias in one or plural interconnect layers (e.g., the backside interconnect layer 440 and/or 450). The metallization pattern WL' may further include a conductive plug extending across the backside 110B' and reaching the frontside MLI structure FMLI, thereby connected to the gate of the selector transistor device 700. Other details of the present embodiments are similar to those illustrated previously, and therefore not repeated herein.

Figure 38:
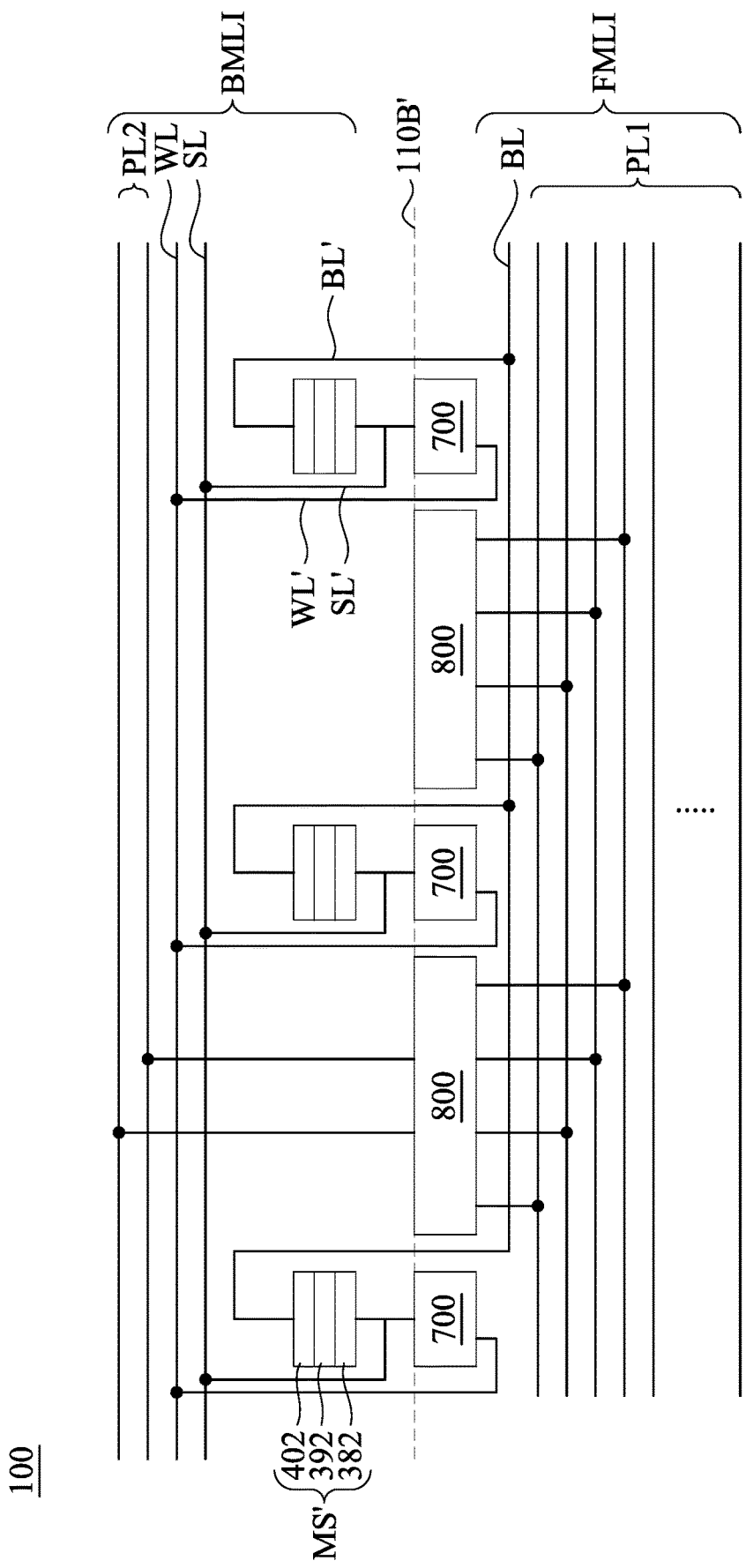
FIG. 38 is a simplified schematic cross-sectional diagram of an integrated circuit device in accordance with some embodiments of the present disclosure.

FIG. 38 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the bit lines BL can be placed in the frontside MLI structure FMLI, the source lines SL can be placed in the backside MLI structure BMLI at the backside 110B' before or after the formation of the memory structure MS', and the word lines WL can be placed in the backside MLI structure BMLI at the backside 110B' after the formation of the memory structure MS'. In some other embodiments, the word lines WL can be placed in the frontside MLI structure FMLI.

In the present embodiments, the source lines SL may include a metallization pattern SL' having metal lines and metal vias in one or plural interconnect layers (e.g., the backside interconnect layer 440 and/or 450), thereby being connected to the bottom electrode 382 of the memory structure MS' and the selector transistor devices 700. For example, some of the metallization pattern SL' can be formed prior to the formation of the memory structure MS' and connected to the bottom electrode 382 of the memory structure MS' and the selector transistor devices 700, while the source lines SL can be formed after the formation of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the contact feature 360. The metallization pattern SL' may include conductive features (e.g., metal lines and metal vias) in the additional backside interconnect layer (not shown), conductive features (e.g., metal lines and metal vias) in the backside interconnect layer 440 and 450, and the contact feature 360 connected to the selector transistor device 700, the source lines SL itself may include conductive features (e.g., metal lines and metal vias) in the backside interconnect layer 450.

In the present embodiments, the top electrode 402 of the memory structure MS' may be electrically connected to the bit line BL through a metallization pattern BL', and the metallization pattern BL' may have metal lines and metal vias in one or plural interconnect layers (e.g., the backside interconnect layer 440 and/or 450). The metallization pattern BL' may include a conductive plug extending across the backside 110B' and reaching the bit line BL in the frontside MLI structure FMLI. For example, some metal vias and lines of the metallization pattern BL' can be formed after the formation of the memory structure MS', and therefore be in contact with the top electrode 402 of the memory structure MS'.

In the present embodiments, the word line WL may be electrically connected to the selector transistor devices 700 through a metallization pattern WL', and the metallization pattern WL' may have metal lines and metal vias in one or plural interconnect layers (e.g., the backside interconnect layer 440 and/or 450, and an additional backside interconnect layer (not shown) inserted between the layer 440 and the contact feature 360). The metallization pattern WL' may include a conductive plug extending across the backside 110B' and reaching the frontside MLI structure FMLI, thereby connected to the gate of the selector transistor device 700. Other details of the present embodiments are similar to those illustrated previously, and therefore not repeated herein.

Figure 39:
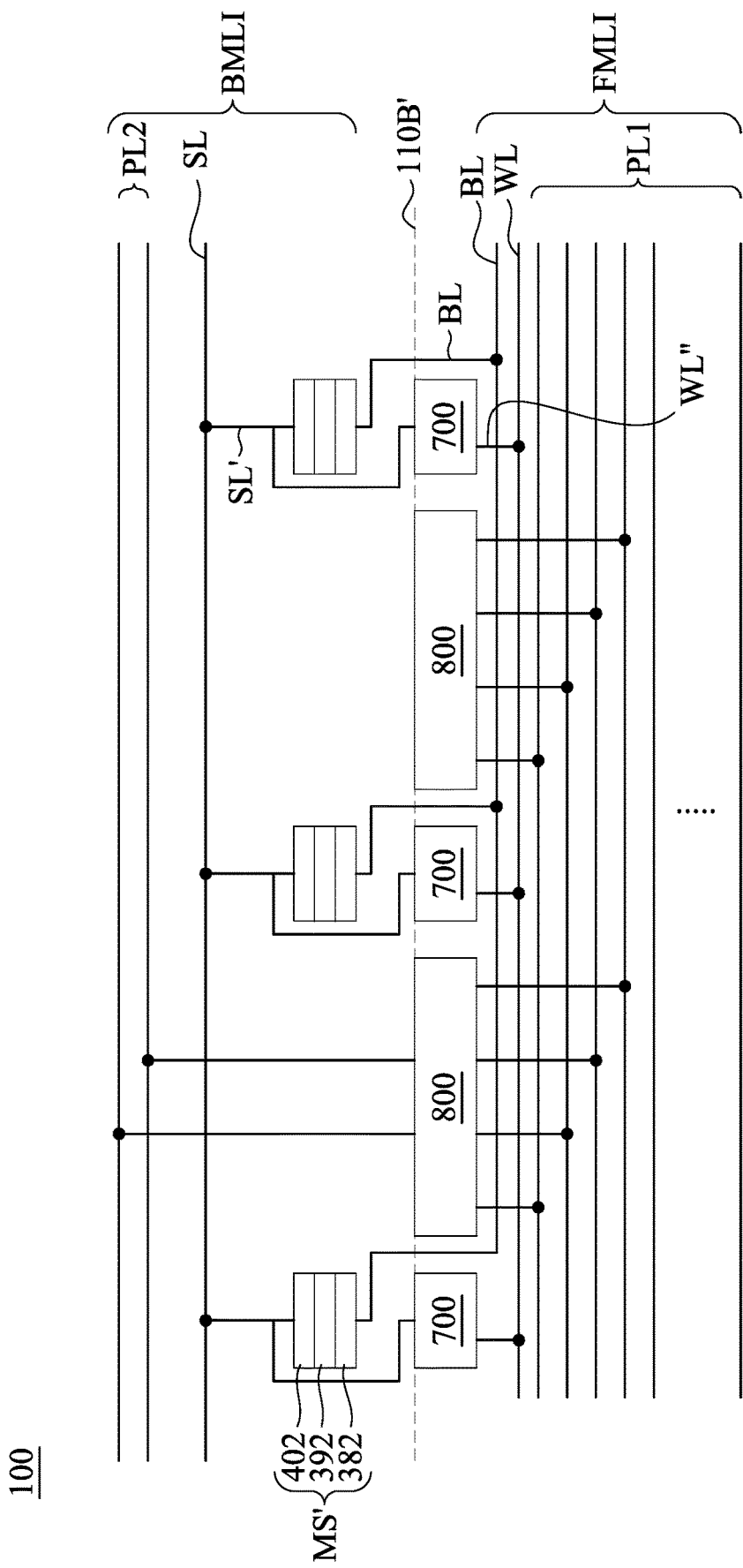
FIG. 39 is a simplified schematic cross-sectional diagram of an integrated circuit device in accordance with some embodiments of the present disclosure.

FIG. 39 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the bit lines BL and the word lines WL can be placed in the frontside MLI structure FMLI, and the source lines SL can be placed in the backside MLI structure BMLI at the backside 110B' before or after the formation of the memory structure MS'.

In the present embodiments, the source lines SL may include a metallization pattern SL' having metal lines and metal vias in one or plural interconnect layers (e.g., an additional backside interconnect layer (not shown) formed before the formation of the bottom electrode 382, and the backside interconnect layer 440 and/or 450), thereby being connected to the top electrode 402 of the memory structure MS' and the selector transistor devices 700. For example, some metal vias and lines of the metallization pattern SL' can be formed prior to the formation of the memory structure MS' and connected to the selector transistor devices 700, while other metal vias and lines of the metallization pattern SL' and the source lines SL itself can be formed after the formation of the memory structure MS' and connected to the top electrode 402 of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the conductive feature 360. The metallization pattern SL' may include conductive features (e.g., metal lines and metal vias) in the additional backside interconnect layer (not shown), conductive features (e.g., metal lines and metal vias) in the backside interconnect layer 440 and 450, and the contact feature 360 connected to the selector transistor device 700, and the source lines SL itself may include conductive features (e.g., metal lines and metal vias) in the backside interconnect layer 450.

In the present embodiments, the bottom electrode 382 of the memory structure MS' may be electrically connected to the bit line BL through a metallization pattern BL', and the metallization pattern BL' may have metal lines and metal vias in one or plural interconnect layers (e.g., the additional backside interconnect layer (not shown) is inserted between the backside interconnect layer 440 and the conductive feature 360). The metallization pattern BL' may further include a conductive plug extending across the backside 110B' and reach the bit line BL in the frontside MLI structure FMLI. For example, some metal vias and lines of the metallization pattern BL' can be formed prior to the formation of the memory structure MS' in the additional backside interconnect layer (not shown), and therefore be in contact with the bottom electrodes 382 of the memory structure MS'.

In the present embodiments, the word line WL may be electrically connected to the selector transistor devices 700 through metal vias WL" in frontside MLI structure FMLI. Other details of the present embodiments are similar to those illustrated previously, and therefore not repeated herein.

Figure 40:
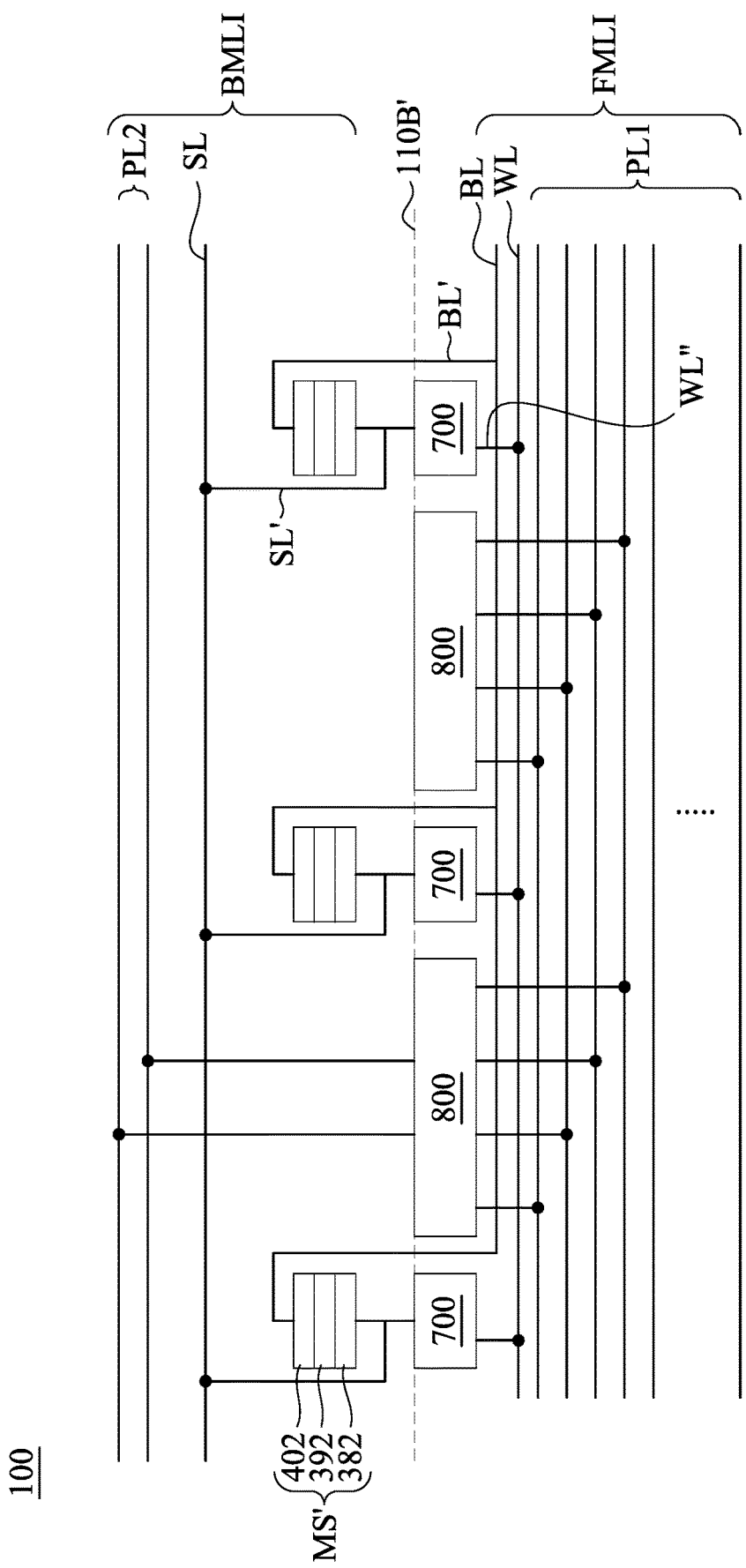
FIG. 40 is a simplified schematic cross-sectional diagram of an integrated circuit device in accordance with some embodiments of the present disclosure.

FIG. 40 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the bit lines BL and the word lines WL can be placed in the frontside MLI structure FMLI, and the source lines SL can be placed in the backside MLI structure BMLI at the backside 110B' before or after the formation of the memory structure MS'.

In the present embodiments, the source lines SL may include a metallization pattern SL' having metal lines and metal vias in one or plural interconnect layers (e.g., an additional backside interconnect layer (not shown) formed before the formation of the bottom electrode 382, and the backside interconnect layer 440 and/or 450), thereby being connected to the bottom electrode 382 of the memory structure MS' and the selector transistor devices 700. For example, some of the metallization pattern SL' can be formed prior to the formation of the memory structure MS' and connected to the bottom electrode 382 of the memory structure MS' and the selector transistor devices 700, while the source lines SL itself can be formed after the formation of the memory structure MS'. For example, referring to FIG. 23, an additional backside interconnect layer (not shown) may be formed before the formation of the bottom electrode 382, such that the additional backside interconnect layer (not shown) is inserted between the backside interconnect layer 440 and the conductive feature 360. The metallization pattern SL' may include conductive features (e.g., metal lines and metal vias) in the additional backside interconnect layer (not shown), and conductive features (e.g., metal lines and metal vias) in the backside interconnect layer 440 and 450, the source lines SL itself may include conductive features (e.g., metal lines and metal vias) in the backside interconnect layer 450.

In the present embodiments, the top electrode 402 of the memory structure MS' may be electrically connected to the bit line BL through a metallization pattern BL', and the metallization pattern BL' may have metal lines and metal vias in one or plural interconnect layers (e.g., the backside interconnect layer 440 and/or 450). The metallization pattern BL' may include a conductive plug extending across the backside 110B' and reach the bit line BL. For example, some metal vias and lines of the metallization pattern BL' can be formed after the formation of the memory structure MS', and therefore be in contact with the top electrode 402 of the memory structure MS'.

In the present embodiments, the word line WL may be electrically connected to the selector transistor devices 700 through metal vias WL" in frontside MLI structure FMLI. Other details of the present embodiments are similar to those illustrated previously, and therefore not repeated herein.

Figure 41:
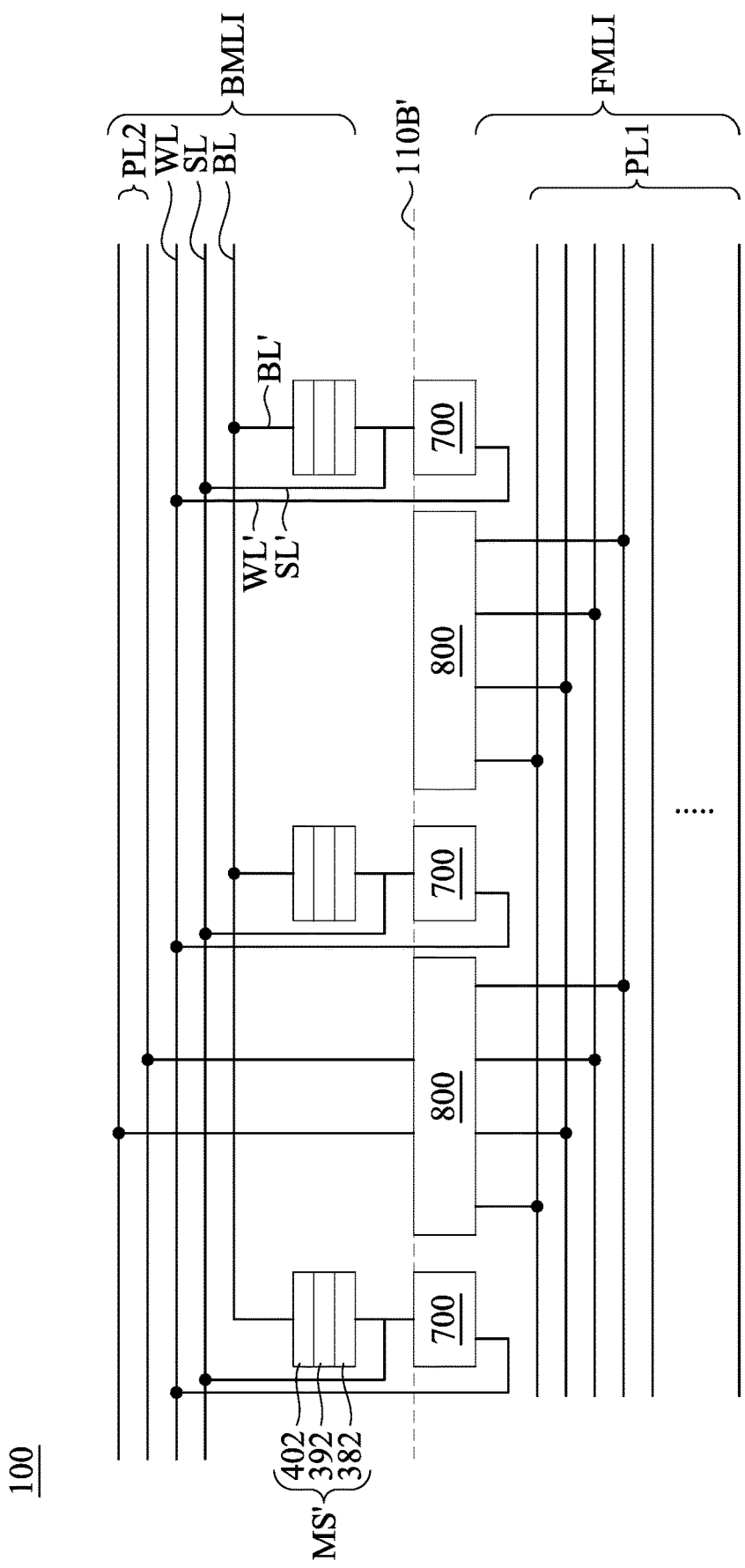
FIG. 41 is a simplified schematic cross-sectional diagram of an integrated circuit device in accordance with some embodiments of the present disclosure.

FIG. 41 is a simplified schematic cross-sectional diagram of an integrated circuit device in accordance with some embodiments of the present disclosure. The same or similar configurations, materials, processes and/or operation as described with previous embodiments of FIGS. 35A-35C may be employed in the following embodiments, and the detailed explanation may be omitted. One difference between the present embodiments and the previous embodiments of FIGS. 35A-35C is that: the source lines SL, the bit lines BL, and the word lines WL can be placed in the backside MLI structure BMLI at the backside 110B', so front side of the wafer are freed up for all metal routing.

In the present embodiments, the source lines SL may include a metallization pattern SL' having metal lines and metal vias in one or plural interconnect layers (e.g., the backside interconnect layer 440 and/or 450), thereby being connected to the bottom electrode 382 of the memory structure MS' and the selector transistor devices 700. In the present embodiments, the top electrode 402 of the memory structure MS' may be electrically connected to the bit line BL through a metallization pattern BL', and the metallization pattern BL' may have metal vias in one or plural interconnect layers (e.g., the backside interconnect layer 440 and/or 450). In the present embodiments, the word line WL may be electrically connected to the selector transistor devices 700 through a metallization pattern WL', and the metallization pattern BL' may have metal lines and/or metal vias in one or plural interconnect layers (e.g., the backside interconnect layer 440 and/or 450). Other details of the present embodiments are similar to those illustrated previously, and therefore not repeated herein.

According to some embodiments of the present disclosure, the bit lines BL can be placed in the backside MLI structure BMLI at the backside 110B after or before the formation of the memory structure MS', and source lines SL or word lines WL are placed in the frontside MLI structure FMLI at front side. In some embodiments of the present disclosure, the bit lines BL and word lines WL can be placed in the frontside MLI structure FMLI at front side, while the source lines SL are in the backside MLI structure BMLI at the backside 110B' before or after the formation of the memory cells.

Figure 42:
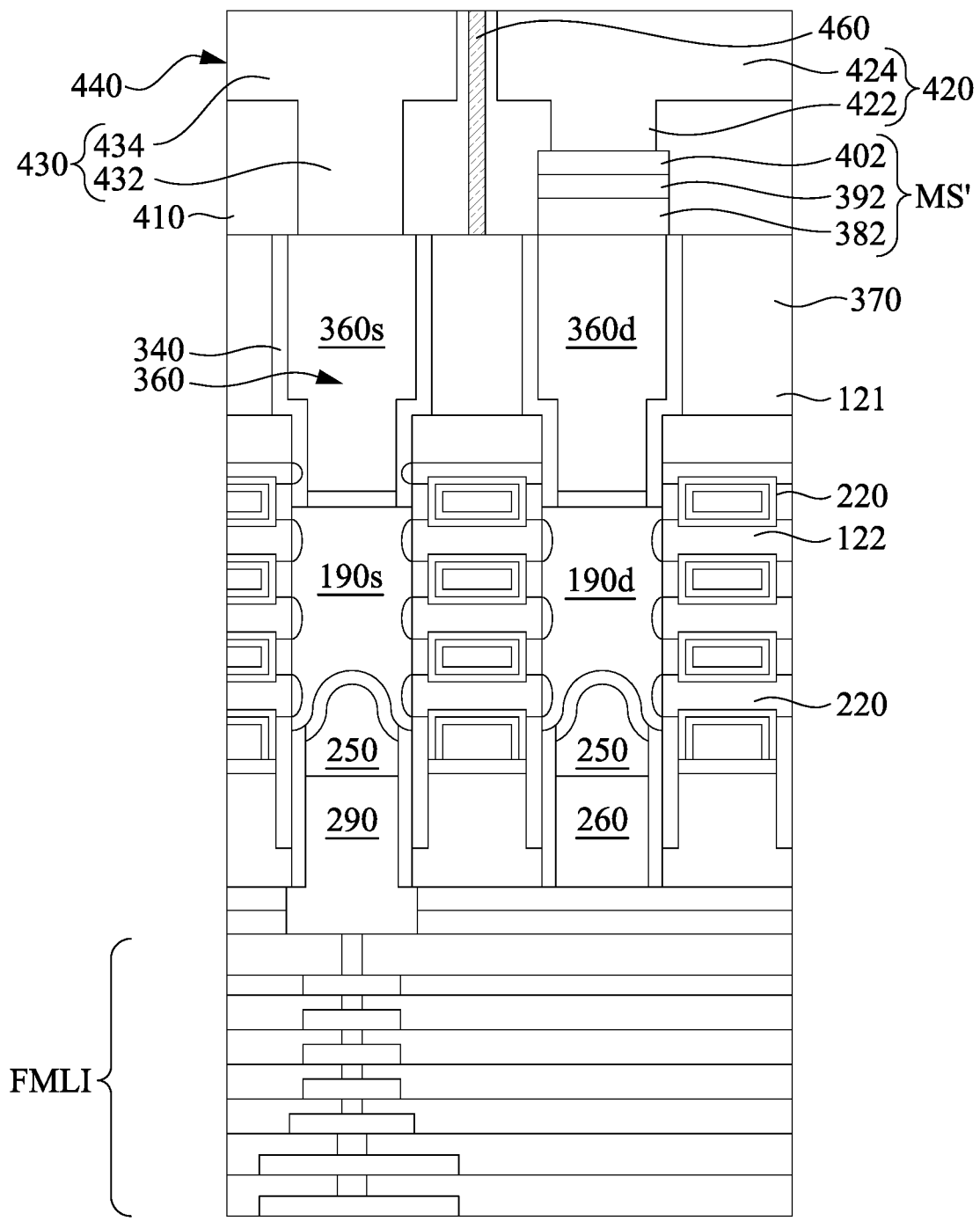
FIGS. 42-43 illustrate various stages of manufacturing an integrated circuit device according to some embodiments of the present disclosure.
Figure 43:
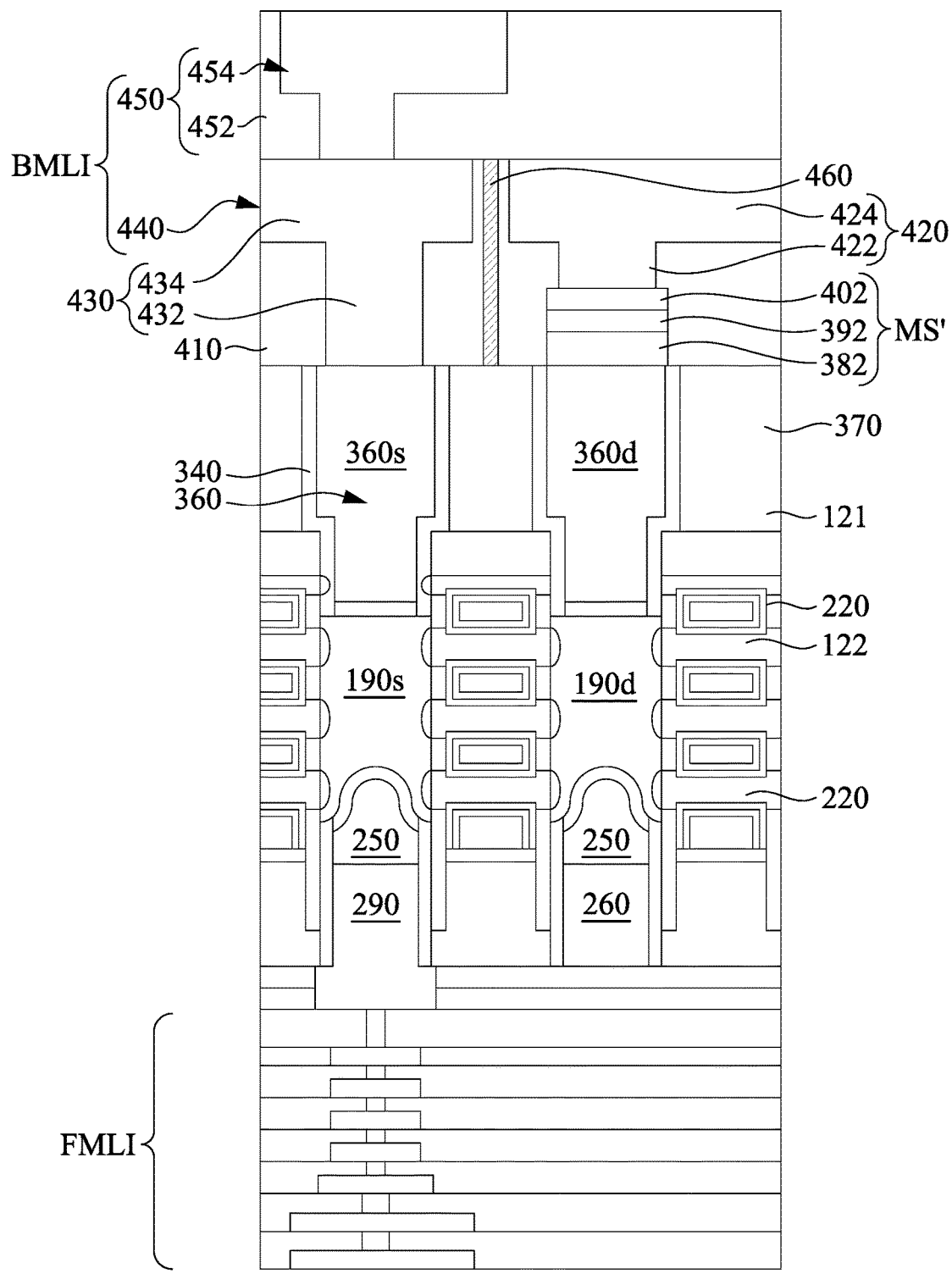

FIGS. 42-43 illustrate various stages of manufacturing an integrated circuit device 100 according to some embodiments of the present disclosure. The same or similar configurations, materials, processes and/or operation as described with previous embodiments may be employed in the following embodiments, and the detailed explanation may be omitted. One difference between the present embodiments and the previous embodiments is that: the backside MLI structure BMLI further includes a magnetic shielding element 460 in the backside interconnect layer 440 where the memory structure MS' is disposed.

Referring to FIG. 42, the magnetic shielding element 460 is formed in the backside IMD layer 442. Formation of the magnetic shielding element 460 may include etching a trench 442T in the IMD layer 442 and filling the trench 442T with suitable magnetic shielding materials. The magnetic shielding materials may have a high permeability (high μ), such as Mu metal (i.e., an alloy of nickel and iron), Co, magnetic epoxy, FINEMET, or the like. FINEMET may be a nano-crystalline material. FINEMET may be made with the thin isolated tape of the Fe-based alloy consisted of amorphous and crystal with the size of nanometer. After filling the magnetic shielding material, a planarization process, such as chemical mechanical polishing (CMP), is performed to remove excess magnetic shielding material out of the trench 442T, thereby forming the magnetic shielding element 460. Formation of the magnetic shielding element 460 may be performed prior to or after the formation of the conductive features 420 and 430. Through the configuration, the magnetic shielding element 460 may laterally surround the MTJ stack of the memory structure MS', thereby preventing the interference between two adjoins MTJ signal of the memory structure MS'. For example, a bottom surface of the magnetic shielding element 460 is lower than a bottom surface of the resistance switching element 392 of the memory structure MS', and a top surface of the magnetic shielding element 460 is higher than a top surface of the resistance switching element 392 of the memory structure MS'.

Referring to FIG. 43, after the formation of the magnetic shielding element 460, one or more backside interconnect layers 450 is formed over the backside interconnect layer 440. After the formation of the backside MLI structure BMLI, the carrier substrate 320 (referring to FIG. 42) may be removed from the front-side MLI structure FMLI. Other details of the present embodiments may be similar to those illustrated with respect to FIG. 26A, and therefore not repeated herein.

Figure 44:
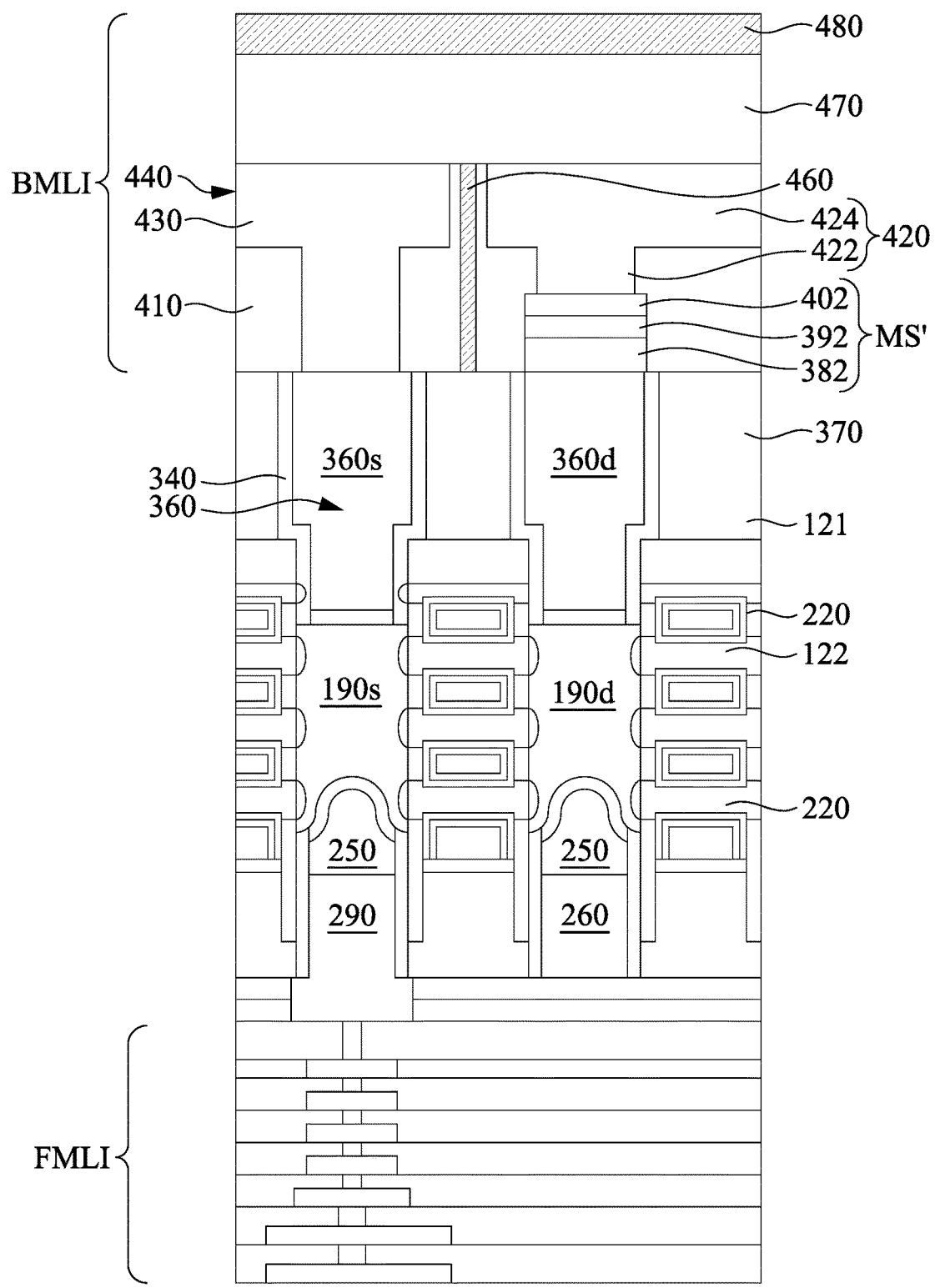
FIG. 44 is a schematic cross-sectional view of an integrated circuit device in accordance with some embodiments of the present disclosure.

FIG. 44 is a schematic cross-sectional view of an integrated circuit device in accordance with some embodiments of the present disclosure. One difference between the present embodiments and the previous embodiments is that: the backside MLI structure BMLI further includes a magnetic shielding layer 480 formed above and covering the memory structure MS'. The magnetic shielding layer 480 may include suitable magnetic shielding materials with high permeability (high μ), such as Mu metal (i.e., an alloy of nickel and iron), Co, magnetic epoxy, FINEMET, or the like. In some embodiments, a dielectric cap layer 470 may be deposited over the interconnect layers of the backside MLI structure BMLI (e.g., the interconnect layer 440), and then the magnetic shielding layer 480 is deposited over the dielectric cap layer 470. The dielectric cap layer 470 may include suitable dielectric materials, such as silicon oxide, silicon nitride, or the like. After the formation of the backside MLI structure BMLI including the magnetic shielding layer 480, the carrier substrate 320 (referring to FIG. 34) may be removed from the front-side MLI structure FMLI. Other details of the present embodiments are similar to those illustrated previously, and therefore not repeated herein.

Figure 45:
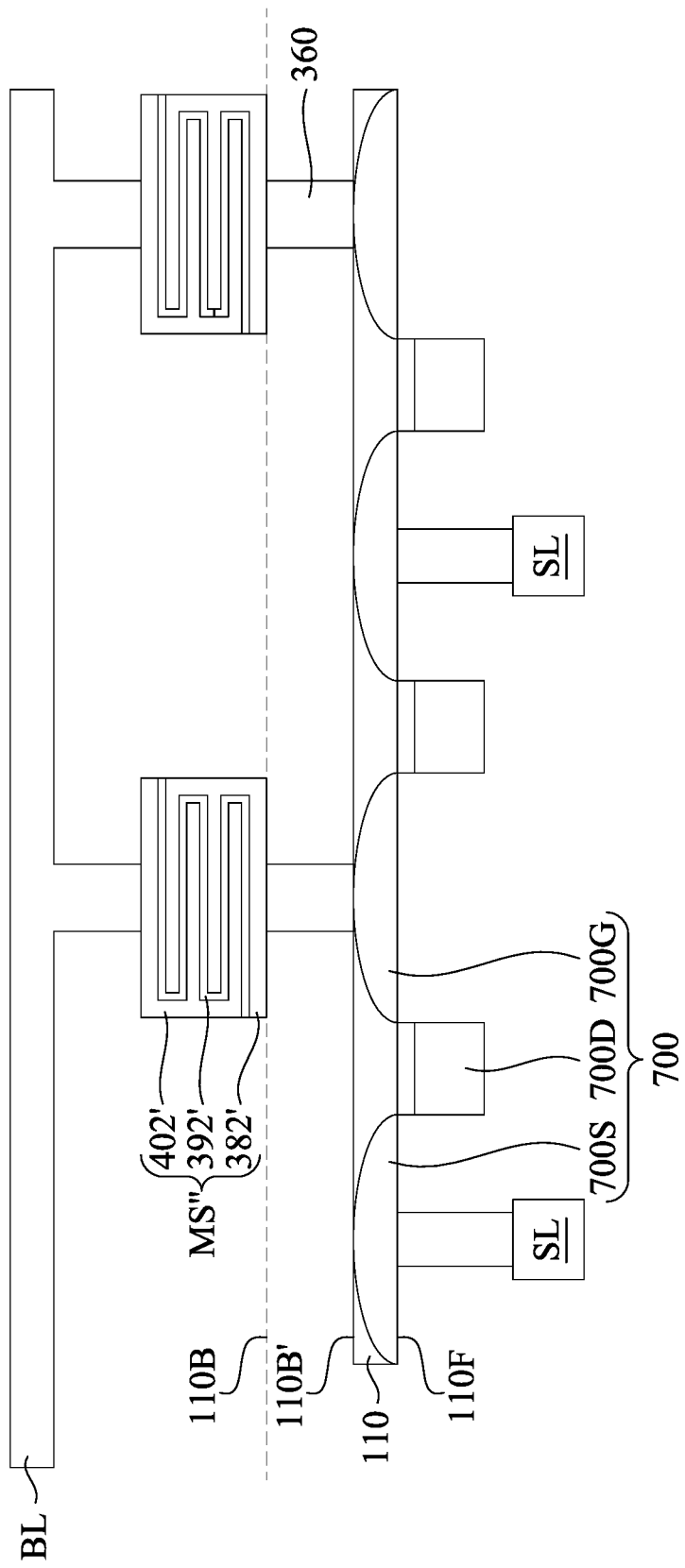
FIG. 45 is a schematic cross-sectional view of an integrated circuit device in accordance with some embodiments of the present disclosure.

FIG. 45 is a schematic cross-sectional view of an integrated circuit device 100 in accordance with some embodiments of the present disclosure. The same or similar configurations, materials, processes and/or operation as described with previous embodiments may be employed in the following embodiments, and the detailed explanation may be omitted. One difference between the present embodiments and the previous embodiments is that: the memory stack MS" is a metal-insulator-metal (MIM) structure, which is for forming dynamic random access memory (DRAM) storage cell. For example, the memory stack MS" include a bottom electrode 382', a top electrode 400', and an insulator layer 392' between the bottom electrode 382' and the top electrode 400'. The bottom electrode 382' and the top electrode 400' may be designed with suitable shapes for increasing the capacity of the capacitor. For example, herein, the bottom electrode 382' and the top electrode 400' have portions extending horizontally with horizontal trenches therebetween, and the insulator layer 392' is formed in between the horizontal portions of the bottom electrode 382' and the top electrode 400'. In some embodiments, backside trench or MIM capacitance can be used for embedded DRAM with very close proximity to logic area, or even mixed with logic circuits as illustrated in FIGS. 35A-35C. Other details of the present embodiments are similar to those illustrated previously, and therefore not repeated herein.

Figure 46:
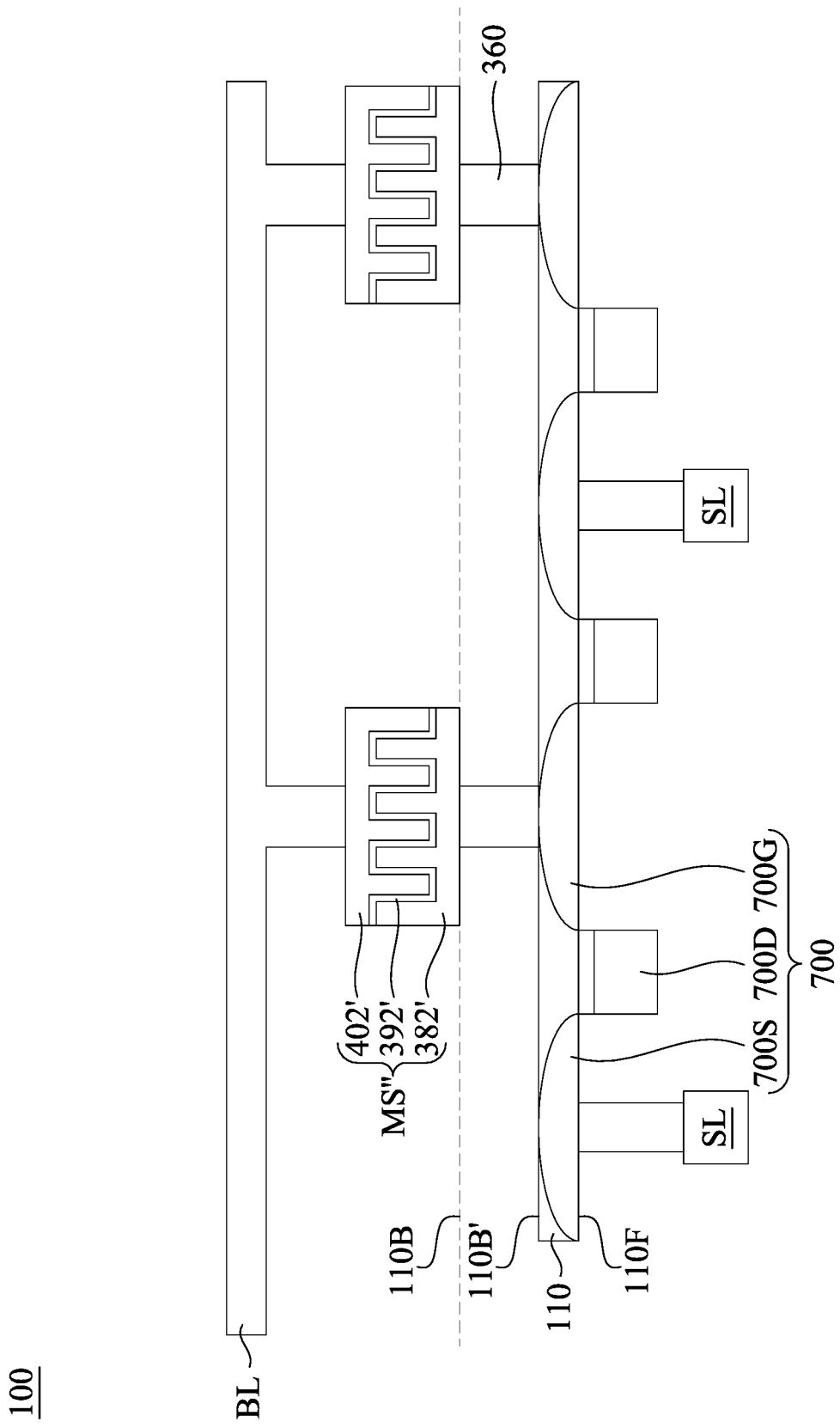
FIG. 46 is a schematic cross-sectional view of an integrated circuit device in accordance with some embodiments of the present disclosure.

FIG. 46 is a schematic cross-sectional view of an integrated circuit device 100 in accordance with some embodiments of the present disclosure. The same or similar configurations, materials, processes and/or operation as described with previous embodiments may be employed in the following embodiments, and the detailed explanation may be omitted. One difference between the present embodiments and the previous embodiments is that: the bottom electrode 382' and the top electrode 400' have portions extending vertically with vertical trenches therebetween, and the insulator layer 392' is between the vertical portions of the bottom electrode 382' and the top electrode 400'. Other details of the present embodiments are similar to those illustrated previously, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by disposing memory cell on the back side of the substrate, the interconnect distance between memory cell and power rail to logic, periphery, selector control circuit has been significantly reduced, thereby achieving area reduction and high density memory applications. Another advantage is that due to the area reduction and shorter metal interconnect routing with bottom power rail, the parasitic resistance and capacitance are also reduced, thereby reducing dynamic voltage (IR) drop and improving overall PPA (power, performance and area) performance. Still advantage is that the number of interconnect layers formed after the formation of the memory cells is reduced, such that the formed memory cells may experience fewer annealing processes, which in turn will reduce temperature damage resulting from the thermal stress of the annealing processes, thereby improving the quality of the memory cells. Still advantage is that no additional vias are required for connecting the memory cell to the transistor though the plural interconnect layers, such that the spaces for these additional vias can be saved and be used for signals or power routing. Still another advantage is that regions for forming memory cells and logic device may be flexibly disposed with close proximity, thereby saving die areas. The computation in memory can also be improved. Also, other memory cells, such as RRAM cell, PCRAM cell, DRAM cell or the like, may also be applicable to the various of embodiments of the present disclosure.

According to some embodiments of the present disclosure, a method for fabricating an integrated circuit device is provided. The method includes forming a transistor device over a front side of the semiconductor substrate; forming a first contact feature in the semiconductor substrate, wherein the first contact feature is connected with a back side of a first source/drain feature of the transistor device; and forming a memory structure over a back side of the first contact feature facing away from the first source/drain feature.

According to some embodiments of the present disclosure, a method for fabricating an integrated circuit device is provided. The method includes forming a logic transistor device over a front side of a semiconductor substrate; forming a dielectric layer over a back side of the logic transistor device; forming a memory structure over a back side of the dielectric layer facing away from the logic transistor device.

According to some embodiments of the present disclosure, an integrated circuit device includes a frontside interconnect layer; a transistor device having a gate structure over the frontside interconnect layer; a dielectric layer over the transistor device; a memory structure over the dielectric layer; and a backside interconnect layer over the memory structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, comprising:
   forming a transistor device over a front side of a semiconductor substrate, the transistor device comprising a first source/drain feature and a second source/drain feature;
   forming a first contact feature in the semiconductor substrate, wherein the first contact feature is connected with a back side of the first source/drain feature of the transistor device, wherein the first contact feature has a stepped sidewall, wherein the stepped sidewall has a change in slope defining a stepped transition at a level between a topmost level and a bottommost level of the second source/drain feature; and
   forming a memory structure over a back side of the first contact feature facing away from the first source/drain feature.

2. The method of claim 1, wherein forming the transistor device comprises:
   forming a gate structure over the front side of the semiconductor substrate;
   etching a recess in the semiconductor substrate adjacent to the gate structure; and
   forming the first source/drain feature in the recess.

3. The method of claim 1, wherein forming the first contact feature comprises:
   etching a via opening in the semiconductor substrate to expose the back side of the first source/drain feature; and
   filling the via opening with a conductive material.

4. The method of claim 3, wherein forming the first contact feature further comprises:
   forming a protection layer on a sidewall of the via opening prior to filling the via opening with the conductive material, wherein the protection layer exposes the back side of the first source/drain feature.

5. The method of claim 1, further comprising:
   removing the semiconductor substrate after forming the first contact feature; and
   forming a dielectric layer around the first contact feature after removing the semiconductor substrate.

6. The method of claim 5, wherein forming the memory structure comprises:
   depositing a plurality of memory films over the dielectric layer and the first contact feature; and
   patterning the memory films into the memory structure.

7. The method of claim 1, further comprising:
   forming a source line over the front side of the semiconductor substrate,
   wherein the source line is electrically connected with the second source/drain feature of the transistor device.

8. The method of claim 1, further comprising:
   forming a contact over and connected with a front side of the second source/drain feature of the transistor device; and
   forming a source line over the front side of the semiconductor substrate, wherein the source line is electrically connected to the contact.

9. The method of claim 1, further comprising:
   forming a first silicide layer at a front-side surface of the first source/drain feature; and
   forming a second silicide layer at a backside surface of the first source/drain feature.

10. The method of claim 9, wherein the first silicide layer is curved.

11. A method for fabricating an integrated circuit device, comprising:
    forming a logic transistor device over a front side of a semiconductor substrate;
    forming a dielectric layer over a back side of the logic transistor device;

forming a first contact feature in the semiconductor substrate and electrically coupled to a source/drain feature of the logic transistor device; and forming a memory structure over a back side of the dielectric layer facing away from the logic transistor device, wherein the memory structure has a bottom surface entirely in contact with the first contact feature and forms an interface, wherein the interface formed by the bottom surface of the memory structure and the first contact feature vertically overlaps with the source/drain feature that is electrically coupled to the first contact feature.

12. The method of claim 11, further comprising:
removing the semiconductor substrate prior to forming the dielectric layer, wherein forming the dielectric layer is performed such that the dielectric layer surrounds the first contact feature.

13. The method of claim 11, further comprising:
forming at least one selector transistor device over the front side of the semiconductor substrate; and
forming a second contact feature in the semiconductor substrate, wherein forming the memory structure is performed such that the memory structure is electrically connected to a source/drain feature of the selector transistor device through the second contact feature.

14. The method of claim 13, wherein forming the logic transistor device and forming the selector transistor device are performed such that the logic transistor device is located between a first one of a plurality of the selector transistor devices and a second one of the selector transistor devices.

15. The method of claim 11, further comprising:
depositing an interlayer dielectric layer over the memory structure; and
forming a magnetic shielding element in the interlayer dielectric layer, wherein a bottom surface of the magnetic shielding element is lower than a bottom surface of a resistance switching element of the memory structure, and a top surface of the magnetic shielding element is higher than a top surface of the resistance switching element of the memory structure.

16. The method of claim 11, further comprising:
depositing an interlayer dielectric layer over the memory structure; and
forming a magnetic shielding layer over the interlayer dielectric layer, wherein the magnetic shielding layer covers the memory structure.

17. The method of claim 11, wherein the first contact feature has a stepped sidewall profile.

18. A method for fabricating an integrated circuit device, comprising:
forming a transistor device over a front side of a semiconductor substrate, the transistor device comprising a first source/drain feature and a second source/drain feature;
forming a contact feature in the semiconductor substrate and on a back side of the first source/drain feature of the transistor device, wherein the contact feature has a stepped sidewall structure comprising a first sidewall extending in a first direction, a second sidewall extending in the first direction, and an intermediary surface connecting the first sidewall and the second sidewall and extending along a second direction different than the first direction, wherein the intermediary surface of the stepped sidewall structure is at a level between a topmost level and a bottommost level of the second source/drain feature; and
forming a backside multilayer interconnect structure over a back side of the contact feature, wherein the backside multilayer interconnect structure comprises a memory structure and a bit line, and the memory structure comprises:
a bottom electrode electrically connected to the contact feature;
a top electrode electrically connected to the bit line; and
a resistance switching element between the top electrode and the bottom electrode.

19. The method of claim 18, further comprising:
forming a word line electrically connected to a gate feature of the transistor device.

20. The method of claim 19, wherein the word line is over the front side of the semiconductor substrate.

* * * * *